(12) United States Patent
Son et al.

(10) Patent No.: US 12,213,242 B2
(45) Date of Patent: Jan. 28, 2025

(54) ELECTRONIC DEVICE INCLUDING A STRUCTURE FOR GUIDING AN ARRANGEMENT POSITION OF AN ELECTRONIC COMPONENT

(71) Applicant: SAMSUNG ELECTRONICS CO., LTD., Suwon-si (KR)

(72) Inventors: Kyungdae Son, Suwon-si (KR); Jongin Kim, Suwon-si (KR); Dongseon Lee, Suwon-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 203 days.

(21) Appl. No.: 17/865,955

(22) Filed: Jul. 15, 2022

(65) Prior Publication Data

US 2022/0418082 A1     Dec. 29, 2022

Related U.S. Application Data

(63) Continuation of application No. PCT/KR2022/009077, filed on Jun. 24, 2022.

(30) Foreign Application Priority Data

Jun. 24, 2021 (KR) .......................... 10-2021-0082156

(51) Int. Cl.
    *H05K 1/02*           (2006.01)
    *H04N 7/18*           (2006.01)
    (Continued)

(52) U.S. Cl.
    CPC ........... *H05K 1/023* (2013.01); *H05K 9/0026* (2013.01)

(58) Field of Classification Search
    CPC .......... H05K 1/02; H05K 1/023; H05K 1/181; H05K 1/184; H05K 3/284; H05K 7/1427;
    (Continued)

(56) References Cited

U.S. PATENT DOCUMENTS 9,924,007 B2 *   3/2018   Hyun ................... H04M 1/0266
11,323,554 B2 *   5/2022   Ha .......................... G06F 1/1626
(Continued)

FOREIGN PATENT DOCUMENTS

JP          H08125382 A      5/1996
KR         101095241 B1     12/2011
(Continued)

OTHER PUBLICATIONS

International Search Report with Written Opinion issued in International Application No. PCT/KR2022/009077; International Filing Date Jun. 24, 2022; Date of Mailing Oct. 4, 2022 (9 pages).

*Primary Examiner* — Xiaoliang Chen
(74) *Attorney, Agent, or Firm* — CANTOR COLBURN LLP

(57) ABSTRACT

According to the disclosure, an electronic device may include a printed circuit board, a first component disposed on one surface of the printed circuit board, a second component disposed on the other surface of the printed circuit board, and a metal structure configured to shield electromagnetic interference (EMI) related to the first component, wherein the metal structure includes a first portion configured to cover at least a part of the first component, and a second portion configured to extend from the first portion through the printed circuit board so as to support the second component. Various other embodiments may be possible.

20 Claims, 31 Drawing Sheets

(51) Int. Cl.
*H04N 23/51* (2023.01)
*H04N 23/57* (2023.01)
*H05K 9/00* (2006.01)

(58) Field of Classification Search
CPC ............. H05K 7/20463; H05K 9/0002; H05K 9/0026; H05K 9/0081; H05K 9/0024; H05K 9/0047; H05K 9/0049; H05K 9/0086; H04N 7/18; H04N 7/183; H04N 23/51; H04N 23/57
USPC ...... 361/760, 705, 748, 816; 348/148, 7.087
See application file for complete search history.

(56) References Cited

U.S. PATENT DOCUMENTS

| | | | |
|---|---|---|---|
| 2009/0016039 | A1 | 1/2009 | Imamura |
| 2010/0020497 | A1* | 1/2010 | Hayakawa ......... H05K 7/20463 361/705 |
| 2011/0025850 | A1* | 2/2011 | Maekawa ............... H04N 7/183 348/148 |
| 2011/0134314 | A1 | 6/2011 | Lin et al. |
| 2017/0201661 | A1* | 7/2017 | Conger ................ H01R 12/716 |
| 2018/0261912 | A1* | 9/2018 | Mizuno ................... H01Q 1/32 |
| 2019/0058814 | A1* | 2/2019 | Jung ....................... H04N 23/51 |
| 2020/0267841 | A1* | 8/2020 | Lee ........................ H05K 1/181 |
| 2021/0127532 | A1* | 4/2021 | Persson ................. H04N 23/57 |

FOREIGN PATENT DOCUMENTS

| | | | |
|---|---|---|---|
| KR | 20150009024 A | 1/2015 | |
| KR | 20150126190 A | 11/2015 | |
| KR | 101691797 B1 | 1/2017 | |
| KR | 20200099696 A | 8/2020 | |
| KR | 102250447 B1 | 5/2021 | |

\* cited by examiner

ELECTRONIC DEVICE INCLUDING A STRUCTURE FOR GUIDING AN ARRANGEMENT POSITION OF AN ELECTRONIC COMPONENT

TECHNICAL FIELD

This application is a continuation application, claiming priority under § 365(c), of an International Application No. PCT/KR2022/009077, filed on Jun. 24, 2022, which is based on and claims the benefit of a Korean patent application number 10-2021-0082156, filed on Jun. 24, 2021, in the Korean Intellectual Property Office, the disclosure of which is incorporated by reference herein in its entirety.

Various embodiments of the disclosure relate to an electronic device including a structure for guiding an electronic component arrangement position.

BACKGROUND ART

An electronic device such as a smartphone may include a structure for guiding an electronic component arrangement position.

DISCLOSURE OF INVENTION

Technical Problem

Electronic devices have a trend towards seeking a slim form factor and implementing a designated performance. Various structures and/or electronic components are disposed in a limited space of an electronic device, thereby making it difficult to secure a design space regarding a structure for guiding an electronic component arrangement position.

Various embodiments of the disclosure may provide an electronic device including a structure for guiding an electronic component arrangement position while reducing space restrictions.

Technical problems to be solved by the disclosure are not limited to the above-mentioned technical problems, and other technical problems not mentioned herein will be clearly understood from the following description by those skilled in the art to which the disclosure pertains.

Solution to Problem

According to an embodiment of the disclosure, an electronic device may include a printed circuit board, a first component disposed on one surface of the printed circuit board, a second component disposed on the other surface of the printed circuit board, and a metal structure configured to shield electromagnetic interference (EMI) related to the first component, wherein the metal structure includes a first portion configured to cover at least a part of the first component, and a second portion configured to extend from the first portion through the printed circuit board so as to support the second component.

According to an embodiment of the disclosure, a substrate assembly may include a printed circuit board, a first component disposed on one surface of the printed circuit board, a second component disposed on the other surface of the printed circuit board, and a metal structure configured to shield EMI related to the first component, wherein the metal structure includes a first portion configured to cover at least a part of the first component, and a second portion config- ured to extend from the first portion through the printed circuit board so as to support the second component.

Advantageous Effects of Invention

An electronic device including a structure for guiding an electronic component arrangement position according to various embodiments of the disclosure may guide an electronic component arrangement position by using an electromagnetic shielding member included in the electronic device, without adding a separate member, thereby reducing space restrictions or costs.

Various other advantageous effects obtainable or predictable from various embodiments of the disclosure may be disposed explicitly or implicitly in the detailed description of embodiments of the disclosure.

MODE FOR THE INVENTION

Hereinafter, various embodiments disclosed herein will be described with reference to the accompanying drawings.

Figure 1:
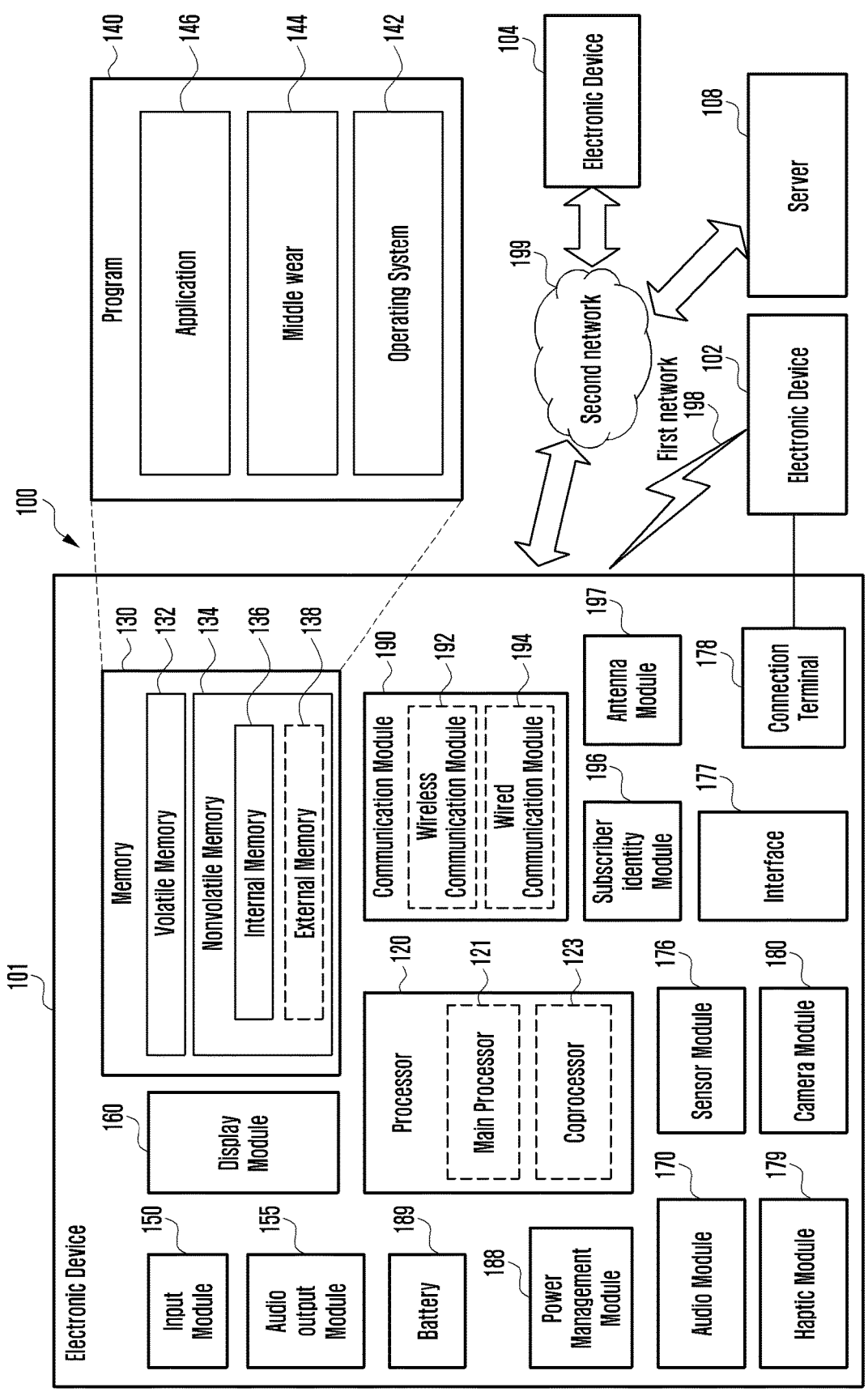
FIG. 1 is a block diagram of an electronic device in a network environment according to an embodiment.

FIG. 1 is a block diagram of an electronic device 101 in a network environment 100 according to an embodiment.

Referring to FIG. 1, the electronic device 101 in the network environment 100 may communicate with an external electronic device 102 via a first network 198 (e.g., a short-range wireless communication network), or at least one of an external electronic device 104 or a server 108 via a second network 199 (e.g., a long-range wireless communication network). The electronic device 101 may communicate with the external electronic device 104 via the server 108. The electronic device 101 may include a processor 120, memory 130, an input module 150, an audio output module 155, a display module 160, an audio module 170, a sensor module 176, an interface 177, a connection terminal 178, a haptic module 179, a camera module 180, a power management module 188, a battery 189, a communication module 190, a subscriber identification module (SIM) 196, and/or an antenna module 197. In some embodiments of the disclosure, at least one (e.g., the connection terminal 178) of the components may be omitted from the electronic device 101, or one or more other components may be added in the electronic device 101. In some embodiments of the disclosure, some of the components may be implemented as single integrated circuitry. For example, the sensor module 176, the camera module 180, or the antenna module 197 may be implemented as embedded in single component (e.g., the display module 160).

The processor 120 may execute, for example, software (e.g., a program 140) to control at least one other component (e.g., a hardware or software component) of the electronic device 101 coupled with the processor 120, and may perform various data processing or computation. As at least part of the data processing or computation, the processor 120 may load a command or data received from another component (e.g., the sensor module 176 or the communication module 190) in a volatile memory 132, process the command or the data stored in the volatile memory 132, and store resulting data in a non-volatile memory 134. The processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control, for example, at least some of functions or states related to at least one component (e.g., the display module 160, the sensor module 176, or the communication module 190) among the components of the electronic device 101, instead of the main processor 121 while the main processor 121 is in an inactive (e.g., a sleep) state, or together with the main processor 121 while the main processor 121 is in an active state (e.g., executing an application). The auxiliary processor 123 (e.g., an ISP or a CP) may be implemented as part of another component (e.g., the camera module 180 or the communication module 190) functionally related to the auxiliary processor 123. According to an embodiment of the disclosure, the auxiliary processor 123 (e.g., a neural network processing device) may include a hardware structure specified for processing an artificial intelligence model. The artificial intelligence model may be created through machine learning. Such learning may be performed, for example, in the electronic device 101 itself on which the artificial intelligence model is performed, or may be performed through a separate server (e.g., the server 108). The learning algorithms may include, for example, supervised learning, unsupervised learning, semi-supervised learning, or reinforcement learning, but is not limited thereto. The artificial intelligence model may include a plurality of artificial neural network layers. The artificial neural network may be any of a deep neural network (DNN), a convolutional neural network (CNN), a recurrent neural network (RNN), a restricted Boltzmann machine (RBM), a deep belief network (DBN), a bidirectional recurrent DNN (BRDNN), a deep Q-network, or a combination of two or more of the above-mentioned networks, but is not limited the above-mentioned examples. In addition to the hardware structure, the artificial intelligence model may additionally or alternatively include a software structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 and/or the non-volatile memory 134.

The program 140 may be stored in the memory 130 as software, and may include, for example, an operating system (OS) 142, middleware 144, and/or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The audio output module 155 may output sound signals to the outside of the electronic device 101. The audio output module 155 may include, for example, a speaker or a receiver. The speaker may be used for general purposes, such as playing multimedia or playing record, and the receiver may be used for incoming calls. The receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. The display module 160 may include touch circuitry (e.g., a touch sensor) adapted to detect a touch, or sensor circuitry (e.g., a pressure sensor) adapted to measure the intensity of force incurred by the touch.

The audio module 170 may convert a sound into an electrical signal and vice versa. The audio module 170 may obtain the sound via the input module 150, or output the sound via the audio output module 155 or a headphone of an external electronic device (e.g., the external electronic device 102) directly (e.g., by a wired connection) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. The sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the external electronic device 102) directly (e.g., by a wired connection) or wirelessly. The interface 177 may include, for example, a high-definition multimedia interface (HDMI), a universal serial bus (USB) interface, a secure digital (SD) card interface, and/or an audio interface.

The connection terminal 178 may include a connector via which the electronic device 101 may be physically connected with the external electronic device (e.g., the external electronic device 102). The connection terminal 178 may include, for example, an HDMI connector, a USB connector, an SD card connector, and/or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. The haptic module 179 may include, for example, a motor, a piezoelectric element, or an electric stimulator.

The camera module 180 may capture a still image or moving images. The camera module 180 may include one or more lenses, image sensors, ISPs, or flashes.

The power management module 188 may manage power supplied to or consumed by the electronic device 101. The power management module 188 may be implemented as at least part of, for example, a power management integrated circuit (PMIC).

The battery 189 may supply power to at least one component of the electronic device 101. The battery 189 may include, for example, a primary cell which is not rechargeable, a secondary cell which is rechargeable, and/or a fuel cell.

The communication module 190 may support establishing a direct (e.g., wired) communication channel or a wireless communication channel between the electronic device 101 and the external electronic device (e.g., the external electronic device 102, the external electronic device 104, or the server 108) and performing communication via the established communication channel. The communication module 190 may include one or more CPs that are operable independently from the processor 120 (e.g., the AP) and supports a direct (e.g., wired) communication or a wireless communication. The communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as BLUETOOTH, wireless-fidelity (Wi-Fi) direct, or IR data association (IrDA)) or the second network 199 (e.g., a long-range communication network, such as a legacy cellular network, a 5th generation (5G) network, a next generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192 may support a 5G network, after a 4th generation (4G) network, and next-generation communication technology, e.g., new radio (NR) access technology. The NR access technology may support high-speed transmission of high-capacity data (i.e., enhanced mobile broadband (eMBB)), minimization of terminal power and connection of multiple terminals (massive machine type communications (mMTC)), or high reliability and low latency (ultra-reliable and low-latency communications (URLLC)). The wireless communication module 192 may support a high-frequency band (e.g., a mmWave band) to achieve, for example, a high data transmission rate. The wireless communication module 192 may support various technologies for securing performance in a high-frequency band, such as beamforming, massive multiple-input and multiple-output (MIMO), full-dimensional MIMO (FD-MIMO), array antenna, analog beam-forming, or large-scale antenna. The wireless communication module 192 may support various requirements specified in the electronic device 101, an external electronic device (e.g., external the electronic device 104), or a network system (e.g., the second network 199). According to an embodiment of the disclosure, the wireless communication module 192 may support a peak data rate for implementing eMBB (e.g., 20 Gbps or more), loss coverage for implementing mMTC (e.g., 164 dB or less), or U-plane latency for realizing URLLC (e.g., 0.5 ms or less for each of downlink (DL) and uplink (UL) or 1 ms or less for round trip).

The antenna module 197 may transmit or receive a signal or power to or from the outside (e.g., the external electronic device) of the electronic device 101. The antenna module 197 may include an antenna including a radiating element including a conductive material or a conductive pattern formed in or on a substrate (e.g., a printed circuit board (PCB)). The antenna module 197 may include a plurality of antennas (e.g., an antenna array). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. Another component (e.g., a radio frequency integrated circuit (RFIC))

other than the radiating element may be additionally formed as part of the antenna module 197.

According to various embodiments of the disclosure, the antenna module 197 may form a mmWave antenna module. According to an embodiment of the disclosure, the mmWave antenna module may include a PCB, an RFIC that is disposed on or adjacent to a first surface (e.g., the bottom surface) of the PCB and is capable of supporting a predetermined high-frequency band (e.g., a mmWave band), and a plurality of antennas (e.g., array antennas) that is disposed on or adjacent to a second surface (e.g., the top surface or the side surface) of the PCB and is capable of transmitting or receiving a signal of the predetermined high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

Commands or data may be transmitted or received between the electronic device 101 and the external electronic device 104 via the server 108 coupled with the second network 199. Each of the external electronic devices 102 or 104 may be a device of a same type as, or a different type, from the electronic device 101. All or some of operations to be executed at the electronic device 101 may be executed at one or more of the external electronic devices 102, 104, or at the server 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide an ultra-low delay service using, for example, distributed computing or MEC. In another embodiment of the disclosure, the external electronic device 104 may include an internet of things (IoT) device. The server 108 may be an intelligent server using machine learning and/or neural networks. According to an embodiment of the disclosure, the external electronic device 104 or the server 108 may be included in the second network 199. The electronic device 101 may be applied to an intelligent service (e.g., smart home, smart city, smart car, or healthcare) based on 5G communication technology or IoT-related technology.

An electronic device according to an embodiment of the disclosure may be one of various types of electronic devices. The electronic devices may include a portable communication device (e.g., a smartphone), a computer device, a portable multimedia device, a portable medical device, a camera, a wearable device, or a home appliance. However, the electronic device is not limited to any of those described above.

Various embodiments of the disclosure and the terms used herein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). If an element (e.g., a first element) is referred to, with or without the term "operatively" or "communicatively," as "coupled with," "coupled to," "connected with," or "connected to" another element (e.g., a second element), it means that the element may be coupled with the other element directly (e.g., by a wired connection), wirelessly, or via a third element.

The term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment of the disclosure, the module may be implemented in a form of an application-specific integrated circuit (ASIC).

Various embodiments as set forth herein may be implemented as software (e.g., the program 140) including one or more instructions that are stored in a storage medium (e.g., an internal memory 136 or an external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

A method according to an embodiment of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PLAYSTORE™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

Each component (e.g., a module or a program) of the above-described components may include a single entity or multiple entities. One or more of the above-described components may be omitted, or one or more other components may be added. Alternatively or additionally, a plurality of components (e.g., modules or programs) may be integrated into a single component. In such a case, the integrated component may perform one or more functions of each of the plurality of components in the same or similar manner as they are performed by a corresponding one of the plurality of components before the integration. Operations performed by the module, the program, or another component may be carried out sequentially, in parallel, repeatedly, or heuristically, or one or more of the operations may be executed in a different order or omitted, or one or more other operations may be added.

Figure 2:
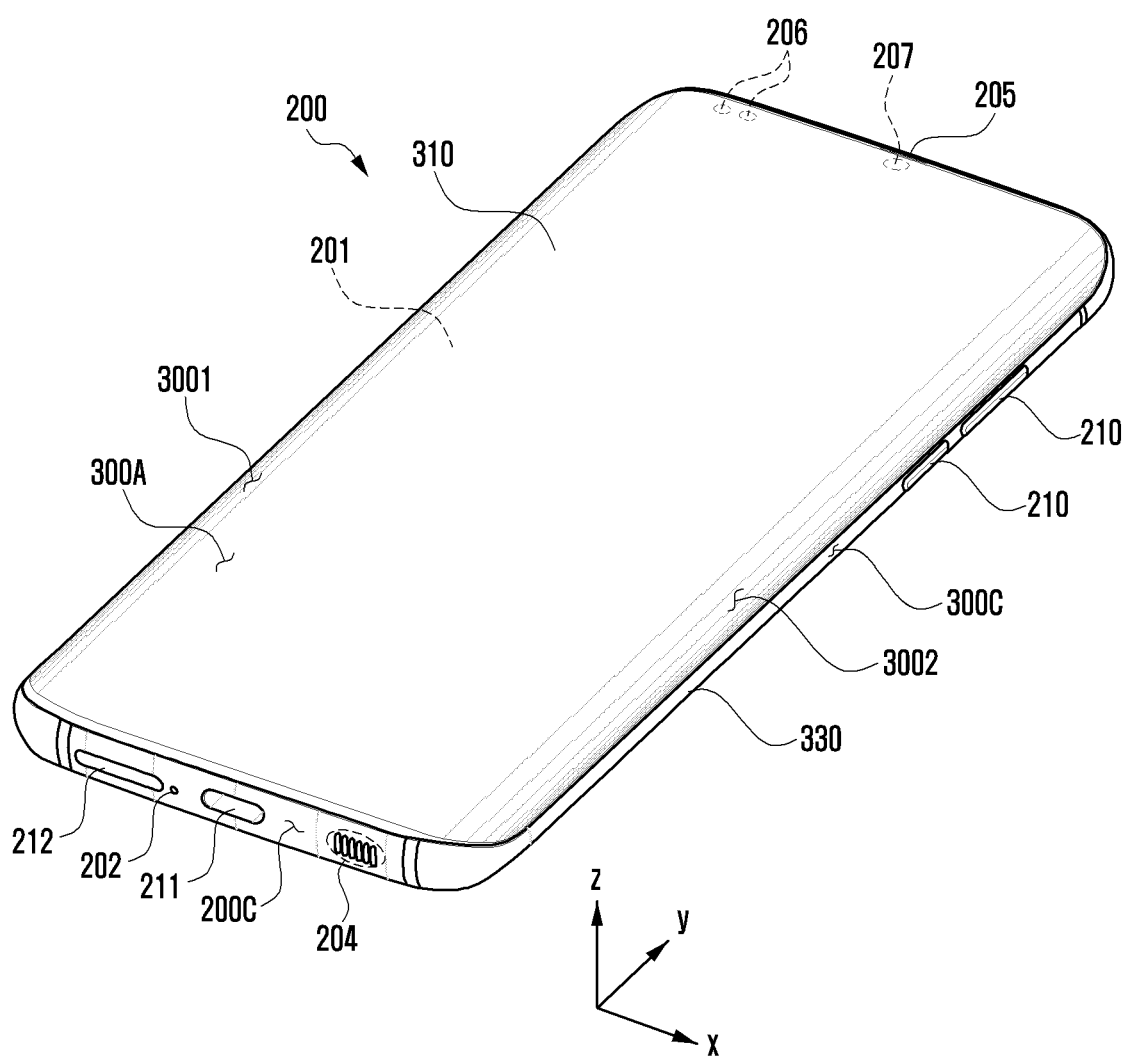
FIG. 2 is a front perspective view of an electronic device according to an embodiment.
Figure 3:
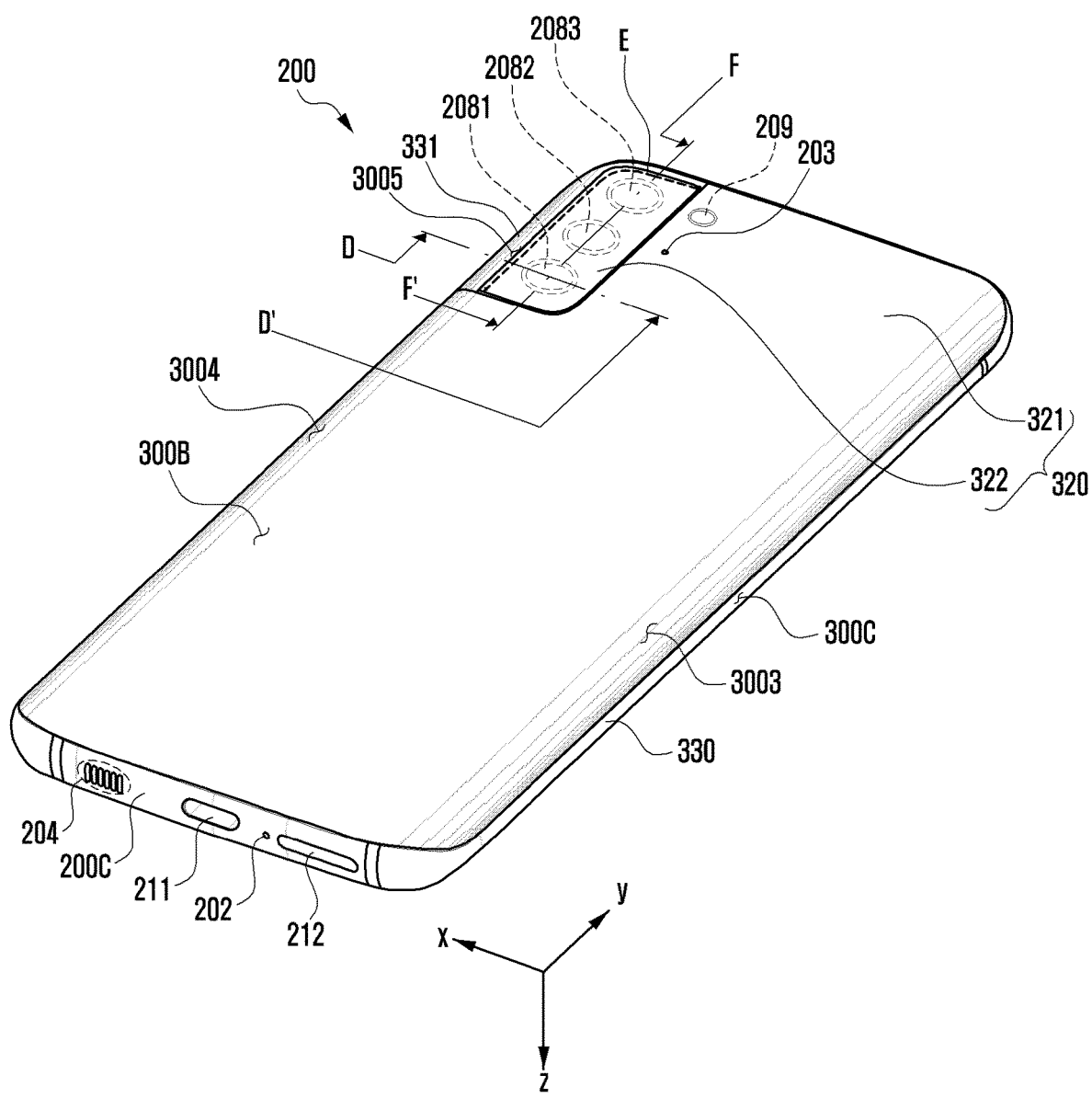
FIG. 3 is a rear perspective view of the electronic device of FIG. 2 according to an embodiment.

FIG. 2 is a front perspective view of an electronic device 200 according to an embodiment. FIG. 3 is a rear perspective view of the electronic device 200 of FIG. 2 according to an embodiment.

Referring to FIGS. 2 and 3, in an embodiment, an electronic device 200 (e.g., the electronic device 101 of FIG. 1) may include a housing 300 configured to provide the exterior of the electronic device 200. For example, the housing 300 may be configured to provide the front surface 300A of the electronic device 200, the rear surface 300B of the electronic device 200, and the side surface 300C of the electronic device 200. The side surface 300C may be configured to surround a space between the front surface 300A and the rear surface 300B. In some embodiments, the housing 300 may be referred to as a structure configured to provide at least a part of the front surface 300A, the rear surface 300B, and the side surface 300C.

According to an embodiment, the housing 300 may include a front plate 310, a rear plate 320, and/or a bezel structure 330. The front surface 300A of the electronic device 200 may have at least a part provided by the front plate 310. The front plate 310 may be configured to be substantially transparent, and for example, may include a glass plate or a polymer plate including various coating layers. The rear surface 300B of the electronic device 200 may have at least a part provided by the rear plate 320. In an embodiment, the rear plate 320 may include a first rear plate 321 configured to provide a part of the rear surface 300B, and a second rear plate 322 configured to provide another a part of the rear surface 300B. The first rear plate 321 and the second rear plate 322 may be configured to be substantially opaque. For example, the first rear plate 321 and/or the second rear plate 322 may be formed of coated or colored glass, ceramic, polymer, metal, or a combination of at least two of the materials. For another example, the first rear plate 321 and/or the second rear plate 322 may include aluminum, an aluminum alloy, magnesium, a magnesium alloy, or an alloy including iron (e.g., stainless steel). The bezel structure 330 may be configured to surround at least a part of the space between the front plate 310 and the rear plate 320. The side surface 300C of the electronic device 200 may have at least a part provided by the bezel structure 330. In some embodiments, the bezel structure 330 may be an element which substantially provides the side surface 300C of the electronic device 200, and may be referred to as a "side surface bezel structure" or a "side surface member". For example, the bezel structure 330 may include a metal and/or polymer.

According to an embodiment, the front plate 310 may include a first curved-surface part 3001 and a second curved-surface part 3002 which are bent to seamlessly extend from the front surface 300A toward the rear surface 300B. The first curved-surface part 3001 and the second curved-surface part 3002 may be provided adjacent to opposite edges of the front plate 310, which are positioned at sides opposite to each other. For example, the first curved-surface part 3001 and the second curved-surface part 3002 may be symmetrically arranged with a flat-surface part (not shown) of the front plate 310, which is interposed therebetween.

According to an embodiment, the first rear plate 321 may include a third curved-surface part 3003 and a second curved-surface part 3004 which are bent to seamlessly extend from the rear surface 300B toward the front surface 300A. The third curved-surface part 3003 may be provided adjacent to one side edge of the first rear plate 321 to correspond to the first curved-surface part 3001 of the front plate 310. The fourth curved-surface part 3004 may be provided adjacent to the other side edge of the first rear plate 321 to correspond to the second curved-surface part 3002 of the front plate 310. In an embodiment, a part 331 of the bezel structure 330 may include a fifth curved-surface part 3005 which corresponds to the second curved-surface part 3002 of the front plate 310 and is seamlessly connected to the fourth curved-surface part 3004 of the first rear plate 321. For example, one side curved-surface part including the fourth curved-surface part 3004 and the fifth curved-surface part 3005 may be disposed to be symmetrical with the third curved-surface part 3003 of the other side. In an embodiment, the second rear plate 322 may be positioned to correspond to the fifth curved-surface part 3005. For example, the part 331 of the bezel structure 330, which provides the fifth curved-surface part 3005, may be configured to extend along a partial edge (the edge along the dotted line indicated by reference numeral "E") by the second rear plate 322 among the edge (or the border) of the rear plate 320, and to be in contact with the second rear plate 320. In some embodiments, the fifth curved-surface part 3005 may be provided by the first rear plate 321 or the second rear plate 322. In some embodiments, the first rear plate 321 and the second rear plate 322 may be integrally formed. In some embodiments, the first rear plate 321 and/or the second rear plate 322 may be integrally formed with the bezel structure 330, and may include the same material (e.g., a metal material such as aluminum) as the bezel structure 330.

According to some embodiments, the housing 300 may be implemented without at least one of the first curved-surface part 3001, the second curved-surface part 3002, the third curved-surface part 3003, or a curved-surface part including the fourth curved-surface part 3004 and the fifth curved-surface part 3005.

According to an embodiment, as shown in FIG. 2, the electronic device 200 may include at least one of a display 201, a first audio module 202, a fourth audio module 205, a sensor module 206, a first camera module 207, an input module 210, a first connection terminal module 211, or a second connection terminal module 212, and, as shown in FIG. 3, the electronic device 200 may include at least one of a second audio module 203, a third audio module 204, multiple second camera modules 2081, 2082, and 2083, or a light-emitting module 209. In some embodiments, at least one of the elements may be omitted in the electronic device 200, or the electronic device 200 may additionally include another element.

For example, a display area (e.g., a screen display area or an active area) of the display 201 may be visually exposed through the front plate 310. In an embodiment, the electronic device 200 may have a display area which is seen through the front plate 310 and is implemented as large as possible (e.g., a large screen or a full screen). For example, the display 201 may be implemented to have the outer shape substantially the same as the outer shape of the front plate 310. For another example, the rim of the display 201 and the rim of the front plate 310 may be provided with substantially the same without a step difference. In an embodiment, the display 201 may include a touch detection circuit. In some embodiments, the display 201 may include a pressure sensor capable of measuring the intensity (pressure) of touch. In some embodiments, the display 201 may be coupled to a digitizer (e.g., an electromagnetic induction panel) for detecting a magnetic field type electronic pen (e.g., stylus pen), or may be positioned adjacent to the digitizer.

For example, the first audio module 202 may include a first microphone positioned inside the electronic device 200, and a first microphone hole provided through a side surface 300C to correspond to the first microphone. For example, the second audio module 203 may include a second microphone positioned inside the electronic device 200, and a second microphone hole provided through the rear surface 300B to correspond to the second microphone. For example, the second microphone hole may be provided through the first rear plate 321. In some embodiments, the second microphone hole may be provided through the second rear plate 322. The position or number of the audio module related to the microphone may be not limited to the illustrated embodiment, and may be various. In some embodiments, the electronic device 200 may include multiple microphones used to detect the direction of sound.

For example, the third audio module 204 may include a first speaker positioned inside the electronic device 200, and a first speaker hole provided through the side surface 300C to correspond to the first speaker. For example, the fourth audio module 205 may include a second speaker positioned inside the electronic device 200, and a second speaker hole provided through the front surface 300A to correspond to the second speaker. In an embodiment, the first speaker may include an external speaker. In an embodiment, the second speaker may include a receiver for calls, and the second speaker hole may be referred to as a receiver hole. The position or number of the third audio module 204 or the fourth audio module 205 may be various without being limited to the illustrated embodiment. In some embodiments, the microphone hole and the speaker hole may be implemented as one hole. In some embodiments, the third audio module 204 or the fourth audio module 205 may include a piezo speaker in which a speaker hole is omitted.

For example, the sensor module 206 may be configured to generate an electrical signal or data value corresponding to an internal operation state of the electronic device 200 or an external environmental state thereof. In an embodiment, the sensor module 206 may include an optical sensor positioned inside the electronic device 200 to correspond to the front surface 300A. For example, the optical sensor may include a proximity sensor or an illuminance sensor. The optical sensor may be aligned with an opening provided through the display 201. External light may be introduced into the optical sensor through openings of the front plate 310 and the display 201. In some embodiments, the optical sensor may be disposed at the lower end of the display 201, and may be configured to perform related functions while the position of the optical sensor is not visually distinguished (or exposed). For example, the optical sensor may be positioned on the rear surface of the display 201, or below or beneath the display 201. In some embodiments, the optical sensor may be positioned and aligned in a recess provided on the rear surface of the display 201. The optical sensor may be disposed to overlap at least a part of a screen, and may be configured to perform sensing functions without being exposed to the exterior. In this case, a partial area of the display 201, which at least partially overlaps the optical sensor, may include a different pixel structure and/or wiring structure compared to another area. For example, a partial area of the display 201, which at least partially overlaps the optical sensor, may have a different pixel density compared to another area. In some embodiments, multiple pixels may not be arranged in a partial area of the display 201, which at least partially overlaps the optical sensor. In some embodiments, the electronic device 200 may include a biometric sensor (e.g., a fingerprint sensor) positioned below the display 201. The biometric sensor may be implemented in an optical type, an electrostatic type, or an ultrasonic type, and the position or number thereof may be various. The electronic device 200 may further include at least one of various sensor modules, for example, a gesture sensor, a gyro sensor, a barometric pressure sensor, a magnetic sensor, an acceleration sensor, a grip sensor, a color sensor, an infrared (IR) sensor, a temperature sensor, or a humidity sensor.

For example, the first camera module 207 (e.g., a front camera module) may be positioned inside the electronic device 200 to correspond to the front surface 300A. For example, the multiple second camera modules (e.g., the first rear camera module 2081, the second rear camera module 2082, and the third rear camera module 2083) may be positioned inside the electronic device 200 to correspond to the rear surface 300B. In an embodiment, the multiple second camera modules 2081, 2082, and 2083 may be positioned to correspond to the second rear plate 322. The first camera module 207 and/or the multiple second camera modules 2081, 2082, and 2083 may include one lens or multiple lenses, an image sensor, and/or an image signal processor. The position or number of the first camera module or the second camera modules may not be limited to the illustrated embodiment, and may be various.

According to an embodiment, the display 201 may include an opening aligned with the first camera module 207. External light may reach the first camera module 207 through the openings of the front plate 310 and the display 201. In some embodiments, the opening of the display 201 may be provided in a notch shape according to the position of the first camera module 207. In some embodiments, the first camera module 207 may be disposed at the lower end of the display 201, and may be configured to perform related functions (e.g., image photographing) while the position of the first camera module 207 is not visually distinguished (exposed). For example, the first camera module 207 may be positioned on the rear surface of the display 201 or below or beneath the display 201, and may include a hidden display rear camera (e.g., an under display camera (UDC)). In some embodiments, the first camera module 207 may be positioned and aligned in a recess provided on the rear surface of the display 201. The first camera module 207 may be disposed to overlap at least a part of a screen, and may be configured to obtain an image of an external subject without being visually exposed to the exterior. In this case, a partial area of the display 201, which at least partially overlaps the first camera module 207, may include a different pixel structure and/or wiring structure compared to another area. For example, a partial area of the display 201, which at least partially overlaps the first camera module 207, may have a different pixel density compared to another area. A pixel structure and/or a wiring structure provided in a partial area of the display 201, which at least partially overlaps the first camera module 207, may be configured to reduce light loss between the exterior and the first camera module 207. In some embodiments, pixels may not be arranged in a partial area of the display 201, which at least partially overlaps the first camera module 207. In some embodiments, the electronic device 200 may further include a light-emitting module (e.g., a light source) positioned inside the electronic device 200 to correspond to the front surface 300A. For example, the light-emitting module may be configured to provide state information of the electronic device 200 in the form of light. In some embodiments, the light-emitting module may be configured to provide a light source interlocked with an operation of the first camera module 207. For example, the light-emitting module may include an LED, an IR LED, or a xenon lamp.

According to an embodiment, the multiple second camera modules 2081, 2082, and 2083 may have different attributes (e.g., view angles) or functions, and for example, may include a dual camera or a triple camera. The multiple second camera modules 2081, 2082, and 2083 may include multiple camera modules including lenses having different view angles, and based on a user's selection, the electronic device 200 may be configured to control so as to change view angles of the camera module, which is performed in the electronic device 200. The multiple second camera modules 2081, 2082, and 2083 may include at least one of a wide-angle camera, a telephoto camera, a color camera, a monochrome camera, or an infrared (IR) camera (e.g., a time of flight (TOF) camera or a structured light camera). In some embodiments, the IR camera may also be operated as at least a part of a sensor module. The light-emitting module 209 (e.g., a flash) may include a light source for the multiple second camera modules 2081, 2082, and 2083. For example, the light-emitting module 209 may include an LED or a xenon lamp.

For example, the input module 210 may include one or more key input devices. For example, the one or more key input devices may be positioned in an opening provided through the side surface 300C. In some embodiments, the electronic device 200 may not include some or all of the key input devices, and the key input device 301, which are not included therein, may be implemented as a soft key by using the display 201. The position or number of the input module 210 may be varied, and in some embodiments, the input module 210 may include at least one sensor module.

For example, the first connection terminal module 211 (e.g., a first connector module or a first interface terminal module) may include a first connector (or a first interface terminal) positioned inside the electronic device 200, and a first connector hole provided through the side surface 300C to correspond to the first connector. For example, the second connection terminal module 212 (e.g., a second connector module or a second interface terminal module) may include a second connector (or a second interface terminal) positioned inside the electronic device 200, and a second connector hole provided through the side surface 300C to correspond to the second connector. The electronic device 200 may be configured to transmit and/or receive power and/or data to and/or from an external electronic device electrically connected to the first connector or the second connector. In an embodiment, the first connector may include a universal serial bus (USB) connector or a high definition multimedia interface (HDMI) connector. In an embodiment, the second connector may include a connector for a memory card (e.g., a secure digital (SD) memory card or a subscriber identity module (SIM) card). In some embodiments, the second connector may include an audio connector (e.g., a headphone connector or an earphone connector). The position or number of the connection terminal module may not be limited to the illustrated embodiment, and may be various.

The electronic device 200 may further include various elements according to a provision form thereof. The elements may be variously changed according to the convergence trend of the electronic device 200, and thus may not be enumerated. However, an element equivalent to the mentioned elements may be additionally included in the electronic device 200. In various embodiments, according to a provision form thereof, specific elements may be excluded from the above-described elements, or may be replaced with other elements.

Figure 4:
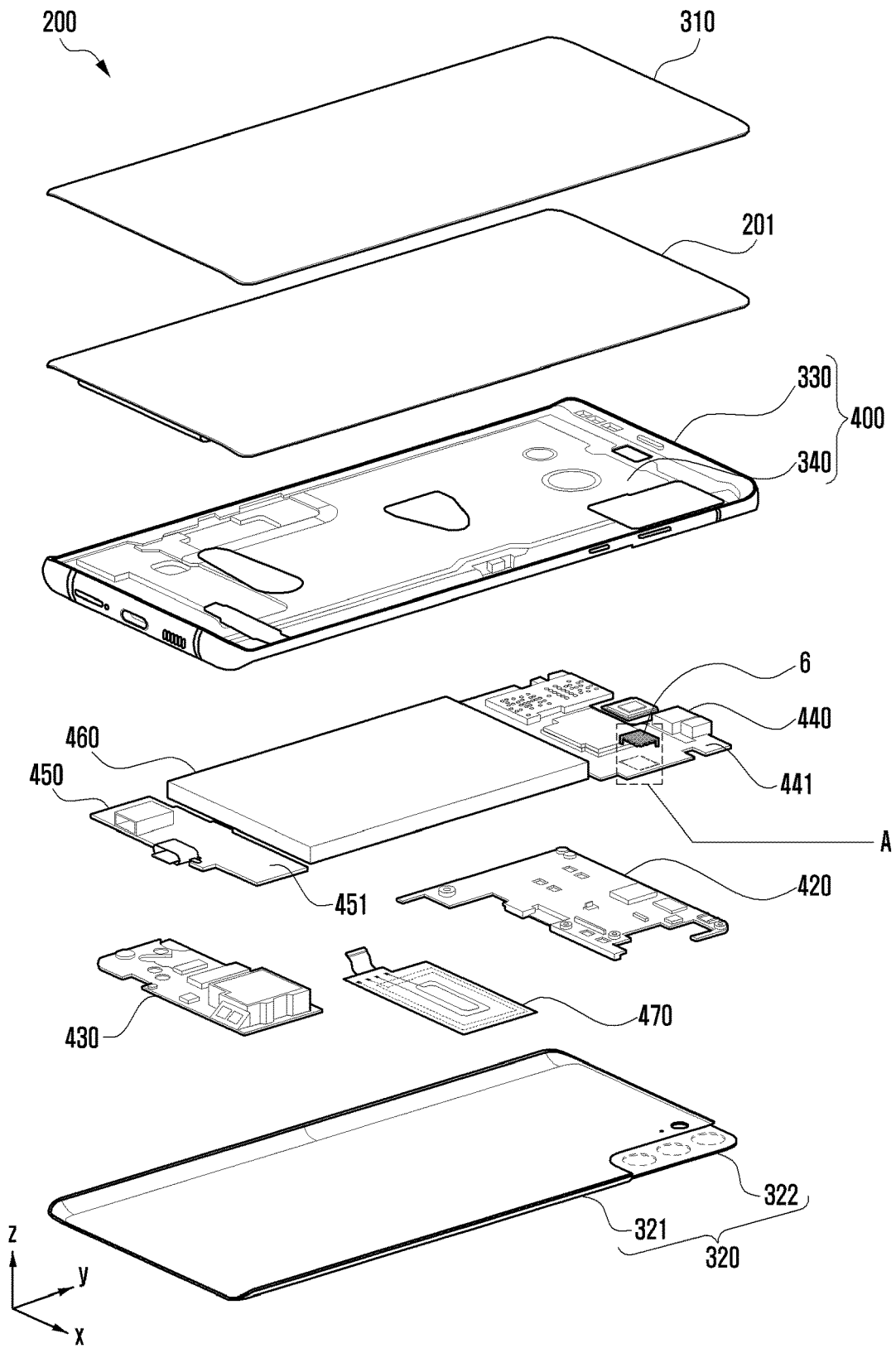
FIGS. 4 and 5 are exploded perspective views of the electronic device of FIG. 2 according to an embodiment.
Figure 5:
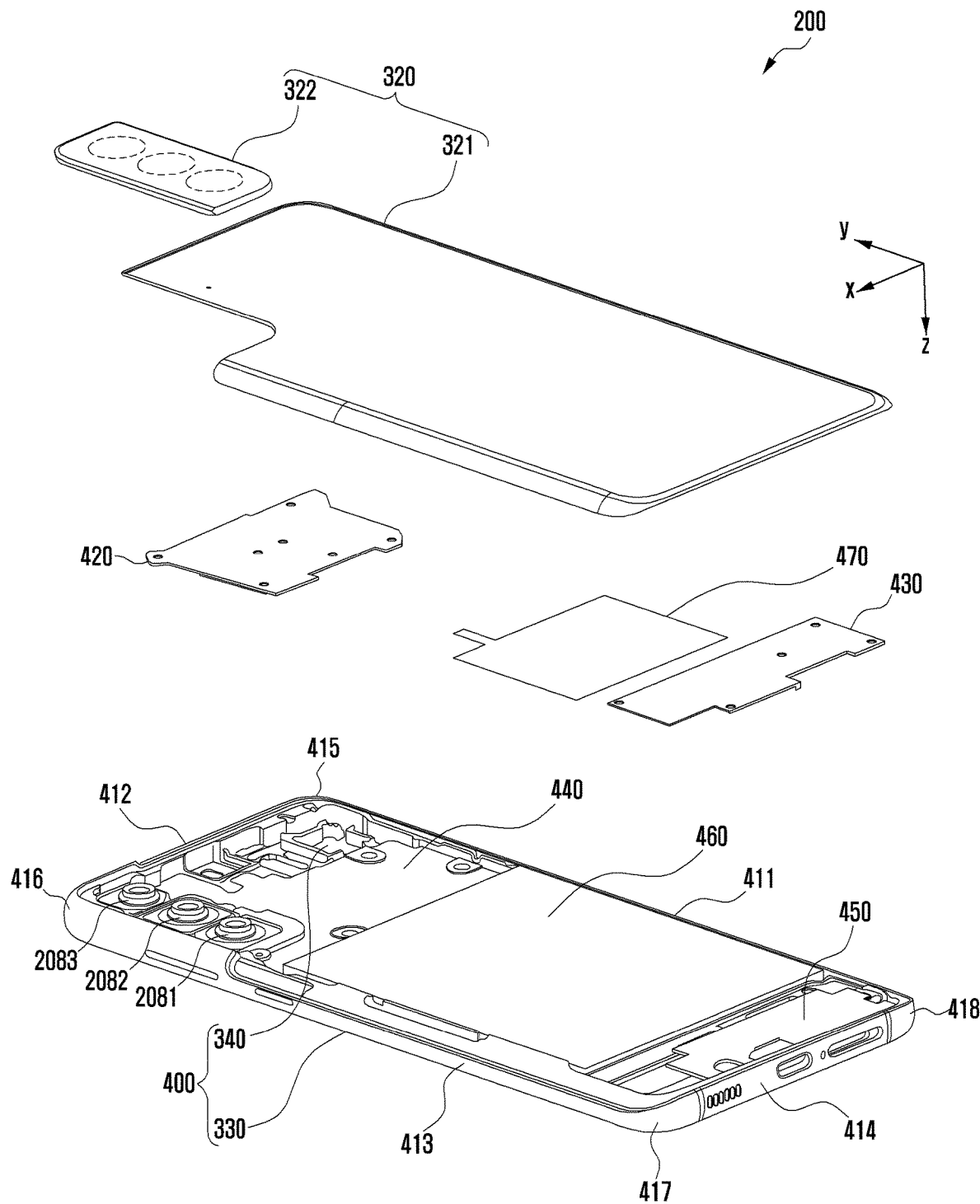

FIGS. 4 and 5 are exploded perspective views of the electronic device 200 of FIG. 2 according to an embodiment.

Referring to FIGS. 4 and 5, in an embodiment, an electronic device 200 may include a front plate 310, a rear plate 320, a bezel structure 330, a first support member 340, a second support member 420, a third support member 430, a display 201, a first substrate assembly 440, a second substrate assembly 450, a battery 460, or an antenna structure 470. In some embodiments, at least one of the elements may be omitted in the electronic device 200, or the electronic device 200 may additionally include another element.

According to an embodiment, the bezel structure (or a side surface member) 330 may include a first bezel part (or a first side surface part) 411, a second bezel part (or a second side surface part) 412, a third bezel part (or a third side surface part) 413, or a fourth bezel part (or a fourth side surface part) 414. The first bezel part 411 and the third bezel part 413 may be spaced apart from each other and be configured to extend in parallel thereto. The second bezel part 412 may be configured to connect one end of the first bezel part 411 and one end of the third bezel part 413. The fourth bezel part 414 may be configured to connect the other end of the first bezel part 411 and the other end of the third bezel part 413, and may be spaced apart from the second bezel part 412 and configured to extend in parallel thereto. At least a part of a first corner part 415 at which the first bezel part 411 and the second bezel part 412 are connected may be provided with a round shape. At least a part of a second corner part 416 at which the second bezel part 412 and the third bezel part 413 are connected may be provided with a round shape. At least a part of a third corner part 417 at which the third bezel part 413 and the fourth bezel part 414 are connected may be provided with a round shape. At least a part of a fourth corner part 418 at which the first bezel part 411 and the fourth bezel part 414 are connected may be provided with a round shape. The first bezel part 411 and the third bezel part 413 may have a first length extending in the y-axis direction, and the second bezel part 412 and the fourth bezel part 414 may have a second length, which extends in the x-axis direction, and which is smaller than the first length. In some embodiments, the first length and the second length may be substantially the same. The first support member 340 may be positioned inside the electronic device 200, and may be connected to the bezel structure 330 or may be integrally formed with the bezel structure 330. For example, the first support member 340 may be made of a metal material and/or a non-metal material (e.g., polymer). In an embodiment, a conductive part included in the first support member 340 may be configured to perform a function of electromagnetic shielding to the display 201, the first substrate assembly 440, and/or the second substrate assembly 450. Both the first support member 340 and the bezel structure 330 may be referred to as a front case 400. The first support member 340 may be a portion of the front case 400, in which elements such as the display 201, the first substrate assembly 440, the second substrate assembly 450, or the battery 460 are disposed, and may be configured to contribute to a durability or a rigidity (e.g., torsional rigidity) of the electronic device 200. In some embodiments, the first support member 340 may be referred to as a "bracket", a "mounting plate", or a "support structure". In some embodiments, the first support member 340 may be defined as a part of the housing 300 (see FIG. 2).

For example, the display 201 may be positioned between the first support member 340 and the front plate 310, and may be disposed on one surface of the first support member 340. In an embodiment, the front plate 310 and the display 201 may be integrally formed. For example, the first substrate assembly 440 and the second substrate assembly 450 may be positioned between the first support member 340 and the rear plate 320, and may be disposed on the other surface of the first support member 340. For example, the battery 460 may be positioned between the first support member 340 and the rear plate 320, and may be disposed in the first support member 340.

According to an embodiment, the first substrate assembly 440 may include a first printed circuit board 441 (e.g., a printed circuit board (PCB), or a printed circuit board assembly (PBA)). The first substrate assembly 440 may include various electronic components electrically connected to the first printed circuit board 441. The electronic components may be arranged on the first printed circuit board 441, or may be electrically connected to the first printed circuit board 441 through an electrical path such as a cable or a flexible printed circuit board (FPCB). Referring to FIGS. 2 and 3, for example, the electronic components may include a second microphone included in the second audio module 203, a second speaker included in the fourth audio module 205, the sensor module 206, and the first camera module 207, the multiple second camera modules 2081, 2082, and 2083, the light-emitting module 209, or the input module 210.

According to an embodiment, the second substrate assembly 450 may be disposed to be spaced apart from the first substrate assembly 440 with the battery 460 interposed therebetween when seen from above the front plate 310 (e.g., when seen in the −z-axis direction). The second substrate assembly 450 may include a second printed circuit board 451 electrically connected to the first printed circuit board 441 of the first substrate assembly 440. The second substrate assembly 450 may include various electronic components electrically connected to the second printed circuit board 451. The electronic components may be arranged on the second printed circuit board 451, or may be electrically connected to the second printed circuit board 451 through an electrical path such as a cable or an FPCB. Referring to FIGS. 2 and 3, for example, the electronic components may include a first microphone included in the first audio module 202, a first speaker included in the third audio module 204, a first connector included in the first connection terminal module 211, or a second connector included in the second connection terminal module 212.

According to some embodiments, the first substrate assembly 440 or the second substrate assembly 450 may include a primary PCB (or a main PCB or a master PCB), a secondary PCB (or a slave PCB) disposed to partially overlap the primary PCB, and/or an interposer substrate between the primary PCB and the secondary PCB.

The battery 460 may be a device configured to supply power to at least one element of the electronic device 200, and for example, may include a non-rechargeable primary cell, a rechargeable secondary cell, or a fuel cell. The 460 may be integrally disposed inside the electronic device 200, or may be disposed to be detachable/attachable from/to the electronic device 200.

According to an embodiment, the second support member 420 may be positioned between the first support member 340 and the rear plate 320, and may be coupled to the first support member 340 and/or the first substrate assembly 440 by using a fastening element such as a bolt. At least a part of the first substrate assembly 440 may be positioned between the first support member 340 and the second support member 420, and the second support member 420 may be configured to cover the first substrate assembly 440 so as to protect same. The third support member 430 may be positioned to be at least partially spaced apart from the second support member 420 with the battery 460 interposed therebetween when seen from above the rear plate 320 (e.g., when seen in the +z-axis direction). The third support member 430 may be positioned between the first support member 340 and the rear plate 320, and may be coupled to the first support member 340 and/or the second substrate assembly 450 by using a fastening element such as a bolt. At least a part of the second substrate assembly 450 may be positioned between the first support member 340 and the third support member 430, and the third support member 430 may be configured to cover the second substrate assembly 450 so as to protect same. The second support member 420 and/or the third support member 430 may be formed of a metal material and/or a non-metal material (e.g., polymer). In some embodiments, the second support member 420 may be configured to perform a function of electromagnetic shielding to the first substrate assembly 440, and the third support member 430 may be configured to perform a function of electromagnetic shielding to the second substrate assembly 450. In some embodiments, the second support member 420 and/or the third support member 430 may be referred to as a rear case. In some embodiments, the second support member 420 and/or the third support member 430 may be defined as a part of the housing 300 (see FIG. 2).

According to some embodiments, an integral substrate assembly including the first substrate assembly 440 and the second substrate assembly 450 may be implemented. For example, when seen from above the rear plate 320 (e.g., when seen from in the +z-axis direction), the substrate assembly may include a first portion and a second portion spaced apart from each other with the battery 460 interposed between, and a third portion configured to extend between the battery 460 and the bezel structure 330 and connect the first portion and the second portion. The third portion may be implemented to be substantially rigid. In some embodiments, the third portion may be implemented to be substantially flexible. In some embodiments, an integral support member including the second support member 420 and the third support member 430 may be implemented.

According to an embodiment, the antenna structure 470 may have at least a part positioned between the battery 460 and the rear plate 320. For example, the antenna structure 470 may be implemented in the form of a film such as an FPCB. The antenna structure 470 may include at least one conductive pattern used as a loop type radiator. For example, the at least one conductive pattern may include a planar helical conductive pattern (e.g., a planar coil or a pattern coil). The at least one conductive pattern included in the antenna structure 470 may be electrically connected to a wireless communication circuit (or wireless communication module) included in the first substrate assembly 440. For example, the at least one conductive pattern may be utilized for short-range wireless communication such as near field communication (NFC). Another for example, the at least one conductive pattern may be utilized for magnetic secure transmission (MST) for transmitting and/or receiving a magnetic signal. In some embodiments, the at least one conductive pattern included in the antenna structure 470 may be electrically connected to a power transmission/reception circuit included in the first substrate assembly 440. The power transmission/reception circuit may be configured to wirelessly receive power from an external electronic device or wirelessly transmit power to the external electronic device, by using the at least one conductive pattern. The power transmission/reception circuit may include a power management module, and for example, may include a power management integrated circuit (PMIC) or a charger integrated circuit (IC). The power transmission/reception circuit may be configured to charge the battery 460 by using power wirelessly received using a conductive pattern.

According to an embodiment, the first substrate assembly 440 may include a metal structure 6 positioned on the first printed circuit board 441. The metal structure 6 may be configured to perform a function of electromagnetic shielding to at least one first electronic component disposed on one surface of the first printed circuit board 441. In an embodiment, when at least one second electronic component is disposed on the other surface of the first printed circuit board 441, the metal structure 6 may be configured to guide an arrangement position of the at least one second electronic component. The at least one second electronic component may be supported by the metal structure 6 such that the at least one second electronic component is stably disposed in a predetermined area of the first printed circuit board 441 without distortion (or tilting) (e.g., deviation). In an embodiment, the at least one second electronic component may include a first rear camera module 2081. In some embodiments, the at least one second electronic component may not be limited to the first rear camera module 2081, and may be various.

Figure 6:
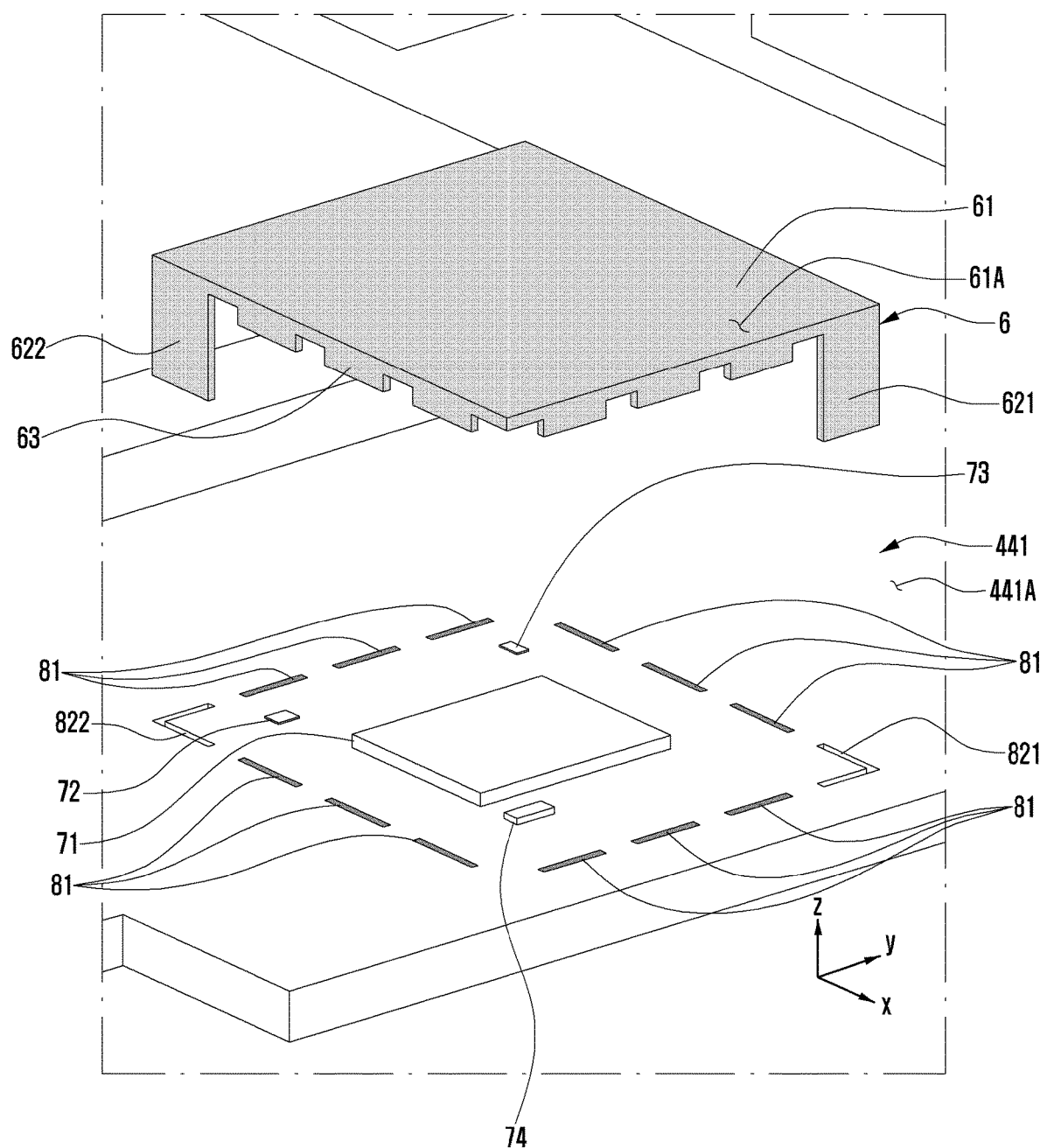
FIG. 6, in an embodiment, shows the portion indicated by reference numeral "A" of FIG. 4.
Figure 7:
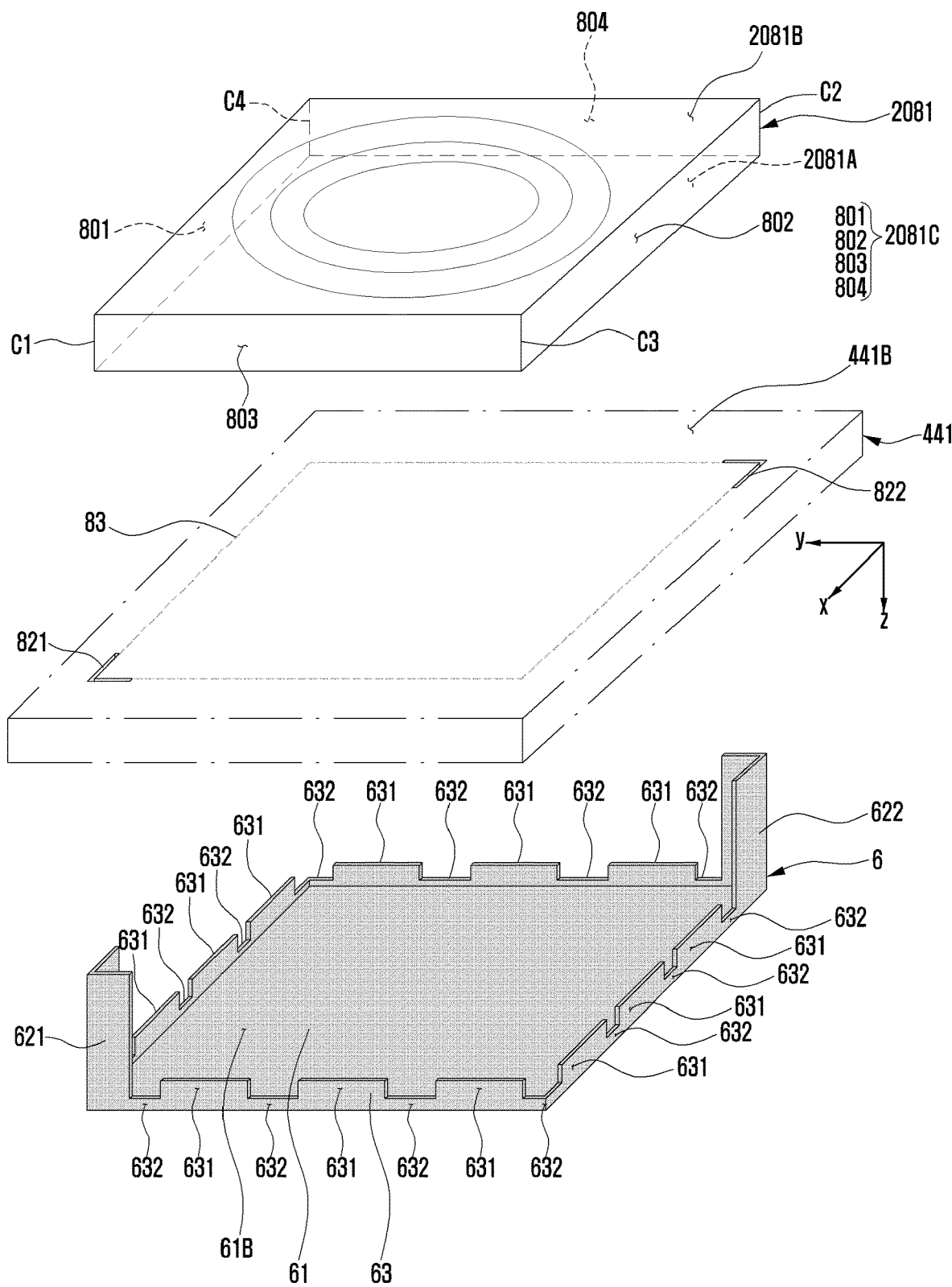
FIG. 7, in an embodiment, shows a state where a first printed circuit board, a metal structure, and a first rear camera module are separated from one another.
Figure 8:
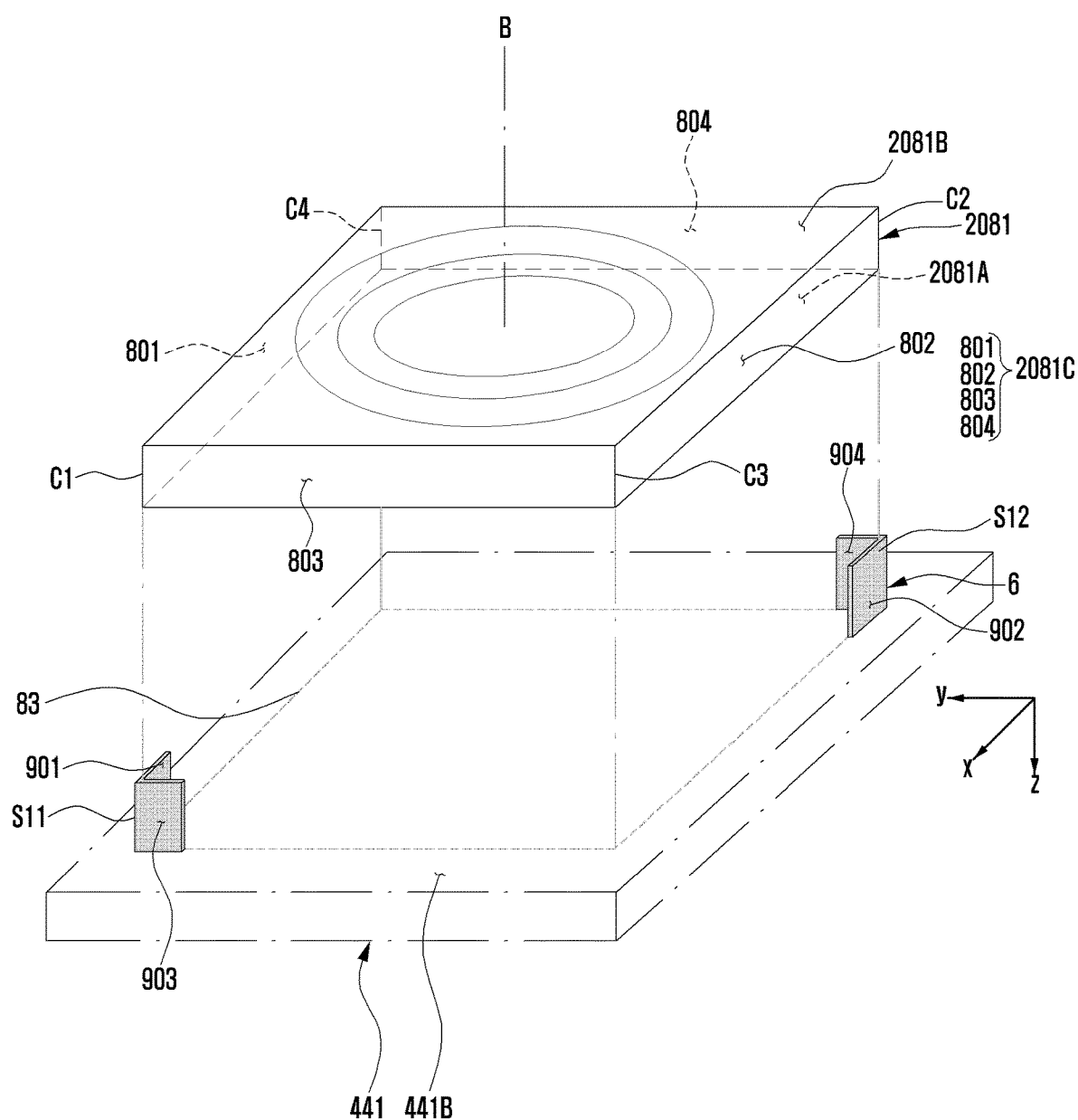
FIG. 8, in an embodiment, shows a state where a metal structure is coupled to a first printed circuit board, and a first rear camera module is separated from the first printed circuit board.
Figure 9:
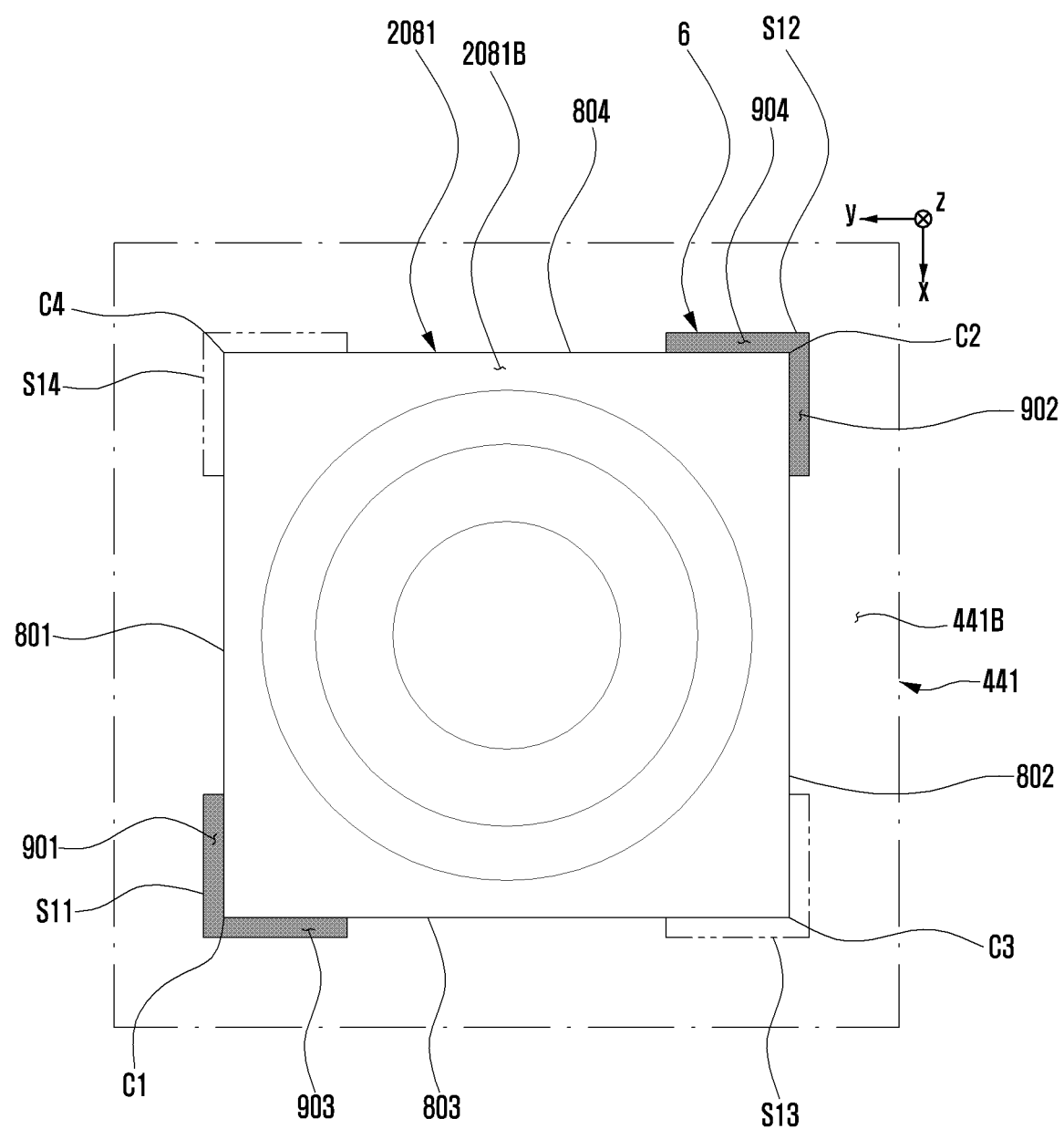
FIG. 9, in an embodiment, is an x-y plan view of a state where a first printed circuit board, a metal structure, and a first rear camera module are coupled.

FIG. 6, in an embodiment, shows the portion indicated by reference numeral "A" of FIG. 4. FIG. 7, in an embodiment, shows a state where a first printed circuit board 441, a metal structure 6, and a first rear camera module 2081 are separated from one another. FIG. 8, in an embodiment, shows a state where a metal structure 6 is coupled to a first printed circuit board 441, and a first rear camera module 2081 is separated from the first printed circuit board 441. FIG. 9, in an embodiment, is an x-y plan view of a state where a first printed circuit board 441, a metal structure 6, and a first rear camera module 2081 are coupled. FIG. 10, 11, 12, 13, 14, 15, 16, 17, or 18 illustrate a metal structure according to another embodiment.

Referring to FIGS. 6, 7, 8, and 9, the first printed circuit board 441, the metal structure 6, and the first rear camera module 2081 are illustrated therein. In an embodiment, the metal structure (or a conductive structure) 6 may be coupled to or disposed on the first printed circuit board 441. The first printed circuit board 441 may include a front surface 441A (see FIG. 6), which is configured to face the front plate 310 (see FIG. 4), and a rear surface 441B (see FIG. 7), which is configured to face the rear plate 320 (see FIG. 5). The front surface 441A of the first printed circuit board 441 may be configured to face the first support member 340. One or more electronic components 71, 72, 73, and 74 may be arranged on the front surface 441A of the first printed circuit board 441, and may be positioned between the first support member 340 and the first printed circuit board 441. A part of the metal structure 6 may be positioned between the first support member 340 and the first printed circuit board 441. The one or more electronic components 71, 72, 73, and 74 may be positioned in a space of the metal structure 6 between a part positioned between the first support member 340 and the first printed circuit board 441 and the first printed circuit board 441. The metal structure 6 may be configured to reduce noise introduced from the exterior of the electronic device 200 (see FIG. 2) or electromagnetic influence (e.g., electromagnetic interference (EMI)) of another electronic component (e.g., the display 201 of FIG. 4) on one or more electronic components 71, 72, 73, and 74. In an embodiment, the metal structure 6 may be configured to reduce electromagnetic influence (e.g., EMI) of the one or more electronic components 71, 72, 73, and 74 on another electronic component (e.g., the display 201 of FIG. 4). In some embodiments, the metal structure 6 may be referred to as an electromagnetic shielding member (or electromagnetic shielding structure) or a shield can. The number, position, or shape of electronic components, which are arranged on the front surface 441A of the first printed circuit board 441 to correspond to the metal structure 6, may not be limited to the illustrated embodiment, and may be various.

According to an embodiment, the metal structure 6 may be electrically connected to a ground (e.g., a ground plane or a ground layer) included in the first printed circuit board 441. The metal structure 6, which is electrically connected to the ground, may be configured to perform a function of a ground structure for reducing electromagnetic influence (e.g., EMI) on the one or more electronic components 71, 72, 73, and 74. The metal structure 6, which is electrically connected to a ground, may be configured to reduce the influence of electromagnetic noise (e.g., EMI) generated inside the electronic device 200 (see FIG. 2) or introduced from the exterior of the electronic device 200 on the one or more electronic components 71, 72, 73, and 74. For example, the metal structure 6, which is electrically connected to the ground, may be configured to reduce electromagnetic interference (EMI) between the at least one electronic component 6 and the display 201 (see FIG. 4). In an embodiment, the metal structure 6 may include a first portion 61, one or more second portions 621 and 622, and/or a third portion 63. For example, the metal structure 6 may include various metal materials such as titanium, an amorphous alloy, a metal-ceramic composite material (e.g., cermet), magnesium, a magnesium alloy, aluminum, an aluminum alloy, a zinc alloy, or a copper alloy.

According to an embodiment, the first portion 61 may be positioned between the first printed circuit board 441 and the first support member 340. For example, the first portion 61 may include a plate configured to be substantially parallel to the first printed circuit board 441 or the front surface 441A of the first printed circuit board 441. For example, one surface 61A (see FIG. 6) of the first portion 61, which faces the first support member 340, and the other surface 61B (see FIG. 7) of the first portion 61, which faces the front surface 441A of the first printed circuit board 441, may include flat surfaces configured to be substantially parallel to each other. For example, the thickness (e.g., the thickness in the z-axis direction) of the first portion 61 may be substantially constant over the entire area of the first portion 61. In some embodiments, although not illustrated therein, a partial area and another partial area of the first portion 61 may be formed to have different thicknesses (e.g., the thickness in the z-axis direction).

According to an embodiment, the third portion 63 may be configured to extend from the first portion 61 so as to be coupled to the front surface 441A of the first printed circuit board 441. For example, the third portion 63 may be configured to extend from the edge of the first portion 61 toward the first printed circuit board 441. The third portion 63 may be provided in the form of a sidewall substantially perpendicular to the first portion 61 having a substantially flat plate shape. In an embodiment, the third portion 63 may include portions 631 (see FIG. 7) configured to extend from the first portion 61 toward the first printed circuit board 441 at a first height, and portions 632 (see FIG. 7) configured to extend from the first portion 61 toward the first printed circuit board 441 at a second height lower than the first height. The portions 631 of the third portions 63, which extend at the first height, may be connected to the first printed circuit board 441. For example, the ends of the portions 631, which extend at the first height, may be mechanically and electrically connected to multiple conductive lands 81 (or conductive pads or conductive terminals) provided on the front surface 441A of the first printed circuit board 441, by using conductive adhesive materials such as solder, copper, silver paste, aluminum, silver-aluminum, carbon paste, or CNT paste. The metal structure 6 may be electrically connected to a ground included in the first printed circuit board 441 due to a current flow between the third portion 63 and the multiple conductive lands 81. The third portion 63 may not be limited to the illustrated embodiment and may be provided in various forms in which portions extending at the first height and portions extending at the second height are combined with each other, and the first printed circuit board 441 may include one or more conductive lands corresponding thereto. The third portion 63 may not be limited to the illustrated embodiment and may be provided in various shapes capable of securing coupling durability or coupling rigidity between the metal structure 6 and the first printed circuit board 441. The number of portions extending at the first height or the number of portions extending at the second height may not be limited to the illustrated embodiment and may be various. In some embodiments, at least one of the portions of the third portion 63, which extend at the second height, may be omitted. In some embodiments, the third portion 63 may be implemented in a form extending at the first height without the portions extending at the second height. The portions extending at the first height or the portions extending at the second height may have various widths extending along the edge of the first portion 61 without being limited to the illustrated embodiment. In some embodiments, the third portion 63 may further include a portion (not shown) configured to extend from the other surface 61B (see FIG. 7) of the first portion 61, which faces the front surface 441A of the first printed circuit board 441, so as to be in contact with or electrically and mechanically connected to the front surface 441A of the first printed circuit board 441.

According to an embodiment, the first portion 61 may be supported by the third portion 63 and may be positioned to be spaced apart from the front surface 441A of the first printed circuit board 441. In an embodiment, the first portion 61 may be positioned to be spaced apart from the one or more the electronic components 71, 72, 73, and 74. In some embodiments, the first portion 61 may be configured to be in contact with at least a part of the one or more electronic components 71, 72, 73, and 74, but not to substantially press the contacted at least one electronic component.

According to some embodiments, although not illustrated therein, a partial area and another partial area of the other surface 61B (see FIG. 7) of the first portion 61, which face the front surface 441A of the first printed circuit board 441, may be positioned at differently spaced distances from each other, from the front surface 441A of the first printed circuit board 441 in the +z-axis direction.

According to some embodiments, although not illustrated therein, a partial area and another partial area of the one surface 61A (see FIG. 6) of the first portion 61, which face the first support member 340, may be positioned at differently spaced distances from each other, from the front surface 441A of the first printed circuit board 441 in the +z-axis direction.

According to some embodiments, a conductive part of the metal structure 6, which includes the first portion 61 and the third portion 63, may be referred to as a portion configured to substantially shield electromagnetism to the one or more electronic components 71, 72, 73, and 74 of the metal structure 6.

According to an embodiment, the one or more second portions 621 and 622 may be configured to extend from the first portion 61 through the first printed circuit board 441. For example, the one or more second portions 621 and 622 may be positioned on the edge of the first portion 61. For example, the one or more second portions 621 and 622 may be provided in the form of a sidewall substantially perpendicular to the first portion 61 having a substantially flat plate shape. The one or more second portions 621 and 622 may be configured to guide the arrangement position of the first rear camera module 2081 when the first rear camera module 2081 is disposed on the rear surface 441B of the first printed circuit board 441. In an embodiment, the first printed circuit board 441 may include one or more openings (e.g., the first opening 821 and the second opening 822) corresponding to the one or more second portions 621 and 622. For example, the one or more openings 821 and 822 may be provided in the shape of a through-hole. The one or more second portions 621 and 622 may be positioned through the one or more openings 821 and 822, and a part of the one or more second portions 621 and 622 may be configured to protrude with respect to the rear surface 441B of the first printed circuit board 441. In an embodiment, a part of one second portion 621 may be configured to protrude with respect to the rear surface 441B of the first printed circuit board 441 so as to provide a first support part S11. In an embodiment, a part of the other second portion 622 may be configured to protrude with respect to the rear surface 441B of the first printed circuit board 441 so as to provide a second support part S12. The first support part S11 and the second support part S12 may be configured to guide the arrangement position of the first rear camera module 2081 when the first rear camera module 2081 is disposed in a designated area 83 (hereinafter, a camera module arrangement area) of the rear surface 441B of the first printed circuit board 441. Hereinafter, the one second portion 621 for providing the first support part S11 may be referred to as a first support structure (or a first guide structure), and the other second portion 622 for providing the second support part S12 may be referred to as a second support structure (or a second guide structure). In an embodiment, the first rear camera module 2081 may include a first surface 2081A configured to face the first printed circuit board 441, a second surface 2081B positioned opposite to the first surface 2081A, and a side surface 2081C (or a lateral surface) configured to connect the first surface 2081A and the second surface 2081B. The side surface 2081C of the first rear camera module 2081 may be configured to be substantially perpendicular to the first surface 2081A or the second surface 2081B. For example, the camera module arrangement area 83 or the first rear camera module 2081 disposed in the camera module arrangement area 83 may be configured to at least partially overlap the first portion 61 of the metal structure 6 when seen from above the rear surface 441B of the first printed circuit board 441 (e.g., when seen in the +z-axis direction). In an arrangement operation of the first rear camera module 2081, when the first rear camera module 2081 is moved toward the camera module arrangement area 83 in the +z-axis direction, the first support part S11 of the first support structure 621 and the second support part S12 of the second support structure 622 may be configured to support the side surface 2081C of the first rear camera module 2081 and thus to reduce distortion (or tilting) thereof in the z-axis direction, so that the first rear camera module 2081 is moved. For example, in an arrangement operation of the first rear camera module 2081, the first support part S11 of the first support structure 621 and the second support part S12 of the second support structure 622 may be configured to support the first rear camera module 2081 in the x-axis direction and the y-axis direction (e.g., a horizontal support). The first rear camera module 2081 may be horizontally supported by the first support part S11 of the first support structure 621 and the second support part S12 of the second support structure 622 and may be disposed in the camera module arrangement area 83. Therefore, an optical center line B or view angle of the first rear camera module 2081 may be provided without distortion (or tilting or deviation), or at a level within an acceptable range. The optical center line B of the first rear camera module 2081 may be an imaginary line passing through an optical center through which external light passes without being bent. For example, the optical center line B of the first rear camera module 2081 may be perpendicular to the rear surface 441B of the first printed circuit board 441 and may be substantially parallel to the z-axis direction. Although not illustrated therein, the first rear camera module 2081 may include at least one a first conductive terminal provided on the first surface 2081A, and the camera module arrangement area 83 may include at least one second conductive terminal corresponding to the at least on first conductive terminal. A conductive adhesive material such as solder, copper, silver paste, aluminum, silver-aluminum, carbon paste, or CNT paste may be placed between the at least one first conductive terminal and the at least one second conductive terminal, so that the first rear camera module 2081 is mechanically and electrically connected to the first printed circuit board 441.

According to an embodiment, the side surface 2081C of the first rear camera module 2081 may include a first side surface 801, a second side surface 802, a third side surface 803, and/or a fourth side surface 804. The first side surface 801 and the second side surface 802 may be positioned at sides opposite to each other and may be substantially parallel to each other. The third side surface 803 may be configured to connect one end of the first side surface 801 and one end of the second side surface 802. The fourth side surface 804 may be configured to connect the other end of the first side surface 801 and the other end of the second side surface 802, and to be substantially parallel to the third side surface 803. In an embodiment, the first support part S11 of the first support structure 621 and the second support part S12 of the second support structure 622 may be respectively correspondingly positioned the two corners positioned at sides opposite to each other in the diagonal direction thereof. For example, the first support part S11 of the first support structure 621 may be positioned to correspond to a first corner C1 at which the first side surface 801 and the third side surface 803 are connected, and the second support part S12 of the second support structure 622 may be positioned to correspond to a third corner C3 at which the second side surface 802 and the fourth side surface 804 are connected. In an embodiment, the first support part S11 of the first support structure 621, corresponding to the first corner C1, may be provided in a bent shape including a portion 901 configured to face the first side surface 801 of the first rear camera module 2081 and a portion 903 configured to face the third side surface 803 of the first rear camera module 2081. In an embodiment, the second support part S12 of the second support structure 622, corresponding to the third corner C3, may be provided in a bent shape including a portion 902 configured to face the second side surface 802 of the first rear camera module 2081 and a portion 904 configured to face the fourth side surface 804 of the first rear camera module 2081.

According to an embodiment, in order for the illustrated bent shape of the first support part S11, the first support structure 621 may be configured to extend from the first portion 61 in an "L"-shaped cross-sectional structure (e.g., a cross-sectional shape in an x-y plane). For example, a portion of the first support structure 621 between the first portion 61 and the front surface 441A of the first printed circuit board 441, may be provided in a cross-sectional shape (e.g., the "L"-shaped cross-sectional structure) substantially the same as the first support part S11 when seen in a cross section in the x-y plane. For example, a portion of the first support structure 621, which is positioned in the first opening 821 of the first printed circuit board 441, may be provided in a cross-sectional shape (e.g., the "L"-shaped cross-sectional structure) substantially the same as the first support part S11 when seen in a cross section in the x-y plane. In an arrangement operation of the first rear camera module 2081, the first support structure 621 having the bended shape may contribute to secure rigidity so as to reduce the phenomenon that the first support part S11 is bent due to the load of the first rear camera module 2081.

According to an embodiment, in order for the illustrated bent shape of the second support part S12, the second support structure 622 may be configured to extend from the first portion 61 in an "L"-shaped cross-sectional structure (e.g., a cross-sectional shape in an x-y plane). For example, a portion of the second support structure 622 between the first portion 61 and the front surface 441A of the first printed circuit board 441 may be provided in a cross-sectional shape (e.g., the "L"-shaped cross-sectional structure) substantially the same as the second support part S12 when seen in a cross section in the x-y plane. For example, a portion of the second support structure 622, which is positioned in the second opening 822 of the first printed circuit board 441, may be provided in a cross-sectional shape (e.g., the "L"-shaped cross-sectional structure) substantially the same as the second support part S12 when seen in a cross section in the x-y plane. In an arrangement operation of the first rear camera module 2081, the second support structure 622 having the bended shape may contribute to secure rigidity so as to reduce the phenomenon that the second support part S12 is bent due to the load of the first rear camera module 2081.

According to some embodiments, a portion of the first support structure 621 between the first portion 61 and the front surface 441A of the first printed circuit board 441, may be provided in a cross-sectional shape different from that of the first support part S11 when seen in a cross section in the x-y plane. In some embodiments, a portion of the first support structure 621 between the first portion 61 and the front surface 441A of the first printed circuit board 441 may be provided in a cross-sectional shape different from that of a portion of the first support structure 621, which is positioned in the first opening 821 of the first printed circuit board 441, when seen in a cross section in the x-y plane.

According to some embodiments, a portion of the second support structure 622 between the first portion 61 and the front surface 441A of the first printed circuit board 441 may be provided in a cross-sectional shape different from that of the second support part S12 when seen in a cross section in the x-y plane. In some embodiments, a portion of the second support structure 622 between the first portion 61 and the front surface 441A of the first printed circuit board 441 may be provided in a cross-sectional shape different from that of a portion of the second support structure 622, which is positioned in the second opening 822 of the first printed circuit board 441, when seen in a cross section in the x-y plane.

According to some embodiments, a portion of the first support structure 621, which is positioned in the first opening 821 of the first printed circuit board 441, may be provided in a cross-sectional shape different from that of the first support part S11 when seen in a cross section in the x-y plane. In some embodiments, a portion of the first support structure 621, which is positioned in the first opening 821 of the first printed circuit board 441, may be provided in a cross-sectional shape different from that of a portion between the first portion 61 and the front surface 441A of the first printed circuit board 441 when seen in a cross section in the x-y plane.

According to some embodiments, a portion of the second support structure 622, which is positioned in the second opening 822 of the first printed circuit board 441, may be provided in a cross-sectional shape different from that of the second support part S12 when seen in a cross section in the x-y plane. In some embodiments, a portion of the second support structure 622, which is positioned in the second opening 822 of the first printed circuit board 441, may be provided in a cross-sectional shape different from that of a portion between the first portion 61 and the front surface 441A of the first printed circuit board 441 when seen in a cross section in the x-y plane.

According to an embodiment, the first opening 821 may be provided as a through-hole having a shape corresponding to a portion of the first support structure 621, which is positioned in the first opening 821 of the first printed circuit board 441, when seen from above the rear surface 441B of the first printed circuit board 441 (e.g., when seen in the +z-axis direction). For example, the first opening 821 may be provided as an "L"-shaped through-hole when seen from above the rear surface 441B of the first printed circuit board 441. When the first opening 821 is provided in a shape corresponding to a portion of the first support structure 621, which is positioned in the first opening 821 of the first printed circuit board 441, in the arrangement operation of the first rear camera module 2081, it is possible to reduce a phenomenon that the first support part S11 is bent due to the load of the first rear camera module 2081. In some embodiments, in an arrangement operation of the first rear camera module 2081, when the first support structure 621 is implemented to be able to reduce a phenomenon in which the first support part S11 is bent due to the load of the first rear camera module 2081, the first opening 821 may be provided in a shape different from a shape corresponding to a portion of the first support structure 621, which is positioned in the first opening 821 of the first printed circuit board 441.

According to an embodiment, the second opening 822 may be provided as a through-hole having a shape corresponding to a portion of the second support structure 622, which is positioned in the second opening 822 of the first printed circuit board 441, when seen from above the rear surface 441B of the first printed circuit board 441 (e.g., when seen in the +z-axis direction). For example, the second opening 822 may be provided as an "L"-shaped through-hole when seen from above the rear surface 441B of the first printed circuit board 441. When the second opening 822 is provided in a shape corresponding to a portion of the second support structure 622, which is positioned in the second opening 822 of the first printed circuit board 441, in the arrangement operation of the first rear camera module 2081, it is possible to reduce a phenomenon that the second support part S12 is bent due to the load of the first rear camera module 2081. In some embodiments, in an arrangement operation of the first rear camera module 2081, when the second support structure 622 is implemented to be able to reduce a phenomenon in which the second support part S12 is bent due to the load of the first rear camera module 2081, the second opening 822 may be provided in a shape different from a shape corresponding to a portion of the second support structure 622, which is positioned in the second opening 822 of the first printed circuit board 441.

According to some embodiments, the first corner C1 of the first rear camera module 2081 may be provided in a curved-surface shape configured to seamlessly connect the first side surface 801 and the second side surface 802 when seen from above the second surface 2081B of the first rear camera module 2081 (e.g., when seen in the +z-axis direction). In this case, the first support part S11 may include a curved-surface shape corresponding thereto and thus be implemented.

According to some embodiments, the third corner C3 of the first rear camera module 2081 may be provided in a curved-surface shape configured to seamlessly connect the third side surface 803 and the fourth side surface 804 when seen from above the second surface 2081B of the first rear camera module 2081 (e.g., when seen in the +z-axis direction). In this case, the second support part S12 may include a curved-surface shape corresponding thereto and thus be implemented.

According to some embodiments, the one or more second portions 621 and 622 of the metal structure 6 may be configured to perform a function of electromagnetic shielding to the one or more electronic components 71, 72, 73, and 74 arranged on the front surface 441A of the first printed circuit board 441. The one or more second portions 621 and 622 may be provided in a shape which can affect electromagnetic shielding without being limited to the illustrated embodiment.

According to some embodiments, the first portion 61 of the metal structure 6 may include at least one opening. The at least one opening included in the first portion 61 may be provided so as not to substantially affect the function of electromagnetic shielding to the one or more electronic components 71, 72, 73, and 74.

Figure 10:
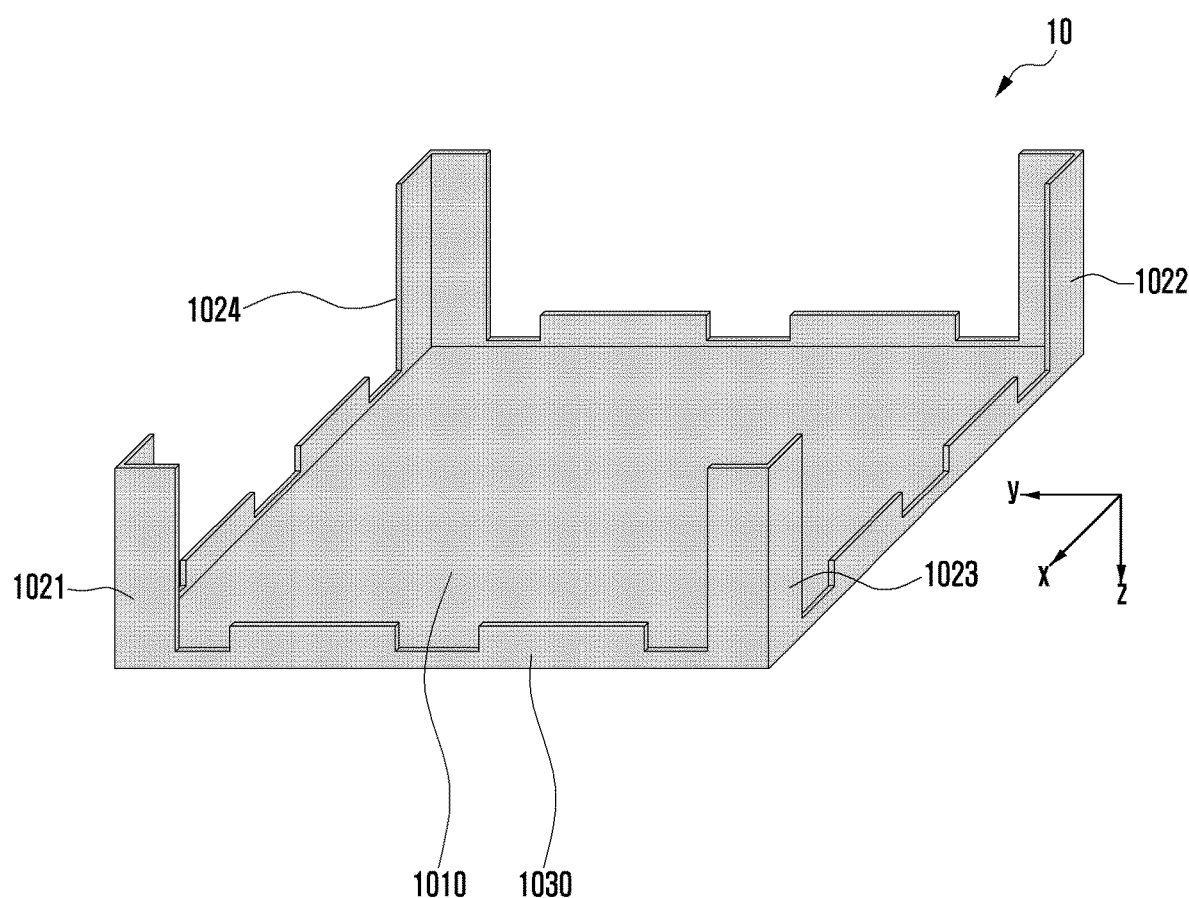
FIG. 10, 11, 12, 13, 14, 15, 16, 17, or 18 illustrate a metal structure according to another embodiment.
Figure 11:
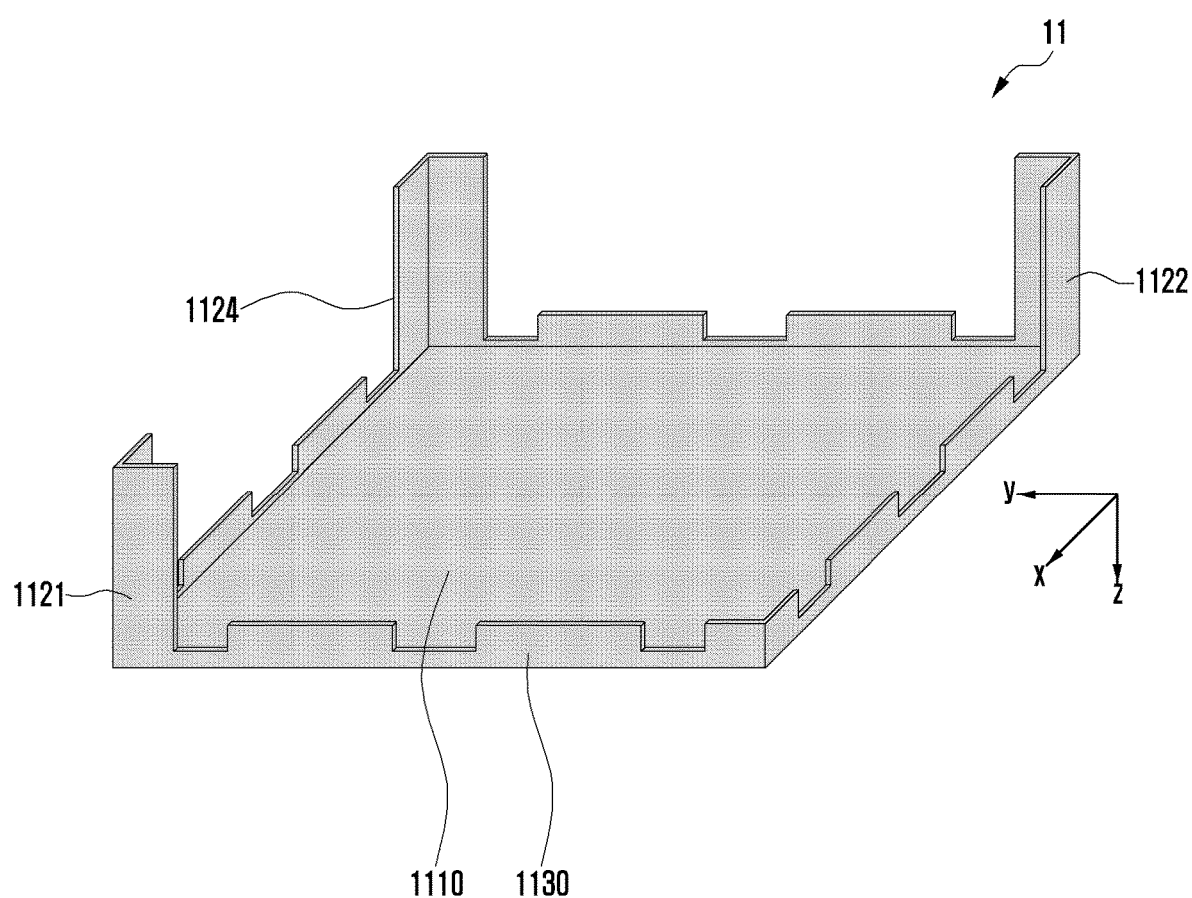

According to some embodiments, the metal structure 6 may be changed into a shape further including a third support structure configured to provide a third support part (e.g., see the dash-double dotted line indicated by reference numeral "S13" of FIG. 9) corresponding to the third corner C3 of the first rear camera module 2081. In some embodiments, the metal structure 6 of FIG. 7 may be changed into a shape further including a fourth support structure configured to provide a fourth support part (e.g., see the double-dotted line indicated by reference numeral "S14" of FIG. 9) corresponding to the fourth corner C4 of the first rear camera module 2081. The first printed circuit board 441 may further include a third opening corresponding to the third support structure, or a fourth opening corresponding to the fourth support structure. For example, FIG. 10 illustrates a metal structure 10 of another embodiment capable of providing the first support part S11, the second support part S12, the third support part S13, and the fourth support part S14. The metal structure 10 of FIG. 10 may be different from the metal structure 6 of FIG. 7 only in the shape, and may be provided in a shape which is at least partially similar or the same as the metal structure 6 of FIG. 7. In an embodiment, the metal structure 10 of FIG. 10 may include a first portion 1010 (e.g., the first portion 61 of FIG. 7), a third portion 1030 (e.g., the third portion 63 of FIG. 7), a first support structure 1021 for the first support part S11, a second support structure 1022 for the second support part S12, a third support structure 1023 for the third support part S13, and a fourth support structure 1024 for the fourth support part S14. In some embodiments, the metal structure 10 of FIG. 10 may be changed into a shape in which a part of the first support structure 1021, the second support structure 1022, the third support structure 1023, and the fourth support structure 1024 is omitted therefrom. For example, FIG. 11 illustrates a metal structure 11 of another embodiment capable of providing the first support part S11, the second support part S12, and the fourth support part S14. The metal structure 11 of FIG. 11 may be different from the metal structure 10 of FIG. 10 only in the shape, and may be provided in a shape which is at least partially similar or the same as the metal structure 10 of FIG. 10. In an embodiment, the metal structure 11 of FIG. 11 may include a first portion 1110 (e.g., the first portion 1010 of FIG. 10), a third portion 1130 (e.g., the third portion 1030 of FIG. 10), a first support structure 1121 (e.g., the first support structure 1021 of FIG. 10) for the first support part S11, a second support structure 1122 (e.g., the second support structure 1022 of FIG. 10) for the second support part S12, and a fourth support structure 1124 (e.g., the fourth support structure 1024 of FIG. 10) for the fourth support part S14. In an embodiment, at least two of the first support structure 1121, the second support structure 1122, the third support structure 1123, and the fourth support structure 1124 may be configured to extend from the first portion 1110 at the same height. In some embodiments, any two of the first support structure 1121, the second support structure 1122, the third support structure 1123, and the fourth support structure 1124 may be configured to extend from the first portion 1110 at heights that are different from each other.

Figure 12:
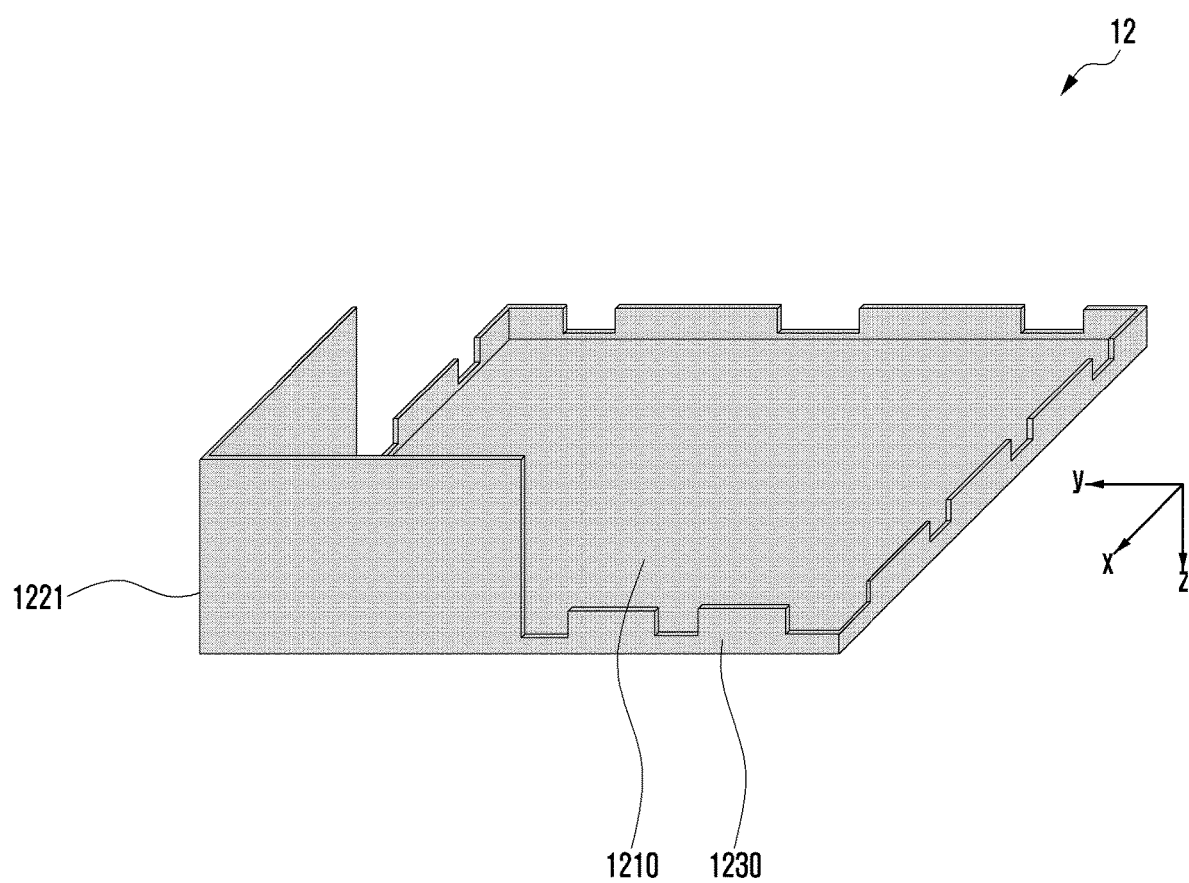

According to some embodiments, the metal structure 6 of FIG. 7 may be changed into a shape in which one of the first support structure 61 and the second support structure 62 is omitted therefrom. For example, FIG. 12 illustrates a metal structure 12 of another embodiment capable of providing a first support part having a shape different from that of the first support part S11 of FIG. 9. The metal structure 12 of FIG. 12 may be different from the metal structure 6 of FIG. 7 only in the shape, and may be provided in a shape which is at least partially similar or the same as the metal structure 6 of FIG. 7. In an embodiment, the metal structure 12 of FIG. 12 may include a first portion 1210 (e.g., the first portion 61 of FIG. 7), a third portion 1230 (e.g., the third portion 63 of FIG. 7), and a first support structure 1221 (e.g., the first support structure 621 of FIG. 7) for the first support part. For example, a portion of the first support structure 1221, which extends along the edge of the first portion 1210 in the x-axis direction, may be provided with a width greater than that of the first support structure 621 of FIG. 7. In an embodiment, a portion of the first support structure 1221, which extends along the edge of the first portion 1210 in the y-axis direction, may be provided with a width greater than that of the first support structure 621 of FIG. 7. The metal structure 12 of FIG. 12 may be configured to provide a first support part having a width greater than that of a part 901 included in the first support part S11 of FIG. 9 in the x-axis direction and/or a width greater than that of the other part 902 included in the first support part S11 of FIG. 9 in the y-axis direction. In some embodiments, the position of the support structure 1221 may be changed or the support structure 1221 may be added, to have a support part corresponding to the second corner C2, the third corner C3, or the fourth corner C4 of the first rear camera module 2081 (see FIG. 7 or 8).

Another for example, FIG. 13, 14, 15, 16, 17, or 18 illustrate a metal structure capable of providing a support part corresponding to a position different from a corner (the first corner C1, the second corner C2, the third corner C3, or the fourth corner C4 of FIG. 7 or 8) of the first rear camera module 2081.

Figure 13:
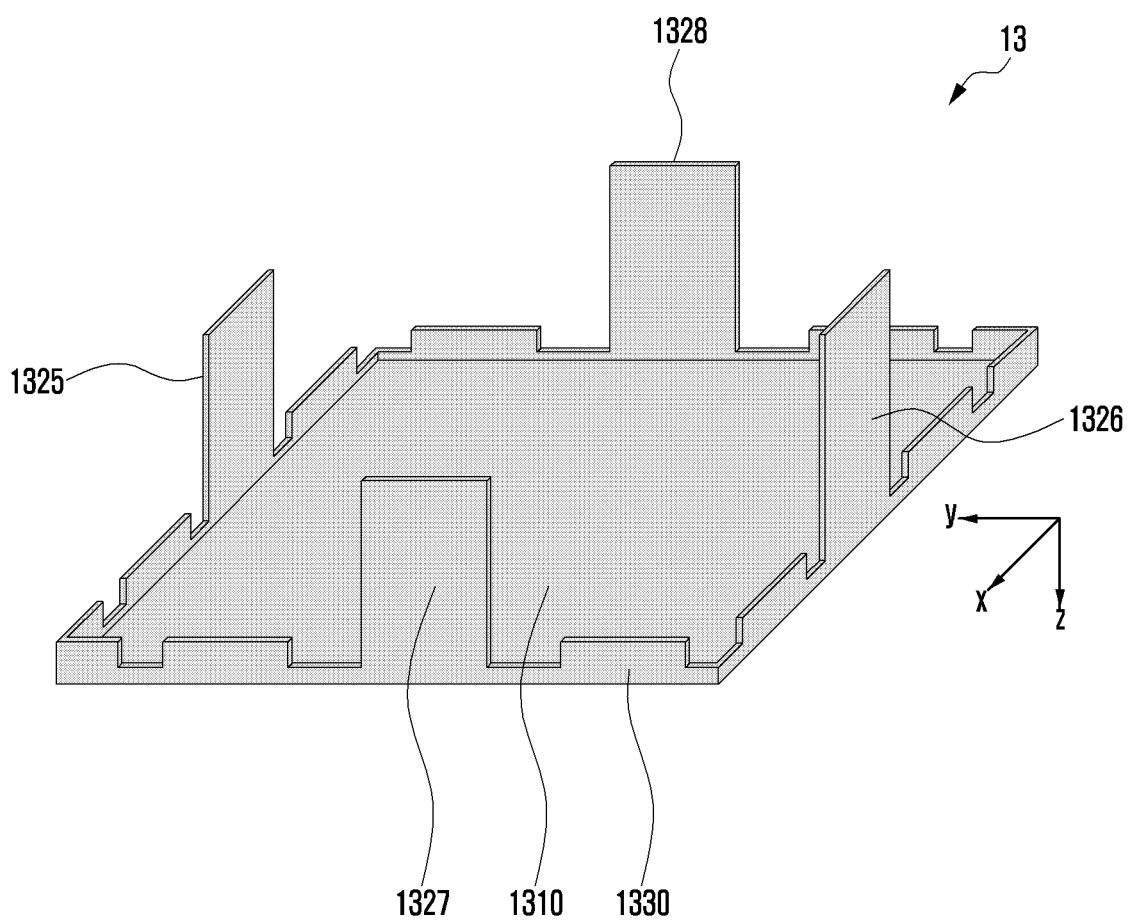

For example, FIG. 13 illustrates a metal structure 13 of another embodiment capable of providing a fifth support part corresponding to the first side surface 801 (see FIG. 7 or 8) of the first rear camera module 2081, a sixth support part corresponding to the second side surface 802 (see FIG. 7 or 8) of the first rear camera module 2081, a seventh support part corresponding to the third side surface 803 (see FIG. 7 or 8) of the first rear camera module 2081, and/or an eighth support part corresponding to the fourth side surface 804 (see FIG. 7 or 8) of the first rear camera module 2081. The metal structure 13 of FIG. 13 may be different from the metal structure 6 of FIG. 7 only in the shape, and may be provided in a shape which is at least partially similar or the same as the metal structure 6 of FIG. 7. In an embodiment, the metal structure 13 may include a first portion 1310 (e.g., the first portion 61 of FIG. 7), a third portion 1330 (e.g., the third portion 63 of FIG. 7), a fifth support structure 1325 for the fifth support part, a sixth support structure 1326 for the sixth support part, a seventh support structure 1327 for the seventh support part, and/or an eighth support structure 1328 for the eighth support part. In an embodiment, the fifth support structure 1325 and the sixth support structure 1326 may be symmetrically positioned at sides opposite to each other, and may be parallel to each other. In an embodiment, the seventh support structure 1327 and the eighth support structure 1328 may be symmetrically positioned at sides opposite to each other, and may be parallel to each other.

According to some embodiments, at least two of the fifth support structure 1325, the sixth support structure 1326, the seventh support structure 1327, and the eighth support structure 1328 may be configured to extend from the first portion 1310 at the same height. In some embodiments, any two of the fifth support structure 1325, the sixth support structure 1326, the seventh support structure 1327, and the eighth support structure 1328 may be configured to extend from the first portion 1310 at heights different from each other.

According to some embodiments, the width in which the fifth support structure 1325 extends in the x-axis direction and the width in which the sixth support structure 1326 extends in the x-axis direction may be the same. In some embodiments, the width in which the fifth support structure 1325 extends in the x-axis direction and the width in which the sixth support structure 1326 extends in the x-axis direction may be different.

According to some embodiments, the width in which the seventh support structure 1327 extends in the y-axis direction and the width in which the eighth support structure 1328 extends in the y-axis direction may be the same. In some embodiments, the width in which the seventh support structure 1327 extends in the y-axis direction and the width in which the eighth support structure 1328 extends in the y-axis direction may be different.

According to an embodiment, the fifth support structure 1325 and the sixth support structure 1326 may be configured to at least partially overlap each other when seen in the x-axis direction. In an embodiment, the seventh support structure 1327 and the eighth support structure 1328 may be configured to at least partially overlap each other when seen in the y-axis direction.

According to some embodiments, the position or number of the fifth support structure 1325, the sixth support structure 1326, the seventh support structure 1327, or the eighth support structure 1328 may not be limited to the illustrated embodiment and may be various. For example, the fifth support structure 1325, the sixth support structure 1326, the seventh support structure 1327, or the eighth support structure 1328 may be provided in plurality.

Figure 14:
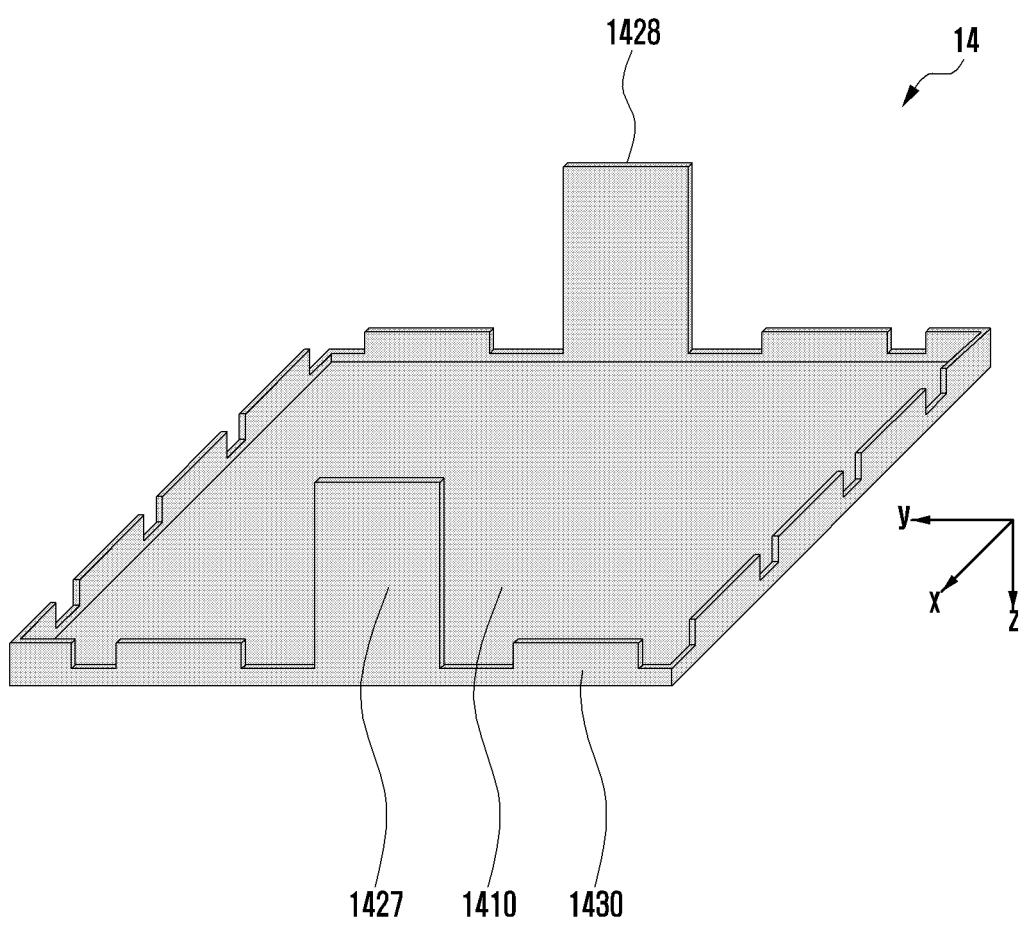

According to some embodiments, the metal structure 13 of FIG. 13 may be changed into a shape in which a part of the fifth support structure 1325, the sixth support structure 1326, the seventh support structure 1327, and the eighth support structure 1328 is omitted therefrom. For example, FIG. 14 illustrates a metal structure 14 of another embodiment capable of providing a seventh support part corresponding to the third side surface 803 (see FIG. 7 or 8) of the first rear camera module 2081 and/or an eighth support part corresponding to the fourth side surface 804 (see FIG. 7 or 8) of the first rear camera module 2081. The metal structure 14 of FIG. 14 may be different from the metal structure 13 of FIG. 13 only in the shape, and may be provided in a shape which is at least partially similar or the same as the metal structure 13 of FIG. 13. In an embodiment, the metal structure 14 of FIG. 14 may include a first portion 1410 (e.g., the first portion 1310 of FIG. 13), a third portion 1430 (e.g., the third portion 1330 of FIG. 13), a seventh support structure 1427 (e.g., the seventh support structure 1327 of FIG. 13), and an eighth support structure 1428 (e.g., the eighth support structure 1328 of FIG. 13).

Figure 15:
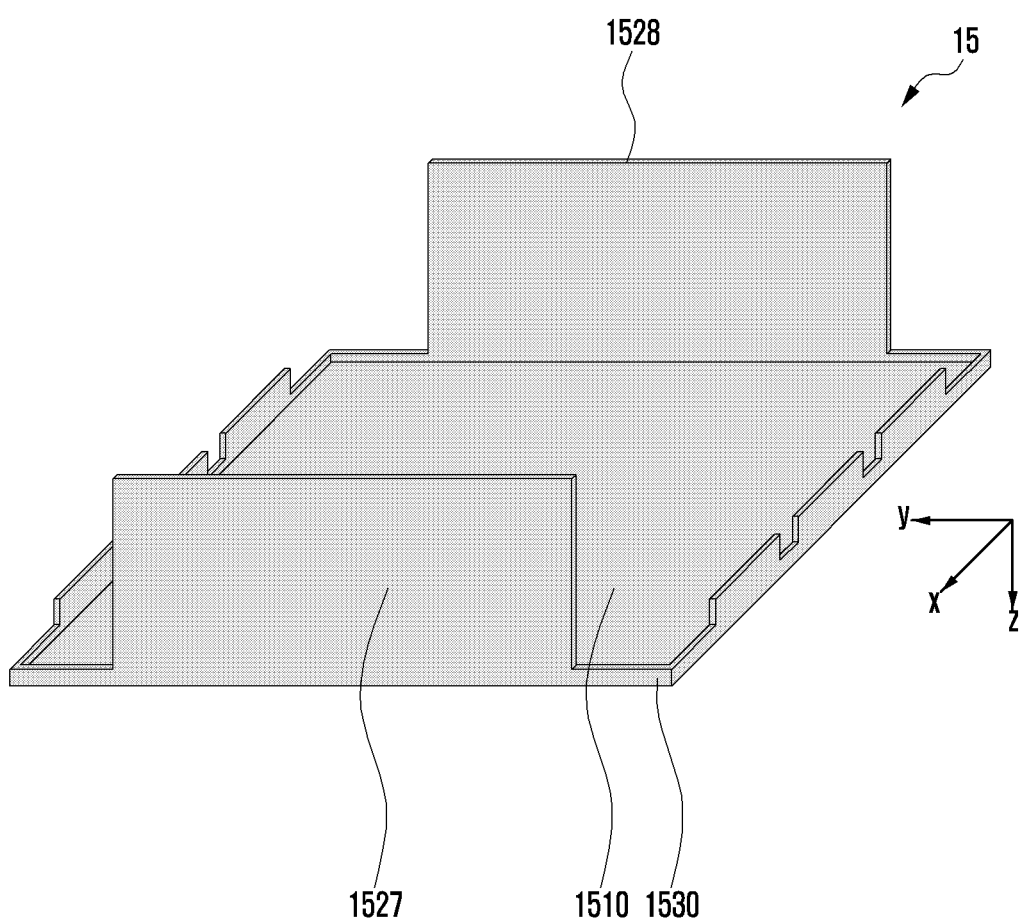

For example, FIG. 15 illustrates a metal structure 15 capable of providing a seventh support part and/or an eighth support part having a greater width in the y-axis direction, compared to the seventh support structure 1427 of FIG. 14. The metal structure 15 of FIG. 15 may be different from the metal structure 14 of FIG. 14 only in the shape, and may be provided in a shape which is at least partially similar or the same as the metal structure 14 of FIG. 14. In an embodiment, the metal structure 15 of FIG. 15 may include a first portion 1510 (e.g., the first portion 1410 of FIG. 14), a third portion 1530 (e.g., the third portion 1430 of FIG. 14), a seventh support structure 1527 which is provided with a width greater than that of the seventh support structure 1427 of FIG. 14 in the y-axis direction and is for the seventh support part, and/or an eighth support structure 1528 which is provided with a width greater than that of the eighth support structure 1428 of the FIG. 14 in the y-axis direction and is for the eighth support part. In an embodiment, the seventh support structure 1527 and the eighth support structure 1528 may be symmetrically positioned at sides opposite to each other, and may be parallel to each other. In some embodiments, the width in which the seventh support structure 1527 extends in the y-axis direction and the width in which the eighth support structure 1528 extends in the y-axis direction may be different.

Figure 16:
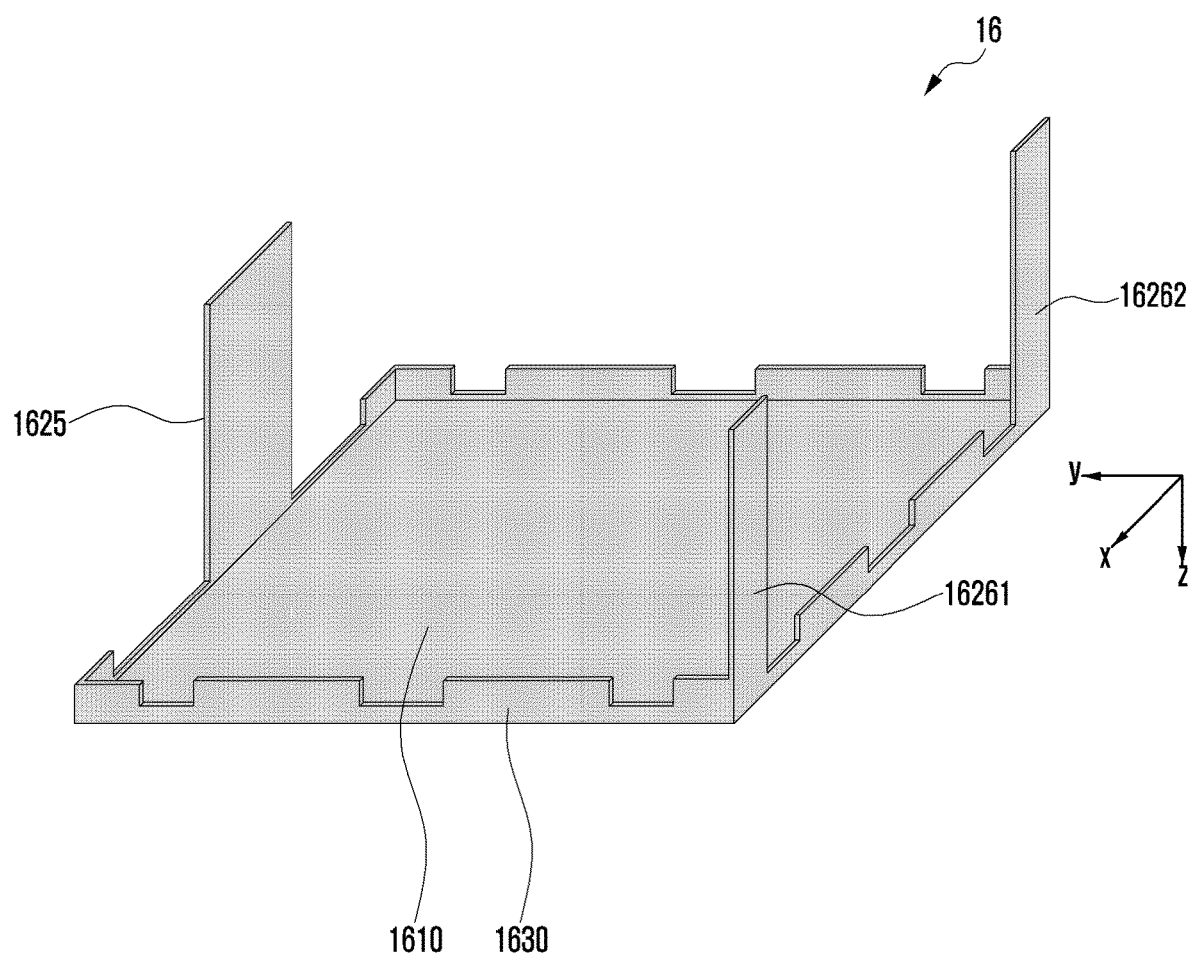

For example, FIG. 16 illustrates a metal structure 16 capable of providing a fifth support part corresponding to the first side surface 801 (see FIG. 7 or 8) of the first rear camera module 2081 and/or multiple sixth support parts corresponding to the second side surface 802 (see FIG. 7 or 8) of the first rear camera module 2081. The metal structure 16 of FIG. 16 may be different from the metal structure 13 of FIG. 13 only in the shape, and may be provided in a shape which is at least partially similar or the same as the metal structure 13 of FIG. 13. In an embodiment, the metal structure 16 of FIG. 16 may include a first portion 1610 (e.g., the first portion 1310 of FIG. 13), a third portion 1630 (e.g., the third portion 1330 of FIG. 13), a fifth support structure 1625 (e.g., the fifth support structure 1825 of FIG. 13) for a fifth support part, and/or multiple sixth support structures 16261 and 16262 for multiple sixth support parts. In an embodiment, one sixth support structure 16261 and another sixth support structure 16262 may be configured to extend from the first portion 1610 at the same height. In some embodiments, one sixth support structure 16261 and another sixth support structure 16262 may be configured to extend from the first portion 1610 at heights that are different from each other. In an embodiment, the width in which one sixth support structure 16261 extends in the x-axis direction and the width in which another sixth support structure 16262 extends in the x-axis direction may be the same. In some embodiments, the width in which one sixth support structure 16261 extends in the x-axis direction and the width in which another sixth support structure 16262 extends in the x-axis direction may be different. In some embodiments, the number of the sixth support structure may not be limited to the illustrated embodiment, and may be various.

Figure 17:
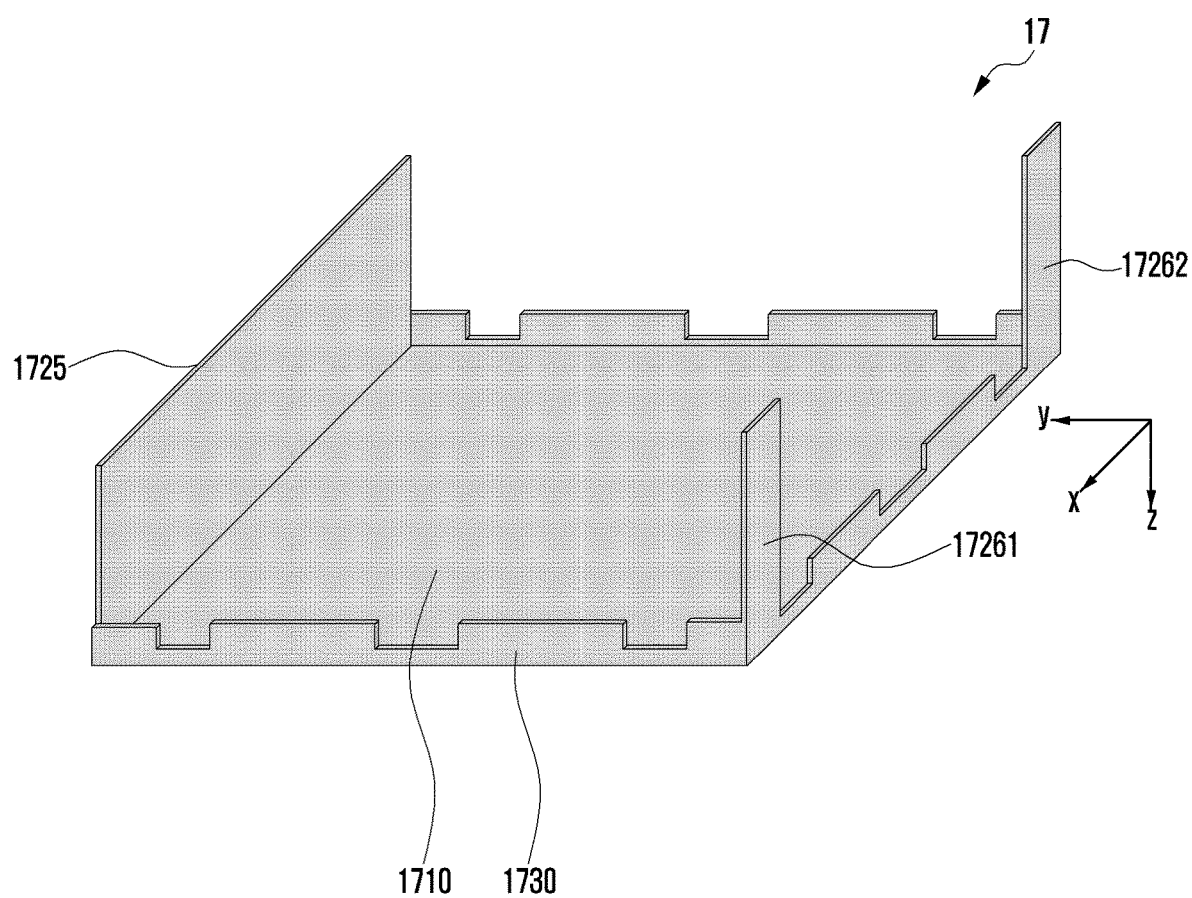
Figure 18:
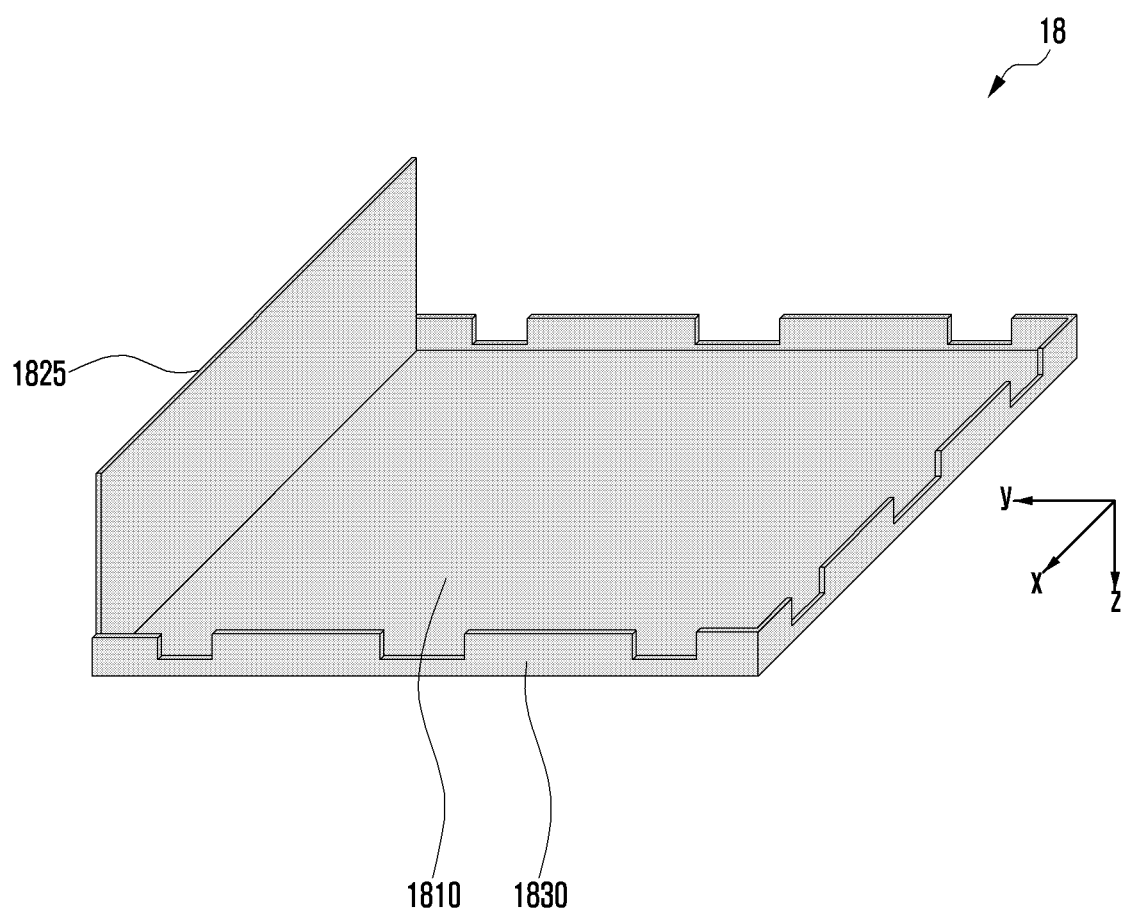

For example, FIG. 17 illustrates a metal structure 17 capable of providing a fifth support part and/or multiple sixth support parts having a greater width in the x-axis direction, compared to the metal structure 16 of FIG. 16. The metal structure 17 of FIG. 17 may be different from the metal structure 16 of FIG. 16 only in the shape, and may be provided in a shape which is at least partially similar or the same as the metal structure 16 of FIG. 16. In an embodiment, the metal structure 17 of FIG. 17 may include a first portion 1710 (e.g., the first portion 1610 of FIG. 16), a third portion 1730 (e.g., the third portion 1630 of FIG. 16), a fifth support structure 1727 which is provided with a width greater than that the fifth support structure 1625 of FIG. 16 in the x-axis direction and is for a fifth support part, and/or multiple sixth support structures 17261 and 17262 (e.g., the multiple sixth support structures 16261 and 16262 of FIG. 16) for the multiple sixth support parts. In some embodiments, the metal structure 17 of FIG. 17 may be changed into a shape in which the fifth support structure 1725 is omitted therefrom. For example, FIG. 18 illustrates a metal structure 18 capable of providing a fifth support part 1825. The metal structure 18 of FIG. 18 may be different from the metal structure 17 of FIG. 17 only in the shape, and may be provided in a shape which is at least partially similar or the same as the metal structure 17 of FIG. 17. In an embodiment, the metal structure 18 of FIG. 18 may include a first portion 1810 (e.g., the first portion 1710 of FIG. 17), a third portion 1830 (e.g., the third portion 1730 of FIG. 17), and/or a fifth support structure 1825 (e.g., the fifth support structure 1725 of FIG. 17).

According to some embodiments, a metal structure may not be limited to the embodiment of FIG. 7, 10, 11, 12, 13, 14, 15, 16, 17, or 18, and may be implemented in various other shapes including one or more support parts corresponding to the side surface 2081C of the first rear camera module 2081 (see FIG. 7).

According to some embodiments, the first rear camera module 2081 may be implemented in various other shapes which are not limited to the illustrated embodiment, and the metal structure may include one or more support parts corresponding thereto. In the embodiment of FIG. 7 or 8, the side surface 2081C of the first rear camera module 2081 does not include a curved-surface, but may not be limited thereto and may include a curved-surface. In addition, the metal structure may include a support part including a curved-surface corresponding thereto. In the embodiment of FIG. 7 or 8, the side surface 2081C of the first rear camera module 2081 includes a corner (e.g., the first corner C1, the second corner C2, the third corner C3, or fourth corner C4) at which two surfaces orthogonal to each other are connected to each other, but may not be limited thereto. In addition, the side surface 2081C may include a corner at which two surfaces connected at an angle other than 90 degrees are connected to each other, and the metal structure may include a support part having a bent shape corresponding thereto.

Figure 19:
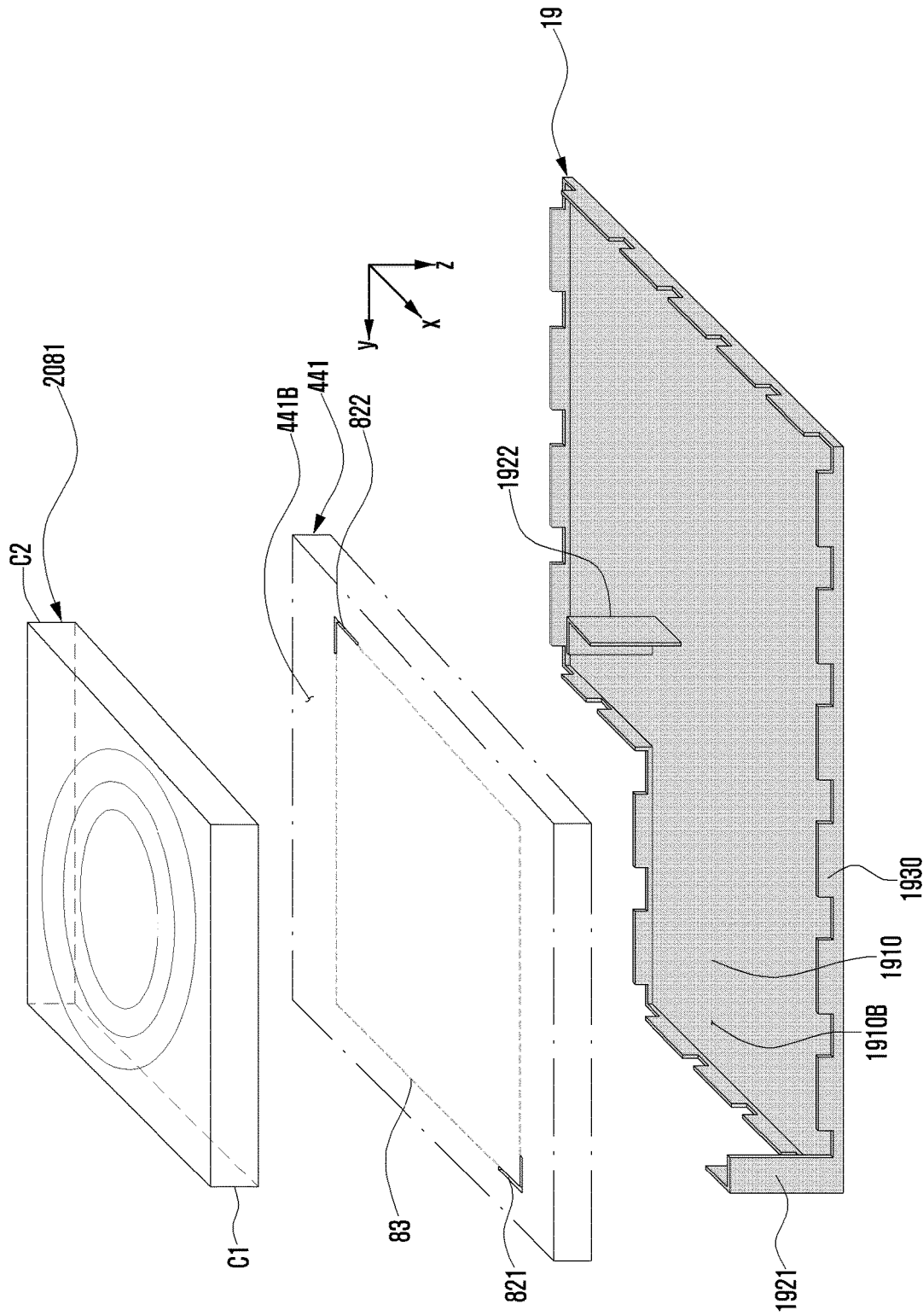
FIG. 19, in another embodiment, shows a state where a first printed circuit board, a metal structure, and a first rear camera module are separated from each other.

FIG. 19, in another embodiment, shows a state where a first printed circuit board 441, a metal structure 19, and a first rear camera module 2081 are separated from one another.

Referring to FIG. 19, a metal structure 19 may be different from the metal structure 6 of FIG. 7 only in the shape, and may be provided in a shape which is at least partially similar or the same as the metal structure 6 of FIG. 7. In an embodiment, the metal structure 19 may include a first portion 1910 (e.g., the first portion 61 of FIG. 7), a third portion 1930 (e.g., the third portion 63 of FIG. 7), a first support structure 1921 (e.g., the first support structure 621 of FIG. 7), and/or a second support structure 1922 (e.g., the second support structure 622 of FIG. 7). The first portion 1910 may be provided in a shape expanded more than that of the first portion 61 of FIG. 7 when seen from above the first printed circuit board 441 (e.g., when seen in the z-axis direction). The first portion 1910 may be configured to cover a greater area of the front surface of the first printed circuit board 441 (e.g., the front surface 441A of FIG. 6), in which one or more electronic components are arranged, compared with the embodiment of FIG. 7. In an embodiment, the first support structure 1921 may be positioned on the edge of the first portion 61, and may be provided in a bent shape to correspond to the first corner C1 of the first rear camera module 2081. For example, the first support structure 1921 may be positioned through the first opening 821 of the first printed circuit board 441, and may be configured to provide a first support part (e.g., the first support part S11 of FIG. 9) corresponding to the first corner C1 of the first rear camera module 2081. In an embodiment, the second support structure 1922 may be configured to extend from one surface 1910B (e.g., the one surface 61A of FIG. 7) of the first portion 1910, which faces the front surface 441A (see FIG. 6) of the first printed circuit board 441. The second support structure 1922 may be provided in a bent shape corresponding to the second corner C2 of the first rear camera module 2081. For example, the second support structure 1922 may be positioned through the second opening 822 of the first printed circuit board 441, and may be configured to provide a second support part (e.g., the second support part S12 of FIG. 9) corresponding to the second corner C2 of the first rear camera module 2081. In an arrangement operation of the first rear camera module 2081, when the first rear camera module 2081 is moved toward the camera module arrangement area 83 of the first printed circuit board 441 in the +z-axis direction, the first support part S41 and the second support part S42 may be configured to support the first rear camera module 2081 and thus to reduce distortion (or tilting) thereof in the z-axis direction, so that the first rear camera module 2081 is moved.

According to some embodiments, due to the expansion of the first portion 1910, it may be difficult for the first support structure 1921 corresponding to the first opening 821 of the first printed circuit board 441 to extend vertically from the edge of the first portion 1910. In this case, the first support structure 1921 may be configured to extend from one surface 1910B (e.g., the one surface 61A of FIG. 7) of the first portion 1910, which faces the front surface 441A (see FIG. 6) of the first printed circuit board 441, in substantially the same shape as the second support structure 1922.

According to some embodiments, the metal structure 19 may be changed into at least one support structure according to the embodiment of FIG. 10, the support structure according to the embodiment of FIG. 12, at least one support structure according to the embodiment of FIG. 13, at least one support structure according to the embodiment of FIG. 15, at least one support structure according to the embodiment of FIG. 16, or at least one support structure according to the embodiment of FIG. 17, or a shape including a combination of two or more of the support structures. At least one support structure included in the metal structure 19 may be configured to extend from one surface 1910B of the first portion 1910, which faces the front surface 441A (see FIG. 6) of the first printed circuit board 441. The first printed circuit board 441 may include one or more openings corresponding to the changed metal structure 19.

Figure 20:
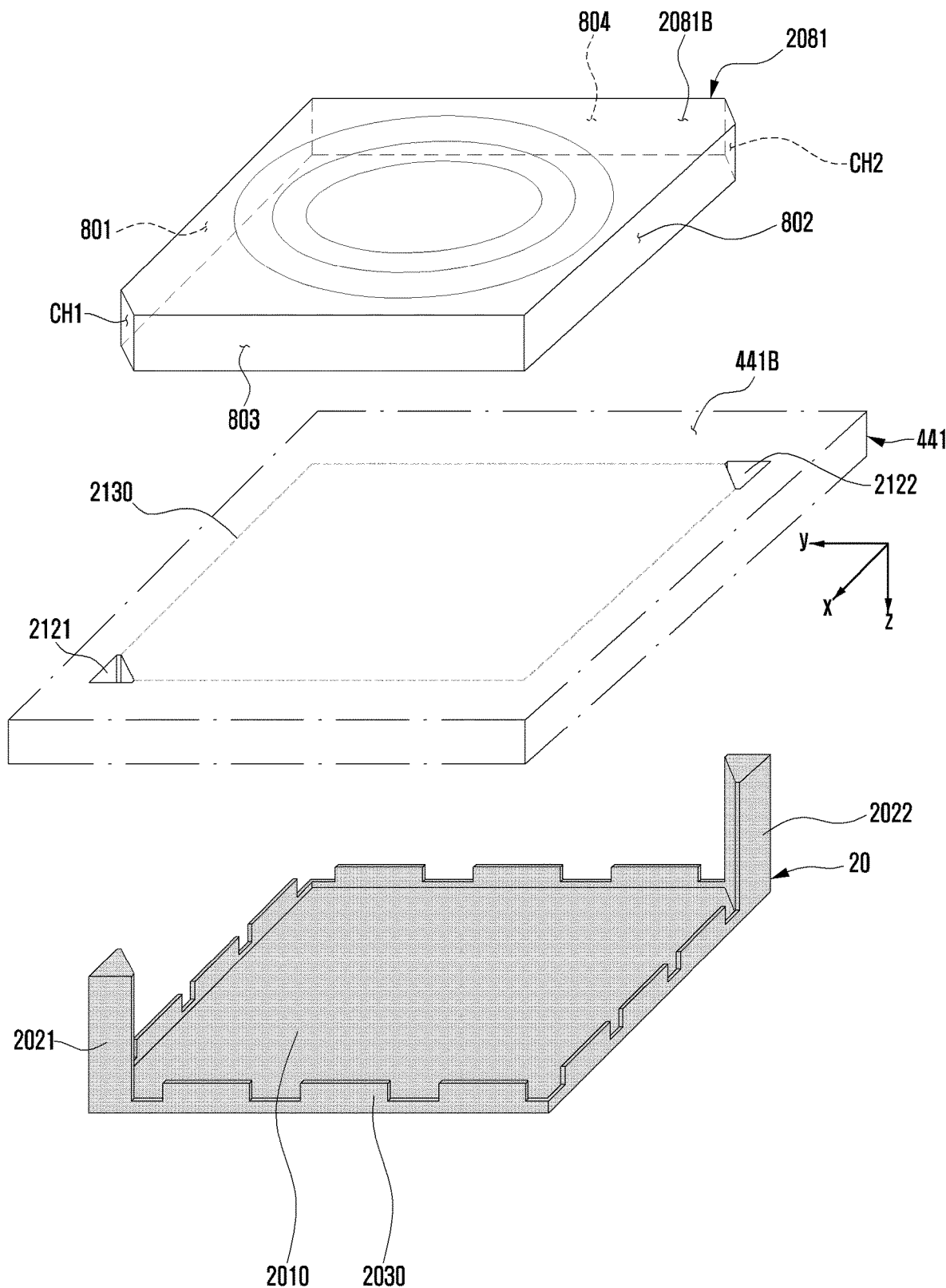
FIG. 20, in another embodiment, shows a state where a first printed circuit board, a metal structure, and a first rear camera module are separated from one another.
Figure 21:
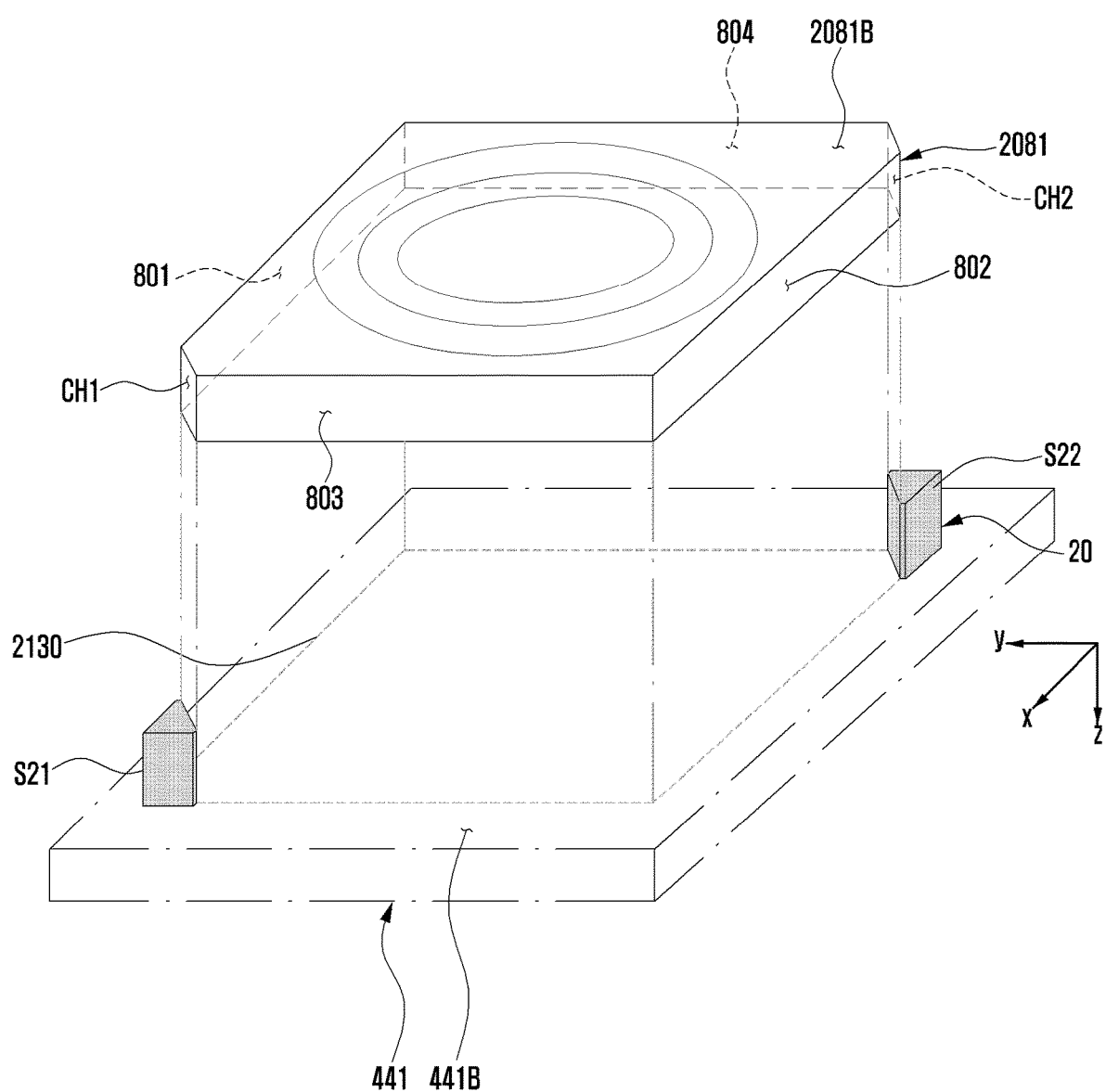
FIG. 21, in an embodiment, shows a state where a metal structure is coupled to a first printed circuit board, and a first rear camera module is separated from the first printed circuit board.
Figure 22:
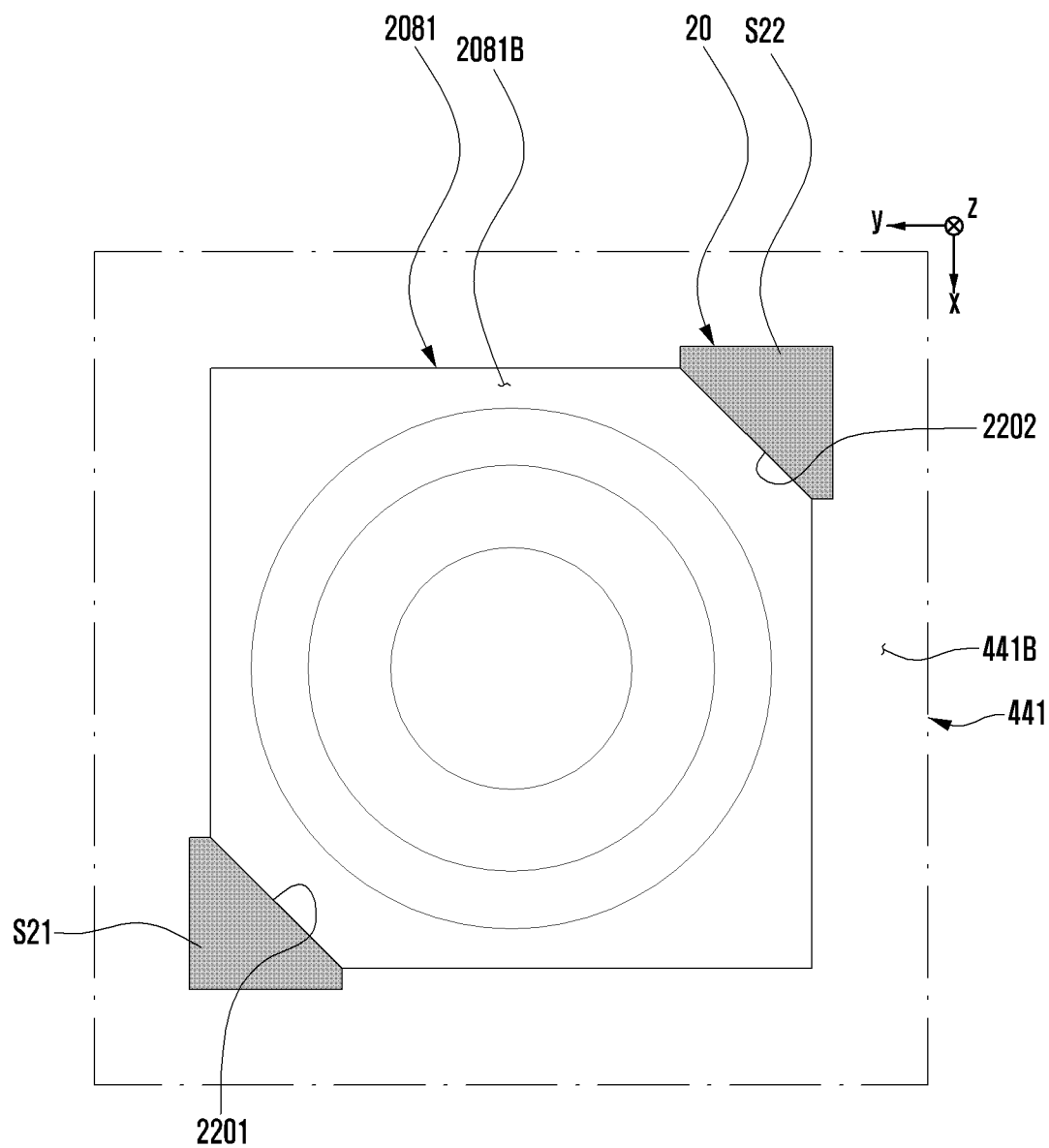
FIG. 22, in an embodiment, is an x-y plan view of a state where a first printed circuit board, a metal structure, and a first rear camera module are coupled.

FIG. 20, in another embodiment, shows a state where a first printed circuit board 441, a metal structure 20, and a first rear camera module 2081 are separated from one another. FIG. 21, in an embodiment, shows a state where a metal structure 20 is coupled to a first printed circuit board 441, and a first rear camera module 2081 is separated from the first printed circuit board 441. FIG. 22, in an embodiment, is an x-y plan view of a state where a first printed circuit board 441, a metal structure 20, and a first rear camera module 2081 are coupled.

Referring to FIGS. 20, 21, and 22, in an embodiment, the first rear camera module 2081 may include a first chamfer CH1 provided at the corner at which the first side surface 801 and third side surface 803 are connected, and a second chamfer CH2 provided at the corner at which the second side surface 802 and fourth side surface 804 are connected. The first chamfer CH1 may form a side surface having an inclined surface shape, which is configured to connect the first side surface 801 and the third side surface 803. The second chamfer CH2 may form a side surface having an inclined surface shape, which is configured to connect the second side surface 802 and the fourth side surface 804. In some embodiments, the first chamfer CH1 may be referred to as a first truncated corner, and the second chamfer CH2 may be referred to as a second truncated corner.

According to an embodiment, the metal structure 20 may be different from the metal structure 6 of FIG. 7 only in the shape, and may be provided in a shape which is at least partially similar or the same as the metal structure 6 of FIG. 7. For example, the metal structure 20 may include a first portion 2010 (e.g., the first portion 61 of FIG. 7), a third portion 2030 (e.g., the third portion 63 of FIG. 7), a first support structure 2021, and/or a second support structure 2022. In an embodiment, the first support structure 2021 may be configured to extend from the first portion 2010 and may be positioned through a first opening 2121 of the first printed circuit board 441. The first support structure 2021 may be provided in a shape including a surface 2201 (e.g., an inclined surface) (see FIG. 22) which can face the first chamfer CH1 of the first rear camera module 2081. In an embodiment, the second support structure 2022 may be configured to extend from the first portion 2010 and may be positioned through a second opening 2122 of the first printed circuit board 441. The second support structure 2022 may be provided in a shape including a surface 2202 (e.g., an inclined surface) (see FIG. 22) which can face the second chamfer CH2 of the first rear camera module 2081. For example, the first opening 2121 may be provided in a through-hole shape corresponding to the cross-sectional shape in the x-y plane of the first support structure 2021. For example, the second opening 2122 may be provided in a through-hole shape corresponding to the cross-sectional shape in the x-y plane of the second support structure 2022. A portion (e.g., the first support part S21) of the first support structure 2021, which protrudes with respect to the rear surface 441B of the first printed circuit board 441, and a portion (e.g., the second support part S22) of the second support structure 2022, which protrudes with respect to the rear surface 441B of the first printed circuit board 441, may be configured to guide the arrangement position of the first rear camera module 2081 when the first rear camera module 2081 is disposed on the rear surface 441B of the first printed circuit board 441. In an arrangement operation of the first rear camera module 2081, when the first rear camera module 2081 is moved toward a designated area 2130 (e.g., the camera module arrangement area 83 of FIG. 7 or 8) of the first printed circuit board 441 in the +z-axis direction, the first support part S21 and the second support part S22 may be configured to support the first rear camera module 2081 and thus to reduce distortion (or tilting) thereof in the z-axis direction, so that the first rear camera module 2081 is moved.

According to some embodiments, the first rear camera module 2081 may further include a third chamfer (not shown) provided at a corner at which the second side surface 802 and the third side surface 803 are connected. The metal structure 20 may further include a third support structure (not shown) configured to extend from the first portion 2010 to correspond to the third chamfer. The third support structure may be positioned through the third opening (not shown) of the first printed circuit board 441, and may be configured to provide a third support part (not shown) corresponding to the third chamfer of the first rear camera module 2081.

According to some embodiments, the first rear camera module 2081 may further include a fourth chamfer (not shown) provided at a corner at which the first side surface 801 and the fourth side surface 804 are connected. The metal structure 20 may further include a fourth support structure (not shown) configured to extend from the first portion 2010 to correspond to the fourth chamfer. The fourth support structure may be positioned through the fourth opening (not shown) of the first printed circuit board 441, and may be configured to provide a fourth support part (not shown) corresponding to the fourth chamfer of the first rear camera module 2081.

According to some embodiments, one of first support structure 2021 and the second support structure 2022 of the metal structure 20 may be omitted therefrom. For example, when the first support structure 2021 is omitted, the first opening 2121 of the first printed circuit board 441 and the first chamfer CH1 of the first rear camera module 2081 may be omitted. For example, when the second support structure 2022 is omitted, the second opening 2122 of the first printed circuit board 441 and the second chamfer CH2 of the first rear camera module 2081 may be omitted.

According to some embodiments, the first rear camera module 2081 may include at least one notch (not shown) provided on a side surface (e.g., the first side surface 801, the second side surface 802, the third side surface 803, or the fourth side surface 804). For example, when seen from above the second surface 2081B of the first rear camera module 2081 (e.g., when seen in the +z-axis direction), the notch may form a recessed portion on the side surface. A metal structure (not shown) according to another embodiment may include at least one fifth support structure (not shown) configured to extend from the first portion to correspond to the at least one notch. The at least one fifth support structure may be positioned through the fifth opening (not shown) of the first printed circuit board 441, and may be configured to provide at least one fifth support part (not shown) corresponding to the notch of the first rear camera module 2081.

According to some embodiments, the metal structure 20 may be changed into a shape further including some support structures according to the embodiment of FIG. 10, the support structure according to the embodiment of FIG. 12, at least one support structure according to the embodiment of FIG. 13, at least one support structure according to the embodiment of FIG. 15, at least one support structure according to the embodiment of FIG. 16, or at least one support structure according to the embodiment of FIG. 17. The first printed circuit board 441 may include multiple openings corresponding to the changed metal structure 20.

Figure 23:
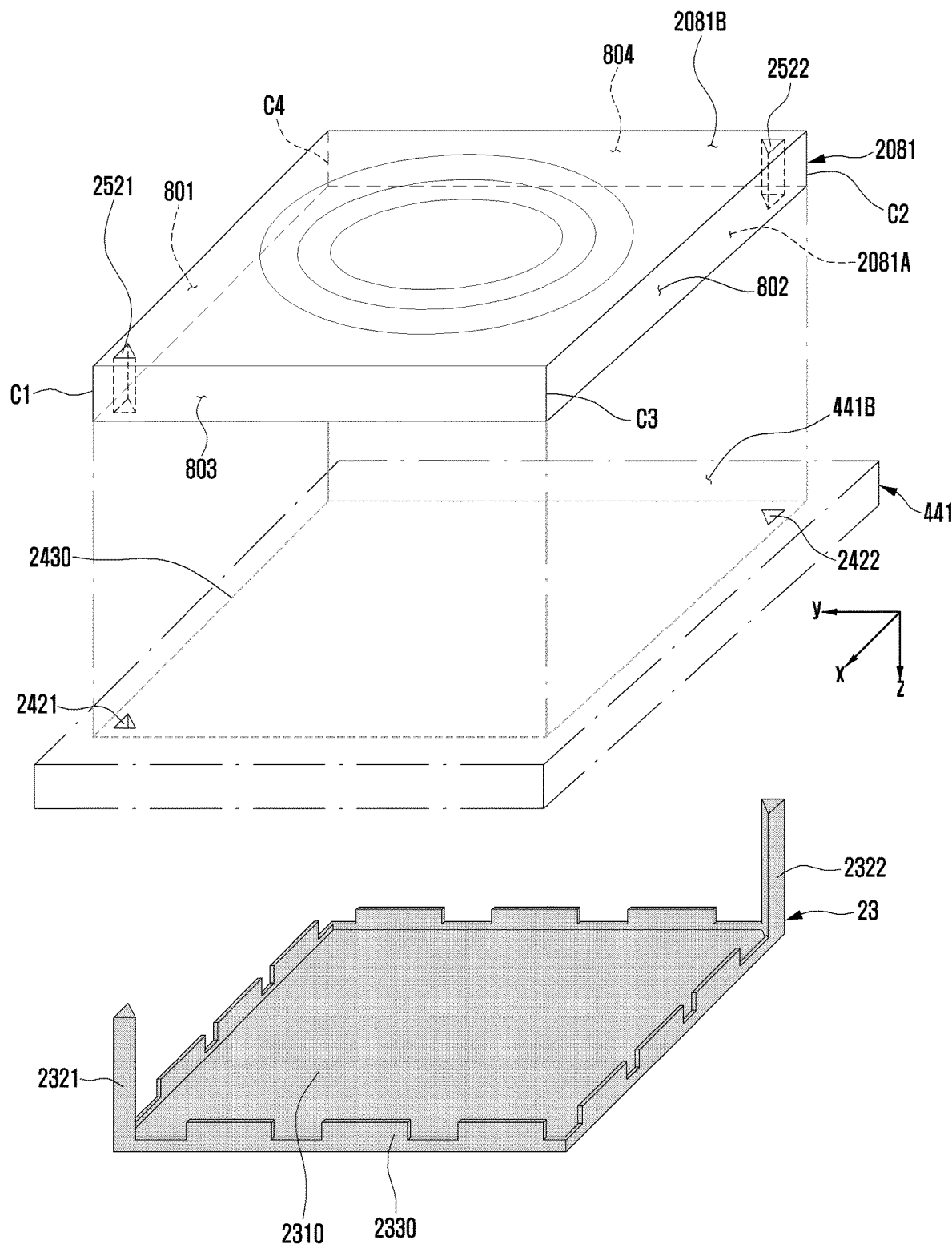
FIG. 23, in another embodiment, shows a state where a first printed circuit board, a metal structure, and a first rear camera module are separated from one another.
Figure 24:
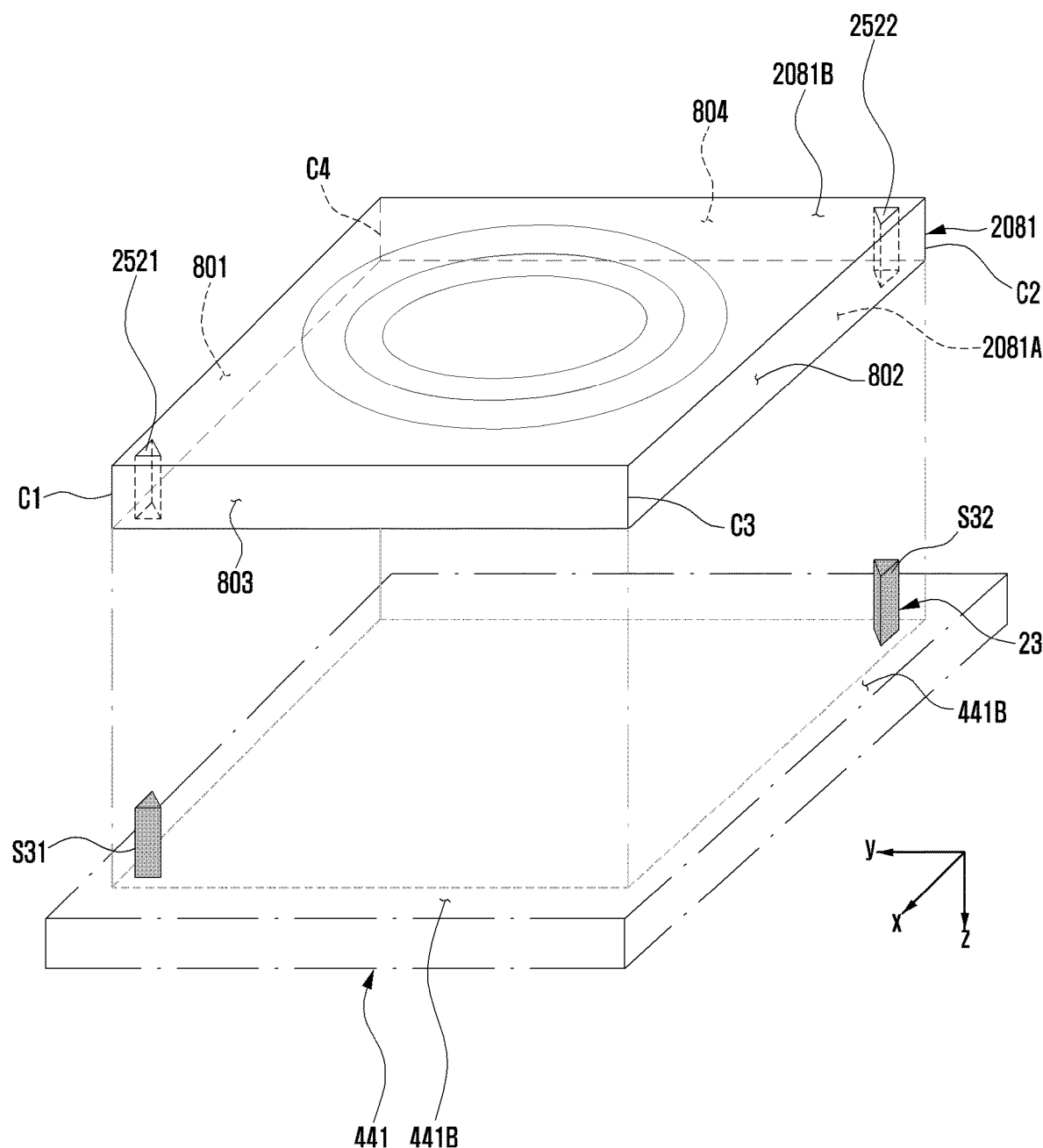
FIG. 24, in an embodiment, shows a state where a metal structure is coupled to a first printed circuit board, and a first rear camera module is separated from the first printed circuit board.
Figure 25:
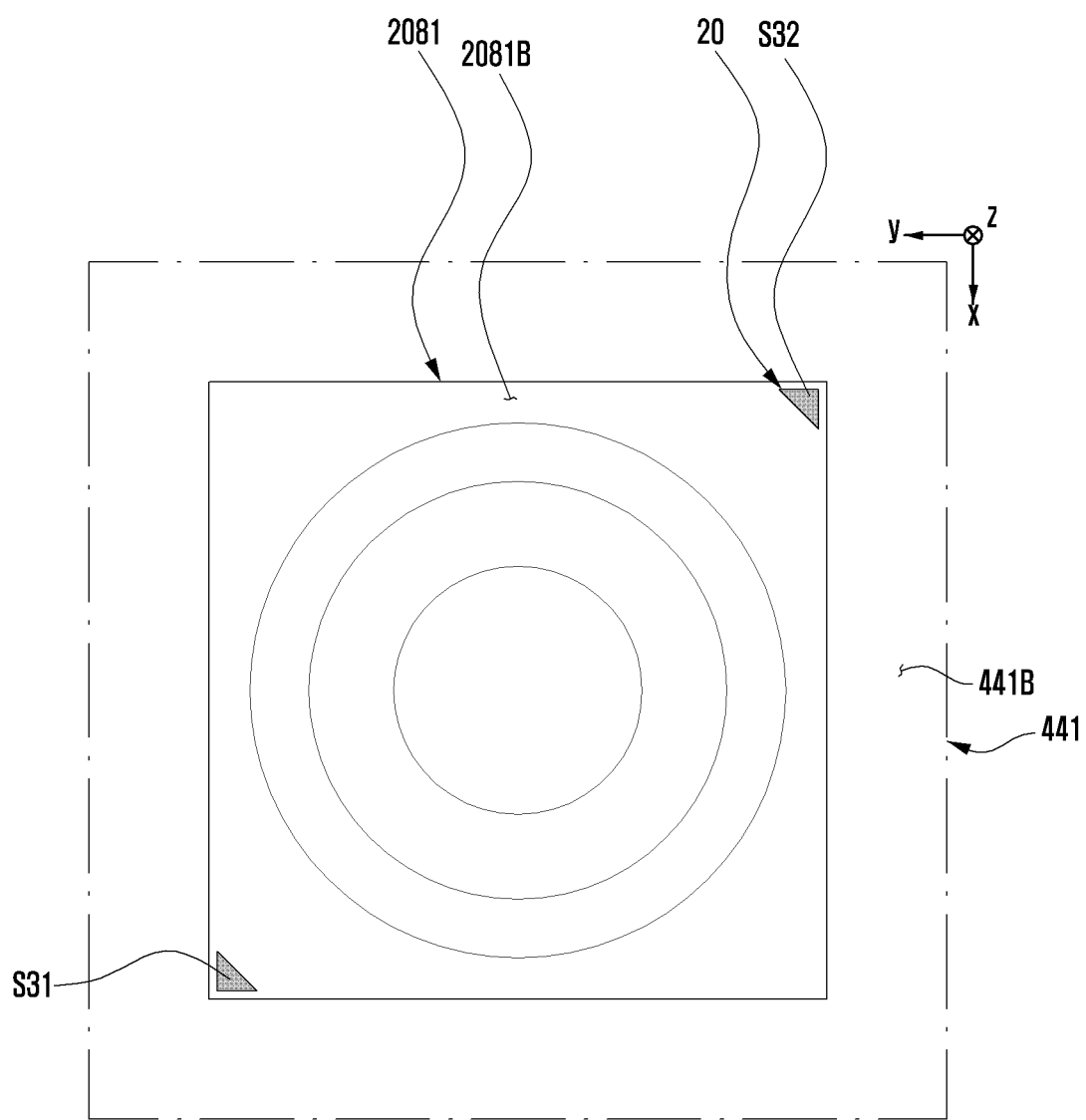
FIG. 25, in an embodiment, is an x-y plan view of a state where a first printed circuit board, a metal structure, and a first rear camera module are coupled.

FIG. 23, in another embodiment, shows a state where a first printed circuit board 441, a metal structure 23, and a first rear camera module 2081 are separated from one another. FIG. 24, in an embodiment, shows a state where a metal structure 23 is coupled to a first printed circuit board 441, and a first rear camera module 2081 is separated from the first printed circuit board 441. FIG. 25, in an embodiment, is an x-y plan view of a state where a first printed circuit board 441, a metal structure 23, and a first rear camera module 2081 are coupled.

Referring to FIGS. 23, 24, and 25, in an embodiment, the first rear camera module 2081 may include a third opening 2521 provided adjacent to the first corner C1 at which the first side surface 801 and the third side surface 803 are connected. The first rear camera module 2081 may include a fourth opening 2522 provided adjacent to the second corner C2 at which the second side surface 802 and the fourth side surface 804 are connected.

According to an embodiment, the metal structure 23 may be different from the metal structure 6 of FIG. 7 only in the shape, and may be provided in a shape which is at least partially similar or the same as the metal structure 6 of FIG. 7. For example, the metal structure 23 may include a first portion 2310 (e.g., the first portion 61 of FIG. 7), a third portion 2330 (e.g., the third portion 63 of FIG. 7), a first support structure 2321, and/or a second support structure 2322. In an embodiment, the first support structure 2321 may be configured to extend from the first portion 2310 and may be positioned through a first opening 2421 of the first printed circuit board 441. In an embodiment, the second support structure 2322 may be configured to extend from the first portion 2310 and may be positioned through a second opening 2422 of the first printed circuit board 441. For example, the first opening 2421 may be provided in a through-hole shape corresponding to the cross-sectional shape in the x-y plane of the first support structure 2321. For example, the second opening 2422 may be provided in a through-hole shape corresponding to the cross-sectional shape in the x-y plane of the second support structure 2322. A portion (e.g., the first support part S31) of the first support structure 2321, which protrudes with respect to the rear surface 441B of the first printed circuit board 441, and a portion (e.g., the second support part S32) of the second support structure 2022, which protrudes with respect to the rear surface 441B of the first printed circuit board 441, may be configured to guide the arrangement position of the first rear camera module 2081 when the first rear camera module 2081 is disposed on the rear surface 441B of the first printed circuit board 441. For example, the first support part S31 may be inserted into the third opening 2521 of the first rear camera module 2081, and the second support part S32 may be inserted into the fourth opening 2522 of the first rear camera module 2081. For example, the third opening 2521 may be provided in a through-hole shape corresponding to the cross-sectional shape in the x-y plane of the first support structure 2321. For example, the fourth opening 2522 may be provided in a through-hole shape corresponding to the cross-sectional shape in the x-y plane of the second support structure 2322. In an arrangement operation of the first rear camera module 2081, when the first rear camera module 2081 is moved toward a designated area 2430 (e.g., the camera module arrangement area 83 of FIG. 7 or 8) of the first printed circuit board 441 in the +z-axis direction, the first support part S31 and the second support part S32 may be configured to support the first rear camera module 2081 and thus to reduce distortion (or tilting) thereof in the z-axis direction, so that the first rear camera module 2081 is moved.

According to some embodiments, the third opening 2521 or the fourth opening 2522 of the first rear camera module 2081 may be replaced with a recess (not shown) provided on the first surface 2081A of the first rear camera module 2081. For example, the recess may be a hole structure of a recessed shape on the first surface 2081A.

According to some embodiments, the position or number of openings provided through the first rear camera module 2081 may be limited to the illustrated embodiment, and may be various. In addition, the metal structure 23 may include one or more support structures corresponding thereto. For example, the first rear camera module 2081 may include an opening (not shown) provided adjacent to the third corner C3 at which the second side surface 802 and the third side surface 803 are connected, and the metal structure 23 may include a third support structure (not shown) corresponding thereto. The third support structure may be positioned through an opening (not shown) of the first printed circuit board 441, and may be configured to provide a third support part configured to guide the arrangement position of first rear camera module 2081. For example, the first rear camera module 2081 may include an opening (not shown) provided adjacent to the fourth corner C4 at which the first side surface 801 and the fourth side surface 804 are connected, and the metal structure 23 may include a fourth support structure (not shown) corresponding thereto. The fourth support structure may be positioned through an opening (not shown) of the first printed circuit board 441, and may be configured to provide a fourth support part configured to guide the arrangement position of first rear camera module 2081.

According to some embodiments (not shown), the first rear camera module 2081 may include an opening provided adjacent to the first side surface 801 between the first corner C1 and the fourth corner C4, an opening provided adjacent to the second side surface 802 between the second corner C2 and the third corner C3, an opening provided adjacent to the third side surface 803 between the first corner C1 and the third corner C3, or an opening provided adjacent to the fourth side surface 804 between the second corner C2 and the fourth corner C4. A metal structure according to another embodiment may include a fifth support structure (not shown) corresponding thereto. The fifth support structure may be positioned through an opening (not shown) of the first printed circuit board 441, and may be configured to provide a fifth support part configured to guide the arrangement position of first rear camera module 2081.

According to some embodiments, one of first support structure 2021 and the second support structure 2022 of the metal structure 20 may be omitted therefrom. For example, when the first support structure 2021 is omitted, the first opening 2121 of the first printed circuit board 441 and the first chamfer CH1 of the first rear camera module 2081 may be omitted. For example, when the second support structure 2022 is omitted, the second opening 2122 of the first printed circuit board 441 and the second chamfer CH2 of the first rear camera module 2081 may be omitted.

According to some embodiments, the metal structure 23 may be changed into a shape further including some support structures according to the embodiment of FIG. 10, the support structure according to the embodiment of FIG. 12, at least one support structure according to the embodiment of FIG. 13, at least one support structure according to the embodiment of FIG. 15, at least one support structure according to the embodiment of FIG. 16, or at least one support structure according to the embodiment of FIG. 17. The first printed circuit board 441 may include multiple openings corresponding to the changed metal structure 23.

Figure 26:
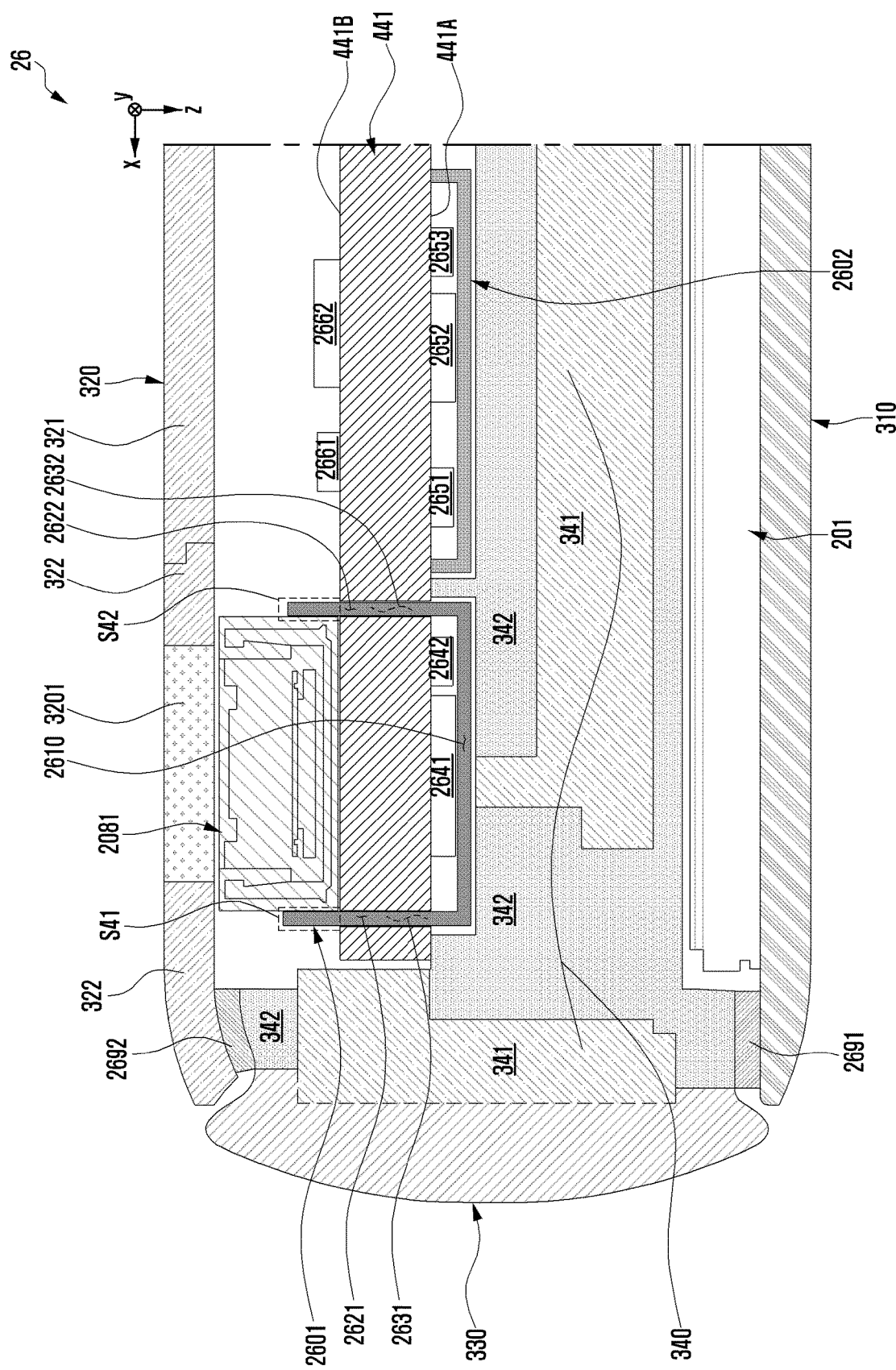
FIG. 26, in an embodiment, illustrates a cross-sectional structure in the x-z plane of a part of the electronic device taken along line D-D' of FIG. 3.

FIG. 26, in an embodiment, illustrates a cross-sectional structure 26 in the x-z plane of a part of the electronic device 200 taken along line D-D' of FIG. 3.

Referring to FIG. 26, in an embodiment, a cross-sectional structure 26 may include a bezel structure 330, a first support member 340, a front plate 310, a rear plate 320, a display 201, a first printed circuit board 441, a first rear camera module 2081, a first metal structure 2601, and/or second metal structure 2602.

According to an embodiment, the front plate 310 may be coupled to the first support member 340 by using a first adhesive member 2691, and the rear plate 320 may be coupled to the first support member 340 by using a second adhesive member 2692. The first adhesive member 2691 (e.g., a double-sided tape) may be positioned between the front plate 310 and the first support member 340 to be adjacent to the edge of the front plate 310. The second adhesive member 2692 (e.g., a double-sided tape) may be positioned between the rear plate 320 and the first support member 340 to be adjacent to the edge of the rear plate 320. The display 201 may be positioned between the first support member 340 and the front plate 310. The first printed circuit board 441 may be positioned between the first support member 340 and the rear plate 320. For example, the first support member 340 may include a conductive structure 341 (hereinafter, an inner conductive structure) including a metal material, and a non-conductive structure 342 including a non-metal material. A conductive structure (e.g., an outer conductive structure) made of a metal material, which is included in the bezel structure 330, and the inner conductive structure 341 of the first support member 340 may be connected or may be integrally provided, and may include the same metal material.

According to an embodiment, the first printed circuit board 441 may include the front surface 441A configured to face the front plate 310 and the rear surface 441B configured to face the rear plate 320. The front surface 441A of the first printed circuit board 441 may be configured to face the first support member 340. In an embodiment, the first rear camera module 2081 may be disposed on the rear surface 441B of the first printed circuit board 441. The first rear camera module 2081 may be positioned between the first printed circuit board 441 and the rear plate 320. In an embodiment, the rear plate 320 may include a first rear plate 321 and a second rear plate 322, and the first rear camera module 2081 may be positioned between the second rear plate 322 and the first printed circuit board 441. The second rear plate 322 may include a first light-transmitting area 3201 provided to correspond to the first rear camera module 2081. External light may pass through the first light-transmitting area 3201 and thus may reach the first rear camera module 2081. Other multiple electronic components 2641, 2642, 2651, 2652, and 2653 may be arranged on the front surface 441A of the first printed circuit board 441 between the first printed circuit board 441 and the first support member 340. Other multiple electronic components 2661 and 2662 may be arranged on the rear surface 441B of the first printed circuit board 441 between the first printed circuit board 441 and the rear support member 320.

According to an embodiment, the first metal structure 2601 may be provided in a shape which is at least partially similar to or the same as the metal structure 6 of FIG. 7, and the shape thereof may be various. For example, the first metal structure 2601 may include a first portion 2610 (e.g., the first portion 61 of FIG. 7) and one or more second portions 2621 and 2622 (e.g., the one or more second portions 621 and 622 of FIG. 7). The first portion 2610 may be positioned between the first printed circuit board 441 and the first support member 340. For example, the first portion 2610 may include a plate configured to be substantially parallel to the front surface 441A of the first printed circuit board 441. The shape of the first portion 2610 may not be limited thereto and may be various. The one or more electronic components 2641 and 2642 (e.g., the one or more electronic components 71, 72, 73, and 74 of FIG. 6) may be positioned between the first printed circuit board 441 and the first portion 2610. The first metal structure 2601 (e.g., a first shield can) may be configured to reduce noise introduced from the exterior of the electronic device 200 (see FIG. 2) or electromagnetic influence (e.g., EMI) of another electronic component (e.g., the display 201 of FIG. 4) on the one or more electronic components 2641 and 2642. The first metal structure 2601 may be configured to reduce electromagnetic influence (e.g., EMI) of the one or more electronic components 2641 and 2642 on another electronic component (e.g., the display 201 of FIG. 4). In an embodiment, the one or more second portions 2621 and 2622 may be configured to extend from the first portion 2610 through the first printed circuit board 441. When seen from above the rear plate 320 (e.g., when seen in the +z-axis direction), the first rear camera module 2081 may be configured to at least partially overlap the first portion 2610 of the first metal structure 2601. In an embodiment, the one or more second portions 2621 and 2622 may be configured to guide the arrangement position of the first rear camera module 2081 when the first rear camera module 2081 is disposed on the rear surface 441B of the first printed circuit board 441. In an embodiment, the first printed circuit board 441 may include one or more openings (e.g., the first opening 2631 and the second opening 2632) corresponding to the one or more second portions 2621 and 2622. The one or more second portions 2621 and 2622 may be positioned through the one or more openings 2821 and 2822, and a part of the one or more second portions 2621 and 2622 may be configured to protrude with respect to the rear surface 441B of the first printed circuit board 441. A part of one second portion (hereinafter, a first support structure) 2621 may be configured to protrude with respect to the rear surface 441B of the first printed circuit board 441 so as to provide the first support part S41. A part of another second portion (hereinafter, a second support structure) 2622 may be configured to protrude with respect to the rear surface 441B of the first printed circuit board 441 so as to provide the second support part S42. The first support part S41 and the second support part S41 may be configured to guide the arrangement position of the first rear camera module 2081 when the first rear camera module 2081 is disposed on the rear surface 441B of the first printed circuit board 441. In an arrangement operation of the first rear camera module 2081, when the first rear camera module 2081 is moved toward a designated area (e.g., the camera module arrangement area 83 of FIG. 7 or 8) of the first printed circuit board 441 in the +z-axis direction, the first support part S41 of the first support structure 2621 and the second support part S42 of the second support structure 2622 may be configured to support the first rear camera module 2081 and thus to reduce distortion (or tilting) thereof in the z-axis direction, so that the first rear camera module 2081 is moved. The cross-sectional structure 26 in the x-z plane taken along line D-D' of FIG. 3 may be merely for helping understanding of embodiments. In addition, it may not be intended to limit the scope of embodiments, and may be various according to the shape or position of the first support structure 2621 or the second support structure 2622.

According to an embodiment, the second metal structure 2602 may be disposed on the front surface 441A of the first printed circuit board 441 between the first printed circuit board 441 and the first support member 340. The one or more electronic components 2651, 2652, and 2653 may be positioned between the first printed circuit board 441 and the second metal structure 2602. For example, the second metal structure 2602 may be implemented in a shape in which the one or more second portions 621 and 622 are omitted from the metal structure 6 of FIG. 7. The second metal structure 2602 (e.g., a second shield can) may be configured to reduce noise introduced from the exterior of the electronic device 200 (see FIG. 2) or electromagnetic influence (e.g., EMI) of another electronic component (e.g., the display 201 of FIG. 4) on the one or more electronic components 2651, 2652, and 2653. The second metal structure 2602 may be configured to reduce electromagnetic influence (e.g., EMI) of the one or more electronic components 2651, 2652, and 2653 on another electronic component (e.g., the display 201 of FIG. 4).

Figure 27:
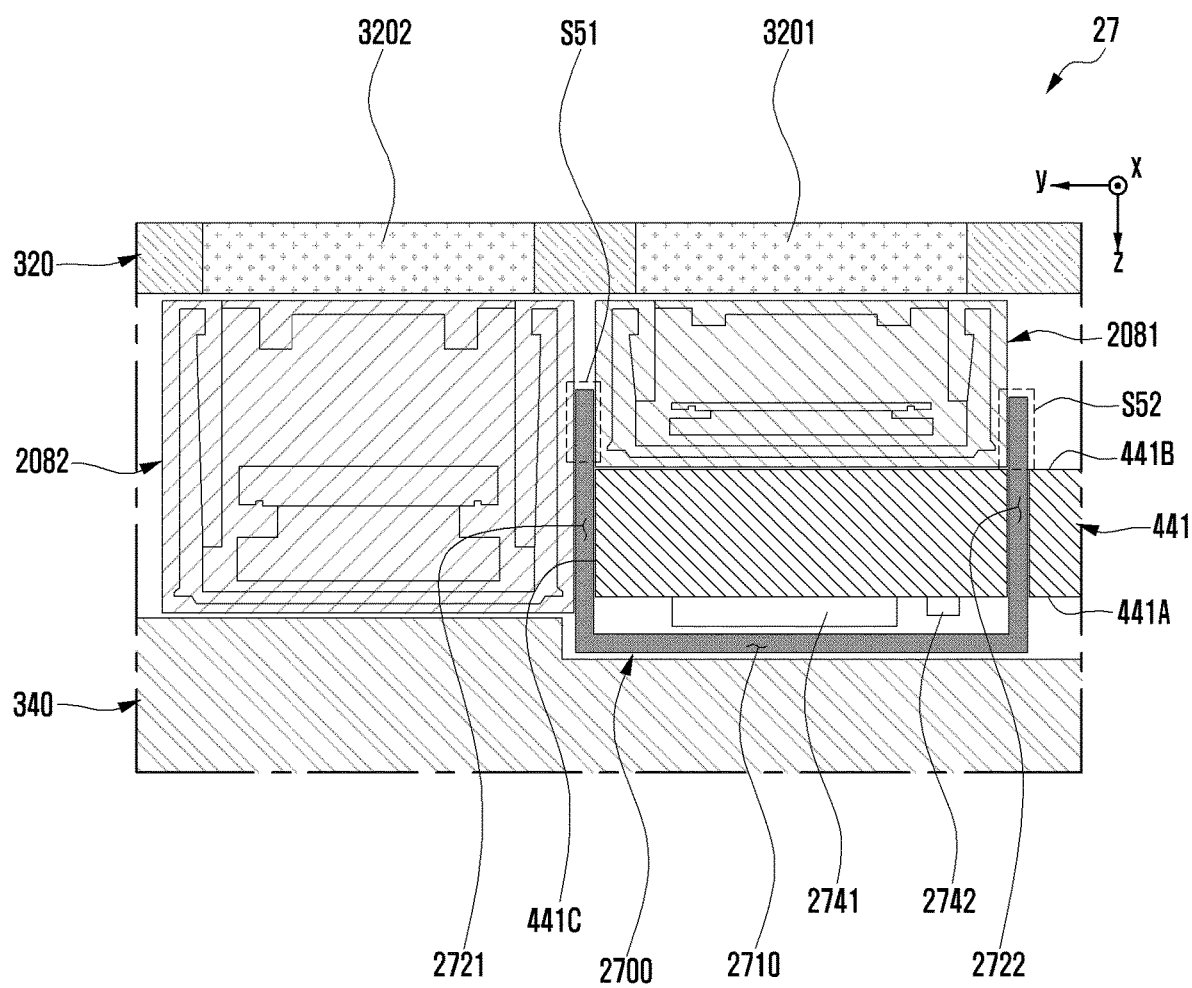
FIG. 27, in an embodiment, illustrates a cross-sectional structure in the y-z plane of a part of the electronic device taken along line F-F' of FIG. 3.

FIG. 27, in an embodiment, illustrates a cross-sectional structure 27 in the y-z plane of a part of the electronic device 200 taken along line F-F' of FIG. 3.

Referring to FIG. 27, in an embodiment, a cross-sectional structure 27 may include a rear plate 320, a first printed circuit board 441, a first rear camera module 2081, a second rear camera module 2082, and/or a metal structure 2700.

According to an embodiment, the first rear camera module 2081 may be disposed on the rear surface 441B of the first printed circuit board 441 between the first printed circuit board 441 and the rear plate 320. The rear plate 320 may include a first light-transmitting area 3201 provided to correspond to the first rear camera module 2081. External light may pass through the first light-transmitting area 3201 and thus may reach the first rear camera module 2081.

According to an embodiment, the second rear camera module 2082 may be positioned between the first support member 340 and the rear plate 320. In an embodiment, when seen from above the rear plate 320 (e.g., when seen in the +z-axis direction), the first printed circuit board 441 may be provided to not overlap the second rear camera module 2082. In some embodiments, the second rear camera module 2082 may be positioned in a notch-shaped opening provided through the side surface 441C of the first printed circuit board 441. The second rear camera module 2082 may be electrically connected to the first printed circuit board 441 by using an electrical path such as a ductile printed circuit board (not shown) (e.g., a flexible printed circuit board (FPCB)). The rear plate 320 may include a second light-transmitting area 3202 provided to correspond to the second rear camera module 2082. External light may pass through the second light-transmitting area 3202 and thus may reach the second rear camera module 2082.

According to an embodiment, the metal structure 2700 may be provided in a shape which is at least partially similar to or the same as the metal structure 6 of FIG. 7, and the shape thereof may be various. For example, the metal structure 2700 may include a first portion 2710 (e.g., the first portion 61 of FIG. 7) and one or more second portions 2721 and 2722 (e.g., the one or more second portions 621 and 622 of FIG. 7). The first portion 2710 may be positioned between the first printed circuit board 441 and the first support member 340. For example, the first portion 2710 may include a plate configured to be substantially parallel to the front surface 441A of the first printed circuit board 441. The shape of the first portion 2710 may not be limited thereto and may be various. The one or more electronic components 2741 and 2742 (e.g., the one or more electronic components 71, 72, 73, and 74 of FIG. 6) may be disposed on the front surface 441A of the first printed circuit board 441 between the first printed circuit board 441 and the first portion 2610. The metal structure 2700 (e.g., a shield can) may be configured to reduce noise introduced from the exterior of the electronic device 200 (see FIG. 2) or electromagnetic influence (e.g., EMI) of another electronic component (e.g., the display 201 of FIG. 4) on the one or more electronic components 2741 and 2742. The metal structure 2700 may be configured to reduce electromagnetic influence (e.g., EMI) of the one or more electronic components 2741 and 2742 on another electronic component (e.g., the display 201 of FIG. 4). In an embodiment, the one or more second portions 2721 and 2722 may be configured to extend from the first portion 2710 so as to protrude with respect to the rear surface 441B of the first printed circuit board 441. For example, a part of one second portion (hereinafter, a first support structure) 2721 may be configured to protrude with respect to the rear surface 441B of the first printed circuit board 441 so as to provide the first support part S51. For example, a part of another second portion (hereinafter, a second support structure) 2722 may be configured to protrude with respect to the rear surface 441B of the first printed circuit board 441 so as to provide the second support part S52. The first support part S51 and/or the second support part S52 may be configured to guide the arrangement position of the first rear camera module 2081 when the first rear camera module 2081 is disposed on the rear surface 441B of the first printed circuit board 441. In an arrangement operation of the first rear camera module 2081, when the first rear camera module 2081 is moved toward a designated area (e.g., the camera module arrangement area 83 of FIG. 7 or 8) of the first printed circuit board 441 in the +z-axis direction, the first support part S51 and/or the second support part S52 may be configured to support the first rear camera module 2081 and thus to reduce distortion (or tilting) thereof in the z-axis direction, so that the first rear camera module 2081 is moved.

According to an embodiment, the second support structure 2722 for the second support part S52 may be positioned through an opening provided through the first printed circuit board 441.

According to an embodiment, the first support structure 2721 for the first support part S51 may be positioned to face the side surface 441C of the first printed circuit board 441. In some embodiments, the first support structure 2721 may be positioned in a notch-shaped opening provided through the side surface 441C of the first printed circuit board 441. In an embodiment, a part of the first support structure 2721 may be positioned between the first rear camera module 2081 and the second rear camera module 2082. When seen from above the rear plate 320 (e.g., when seen in the +z-axis direction), the second rear camera module 2082 may be configured to not overlap the first portion 2710 of the metal structure 2700. In an embodiment, the first support structure 2721 may be configured to guide the arrangement position of the second rear camera module 2082 when the second rear camera module 2082 is positioned in the first support member 340. In an arrangement operation of the second rear camera module 2082, when the second rear camera module 2082 is moved toward a designated area of the first support member 340 in the +z-axis direction, the first support structure 2721 may be configured to support the second rear camera module 2082 and thus to reduce distortion (or tilting) thereof in the z-axis direction, so that the second rear camera module 2082 is moved.

According to some embodiments, the second rear camera module 2082 may be disposed on the rear surface 441B of the first printed circuit board 441. In this case, the first printed circuit board 441 may be expanded to correspond to the second rear camera module 2082, and the second rear camera module 2082 may be implemented to have a height which enables same to be positioned between the first printed circuit board 441 and the rear plate 320. In an embodiment, the first support structure 2721 for the first support part S51 may be positioned through an opening provided through the first printed circuit board 441. The first support part S51 may be configured to guide the arrangement position of the second rear camera module 2082 when the second rear camera module 2082 is disposed on the first printed circuit board 441. In an arrangement operation of the second rear camera module 2082, when the second rear camera module 2082 is moved toward a designated area of the first printed circuit board 441 in the +z-axis direction, the first support part S51 may be configured to support the second rear camera module 2082 and thus to reduce distortion (or tilting) thereof in the z-axis direction, so that the second rear camera module 2082 is moved. In some embodiments, when seen from above the rear plate 320, the first portion 2710 of the metal structure 2700 may be expanded to overlap the first rear camera module 2081.

The cross-sectional structure 27 in the y-z plane taken along line F-F' of FIG. 3 may be merely for helping understanding of embodiments. In addition, it may not be intended to limit the scope of embodiments, and may be various according to the shape or position of the first support structure 2721 or the second support structure 2722.

Figure 28:
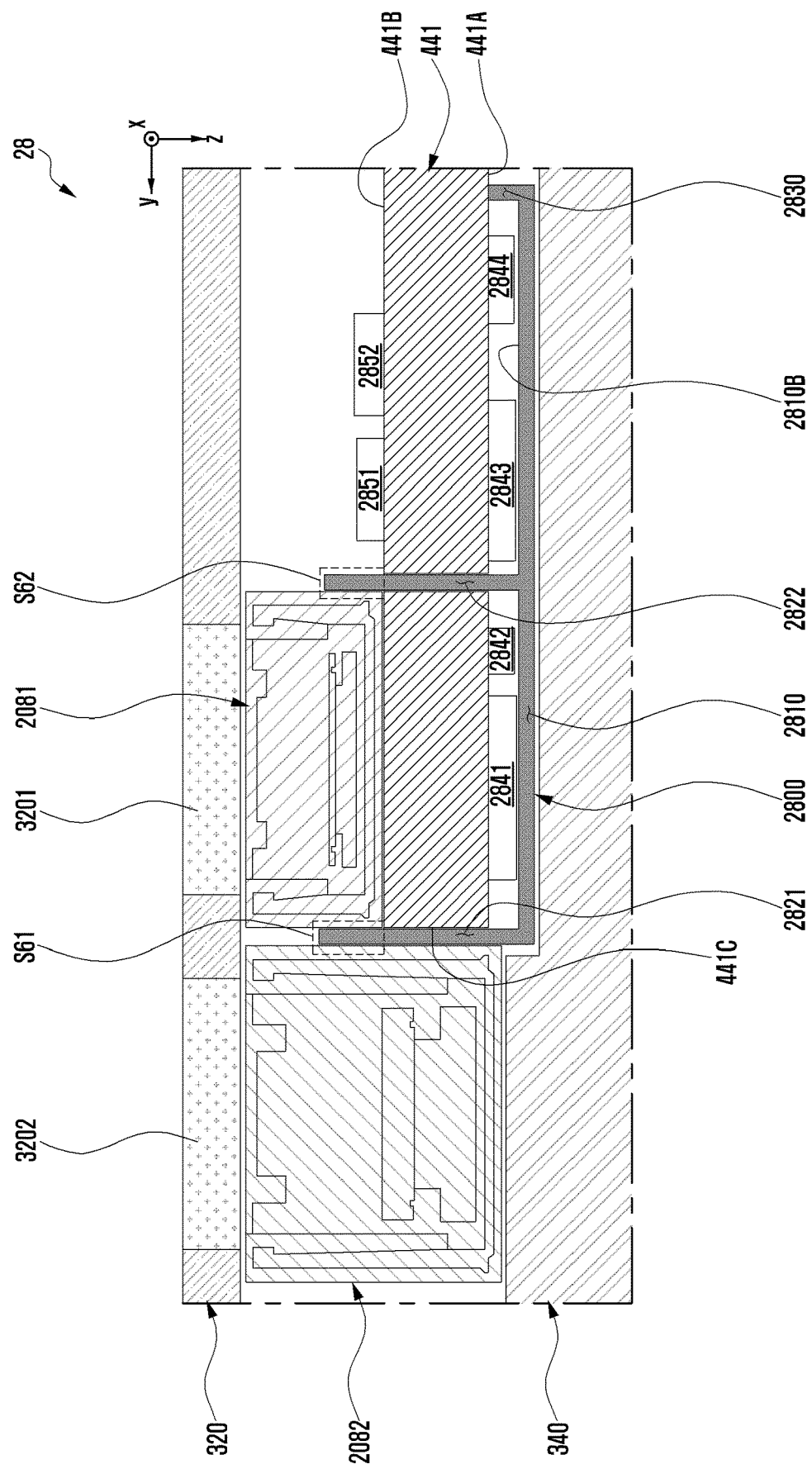
FIG. 28, in another embodiment, illustrates a cross-sectional structure in the y-z plane of a part of the electronic device taken along line F-F' of FIG. 3.

FIG. 28, in another embodiment, illustrates a cross-sectional structure 28 in the y-z plane of a part of the electronic device 200 taken along line F-F of FIG. 3.

Referring to FIG. 28, in an embodiment, a cross-sectional structure 28 may include a rear plate 320, a first printed circuit board 441, a first rear camera module 2081, a second rear camera module 2082, and/or a metal structure 2800.

According to an embodiment, the first rear camera module 2081 may be disposed on the rear surface 441B of the first printed circuit board 441 between the first printed circuit board 441 and the rear plate 320. The rear plate 320 may include a first light-transmitting area 3201 provided to correspond to the first rear camera module 2081. External light may pass through the first light-transmitting area 3201 and thus may reach the first rear camera module 2081. The second rear camera module 2082 may be positioned between the first support member 340 and the rear plate 320. In an embodiment, when seen from above the rear plate 320 (e.g., when seen in the +z-axis direction), the first printed circuit board 441 may be provided to not overlap the second rear camera module 2082. In some embodiments, the second rear camera module 2082 may be positioned in a notch-shaped opening provided through the side surface 441C of the first printed circuit board 441. The second rear camera module 2082 may be electrically connected to the first printed circuit board 441 by using an electrical path such as a ductile printed circuit board (e.g., an FPCB). The rear plate 320 may include a second light-transmitting area 3202 provided to correspond to the second rear camera module 2082. External light may pass through the second light-transmitting area 3202 and thus may reach the second rear camera module 2082.

According to an embodiment, the metal structure 2800 may be provided in a shape which is at least partially similar to or the same as the metal structure 6 of FIG. 7, and the shape thereof may be various. For example, the metal structure 2800 may include a first portion 2810 (e.g., the first portion 61 of FIG. 7), one or more second portions 2821 and 2822 (e.g., the one or more second portions 621 and 622 of FIG. 7), and a third portion 2830 (e.g., the third portion 63 of FIG. 7). The first portion 2810 may be positioned between the first printed circuit board 441 and the first support member 340. For example, the first portion 2810 may include a plate configured to be substantially parallel to the front surface 441A of the first printed circuit board 441. The shape of the first portion 2810 may not be limited thereto and may be various. One or more electronic components 2841, 2842, 2843, and 2844 (e.g., the one or more electronic components 71, 72, 73, and 74 of FIG. 6) may be disposed on the front surface 441A of the first printed circuit board 441 between the first printed circuit board 441 and the first portion 2810. The metal structure 2800 (e.g., a shield can) may be configured to reduce noise introduced from the exterior of the electronic device 200 (see FIG. 2) or electromagnetic influence (e.g., electromagnetic interference (EMI)) of another electronic component (e.g., the display 201 of FIG. 4) on the one or more electronic components 2841, 2842, 2843, and 2844. The metal structure 2800 may be configured to reduce electromagnetic influence (e.g., EMI) of the one or more electronic components 2841, 2842, 2843, and 2844 on another electronic component (e.g., the display 201 of FIG. 4). In an embodiment, the one or more second portions 2821 and 2822 may be configured to extend from the first portion 2810 so as to protrude with respect to the rear surface 441B of the first printed circuit board 441. For example, a part of one second portion (hereinafter, a first support structure) 2821 may be configured to protrude with respect to the rear surface 441B of the first printed circuit board 441 so as to provide the first support part S61. For example, a part of another second portion (hereinafter, a second support structure) 2822 may be configured to protrude with respect to the rear surface 441B of the first printed circuit board 441 so as to provide the second support part S62. When seen from above the rear plate 320 (e.g., when seen in the +z-axis direction), the first rear camera module 2081 may be configured to overlap the first portion 2810 of the metal structure 2800. In an embodiment, the first support part S61 and/or the second support part S62 may be configured to guide the arrangement position of the first rear camera module 2081 when the first rear camera module 2081 is disposed on the rear surface 441B of the first printed circuit board 441. In an arrangement operation of the first rear camera module 2081, when the first rear camera module 2081 is moved toward a designated area (e.g., the camera module arrangement area 83 of FIG. 7 or 8) of the first printed circuit board 441 in the +z-axis direction, the first support part S61 and/or the second support part S62 may be configured to support the first rear camera module 2081 and thus to reduce distortion (or tilting) thereof in the z-axis direction, so that the first rear camera module 2081 is moved.

According to an embodiment, the second support structure 2822 may be configured to extend from one surface 2810B (e.g., the one surface 1901B of FIG. 19) of the first portion 2810, which faces the front surface 441A of the first printed circuit board 441. The second support structure 2722 may be positioned through an opening provided through the first printed circuit board 441.

According to an embodiment, the first support structure 2821 may be configured to extend from the edge of the first portion 2810. The first support structure 2821 may be positioned to face the side surface 441C of the first printed circuit board 441. In some embodiments, the first support structure 2821 may be positioned in a notch-shaped opening provided through the side surface 441C of the first printed circuit board 441. In an embodiment, a part of the first support structure 2821 may be positioned between the first rear camera module 2081 and the second rear camera module 2082. When seen from above the rear plate 320 (e.g., when seen in the +z-axis direction), the second rear camera module 2082 may be configured to not overlap the first portion 2810 of the metal structure 2800. In an embodiment, the first support structure 2821 may be configured to guide the arrangement position of the second rear camera module 2082 when the second rear camera module 2082 is positioned in the first support member 340. In an arrangement operation of the second rear camera module 2082, when the second rear camera module 2082 is moved toward a designated area of the first support member 340 in the +z-axis direction, the first support structure 2821 may be configured to support the second rear camera module 2082 and thus to reduce distortion (or tilting) thereof in the z-axis direction, so that the second rear camera module 2082 is moved.

According to some embodiments, the second rear camera module 2082 may be disposed on the rear surface 441B of the first printed circuit board 441. In this case, the first printed circuit board 441 may be expanded to correspond to the second rear camera module 2082, and the second rear camera module 2082 may be implemented to have a height which enables same to be positioned between the first printed circuit board 441 and the rear plate 320. In an embodiment, the first support structure 2721 for the first support part S61 may be positioned through an opening provided through the first printed circuit board 441. The first support part S61 may be configured to guide the arrangement position of the second rear camera module 2082 when the second rear camera module 2082 is disposed on the first printed circuit board 441. In an arrangement operation of the second rear camera module 2082, when the second rear camera module 2082 is moved toward a designated area of the first printed circuit board 441 in the +z-axis direction, the first support part S61 may be configured to support the second rear camera module 2082 and thus to reduce distortion (or tilting) thereof in the z-axis direction, so that the second rear camera module 2082 is moved. In some embodiments, when seen from above the rear plate 320, the first portion 2810 of the metal structure 2800 may be expanded to overlap the first rear camera module 2081.

The cross-sectional structure 28 in the y-z plane taken along line F-F' of FIG. 3 may be merely for helping understanding of embodiments. In addition, it may not be intended to limit the scope of embodiments, and may be various according to the shape or position of the first support structure 2821 or the second support structure 2822.

Figure 29:
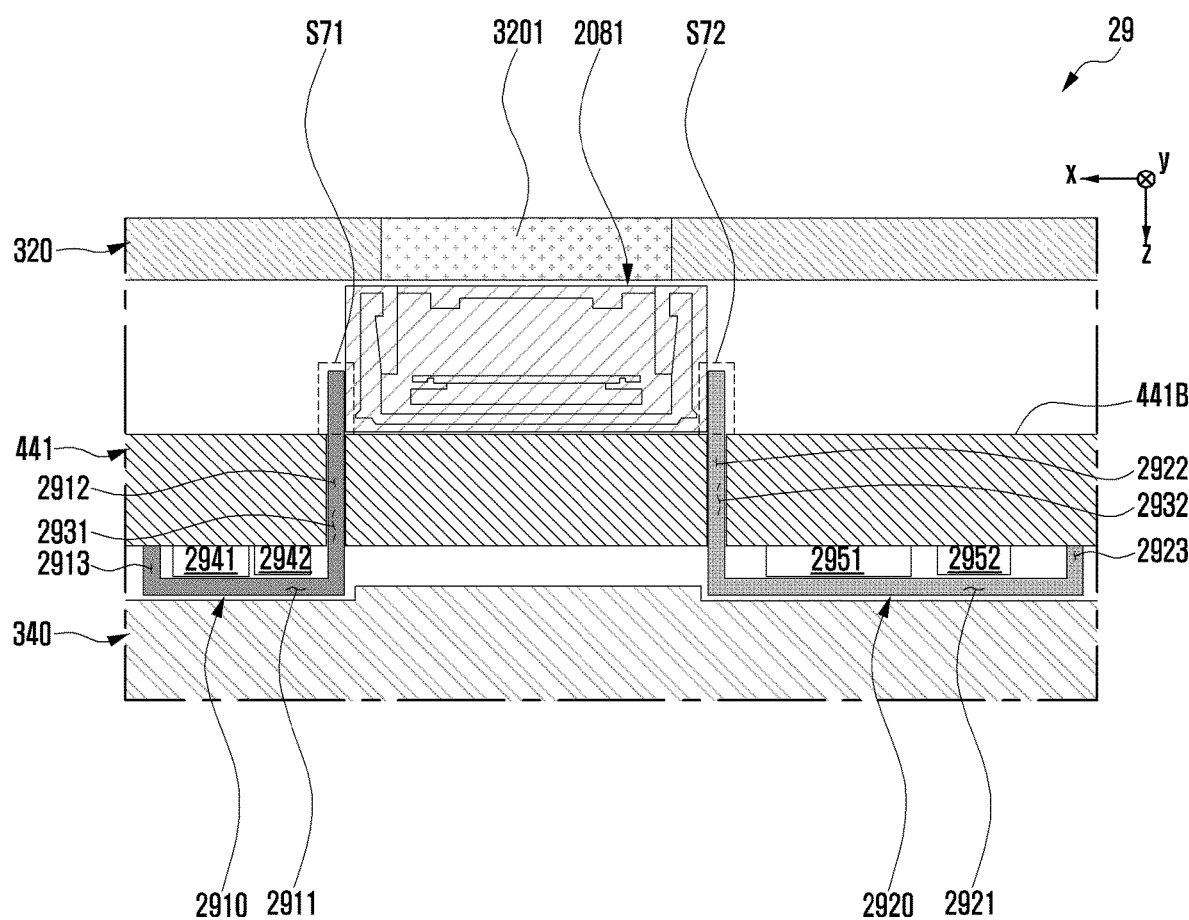
FIG. 29, in another embodiment, illustrates a cross-sectional structure in the x-z plane of a part of the electronic device taken along line D-D' of FIG. 3.

FIG. 29, in another embodiment, illustrates a cross-sectional structure 29 in the x-z plane of a part of the electronic device 200 taken along line D-D' of FIG. 3.

Referring to FIG. 29, in an embodiment, a cross-sectional structure 29 may include a rear plate 320, a first printed circuit board 441, a first rear camera module 2081, a first metal structure 2910, and/or a second metal structure 2920.

According to an embodiment, the first rear camera module 2081 may be disposed on the rear surface 441B of the first printed circuit board 441 between the first printed circuit board 441 and the rear plate 320. External light may pass through the first light-transmitting area 3201 of the second rear plate 320, which overlaps the first rear camera module 2081, and thus may reach the first rear camera module 2081.

According to an embodiment, the first metal structure 2910 or the second metal structure 2920 may be provided in a shape which is at least partially similar to or the same as the metal structure 6 of FIG. 7, and the shape thereof may be various. For example, the first metal structure 2910 may include a first portion 2911 (e.g., the first portion 61 of FIG. 7), a second portions 2912 (e.g., the one or more second portions 621 and 622 of FIG. 7), and a third portion 2913 (e.g., the third portion 63 of FIG. 7). For example, the second metal structure 2920 may include a first portion 2921 (e.g., the first portion 61 of FIG. 7), a second portion 2922 (e.g., the one or more second portions 621 and 622 of FIG. 7), and a third portion 2923 (e.g., the third portion 63 of FIG. 7). One or more electronic components 2941 and 2942 may be arranged on the first printed circuit board 441 between the first printed circuit board 441 and the first portion 2911 of the first metal structure 2910. The first metal structure 2910 (e.g., a first shield can) may be configured to reduce noise introduced from the exterior of the electronic device 200 (see FIG. 2) or electromagnetic influence (e.g., EMI) of another electronic component (e.g., the display 201 of FIG. 4) on the one or more electronic components 2941 and 2942. The first metal structure 2910 may be configured to reduce electromagnetic influence (e.g., EMI) of the one or more electronic components 2941 and 2942 on another electronic component (e.g., the display 201 of FIG. 4). One or more electronic components 2951 and 2952 may be arranged on the first printed circuit board 441 between the first printed circuit board 441 and the first portion 2921 of the second metal structure 2920. The second metal structure 2920 (e.g., a second shield can) may be configured to reduce noise introduced from the exterior of the electronic device 200 (see FIG. 2) or electromagnetic influence (e.g., EMI) of another electronic component (e.g., the display 201 of FIG. 4) on the one or more electronic components 2951 and 2952.

The second metal structure 2920 may be configured to reduce electromagnetic influence (e.g., EMI) of the one or more electronic components 2951 and 2952 on another electronic component (e.g., the display 201 of FIG. 4).

According to an embodiment, the second portion 2912 of the first metal structure 2910 may be configured to extend from the first portion 2911 so as to protrude with respect to the rear surface 441B of the first printed circuit board 441. For example, the second portion 2912 of the first metal structure 2910 may be positioned through a first opening 2931 provided through the first printed circuit board 441. A part of the second portion 2912 (hereinafter, a first support structure) included in the first metal structure 2910 may be configured to protrude with respect to the rear surface 441B of the first printed circuit board 441 so as to provide a first support part S71.

According to an embodiment, the second portion 2922 of the second metal structure 2920 may be configured to extend from the first portion 2921 so as to protrude with respect to the rear surface 441B of the first printed circuit board 441. For example, the second portion 2922 of the second metal structure 2920 may be positioned through a second opening 2932 provided through the first printed circuit board 441. A part of the second portion (hereinafter, a second support structure) 2922 included in the second metal structure 2920 may be configured to protrude with respect to the rear surface 441B of the first printed circuit board 441 so as to provide a second support part S72.

According to an embodiment, when seen from above the rear plate 320 (e.g., when seen in the +z-axis direction), the first rear camera module 2081 may be configured to not overlap the first portion 2911 of the first metal structure 2910 and the first portion 2921 of the second metal structure 2920. In some embodiments, when seen from above the rear plate 320, the first portion 2911 of the first metal structure 2910 or the first portion 2921 of the second metal structure 2920 may be expanded to overlap the first rear camera module 2081.

According to an embodiment, the first support part S71 and/or the second support part S72 may be configured to guide the arrangement position of the first rear camera module 2081 when the first rear camera module 2081 is disposed on the rear surface 441B of the first printed circuit board 441. In an arrangement operation of the first rear camera module 2081, when the first rear camera module 2081 is moved toward a designated area (e.g., the camera module arrangement area 83 of FIG. 7 or 8) of the first printed circuit board 441 in the +z-axis direction, the first support part S71 and/or the second support part S72 may be configured to support the first rear camera module 2081 and thus to reduce distortion (or tilting) thereof in the z-axis direction, so that the first rear camera module 2081 is moved.

The cross-sectional structure 29 in the x-z plane taken along line D-D' of FIG. 3 may be merely for helping understanding of embodiments. In addition, it may not be intended to limit the scope of embodiments, and may be various according to the shape or position of the first support structure 2921 or the second support structure 2922.

According to some embodiments, the first metal structure 2910 and the second metal structure 2920 may be integrally provided. For example, an integral metal plate including the first portion 2911 of the first metal structure 2910 and the first portion 2921 of the second metal structure 2920 may be provided.

Figure 30:
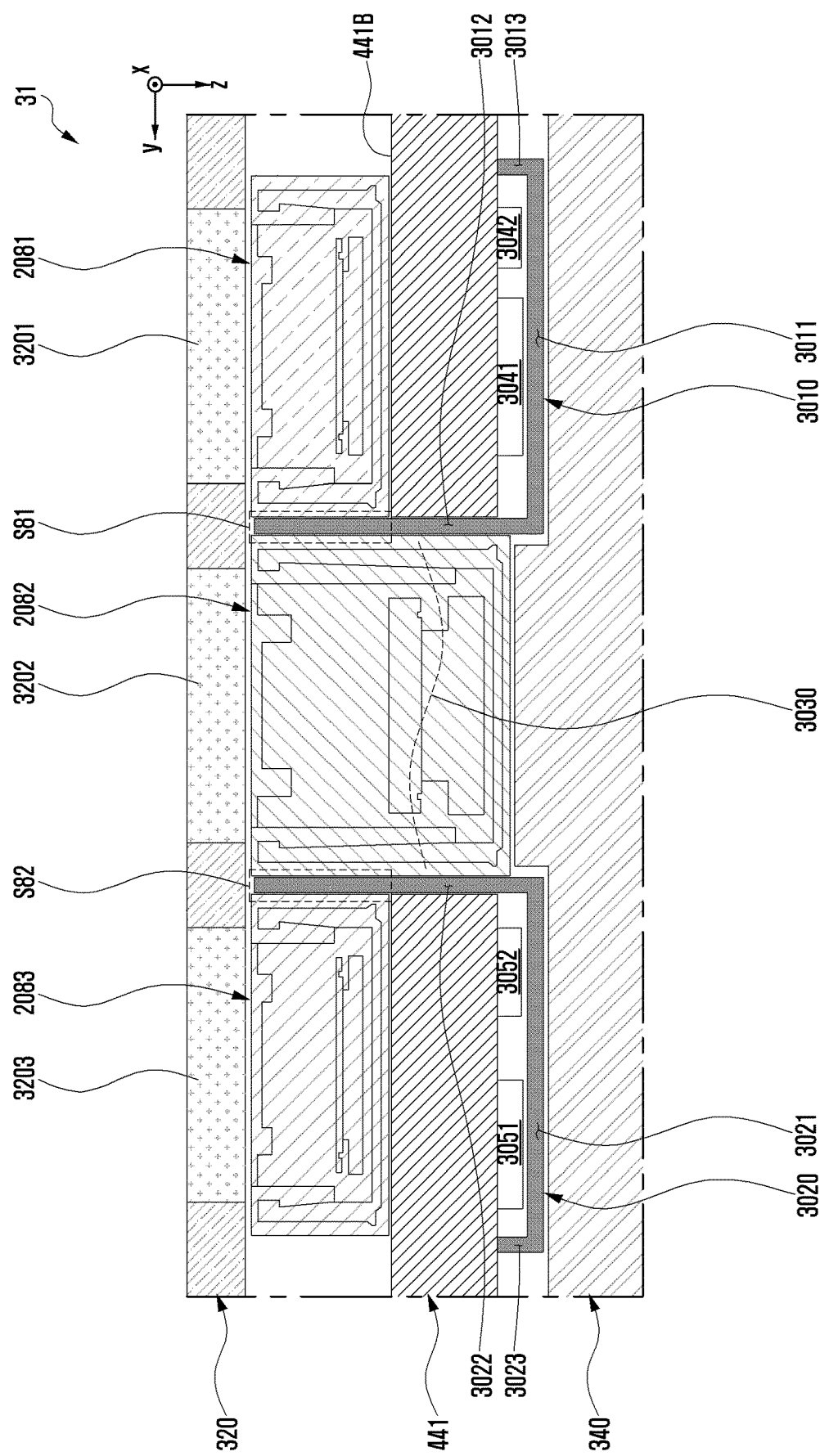
FIG. 30, in an embodiment, illustrates a cross-sectional structure in the y-z plane of a part of the electronic device taken along line F-F' of FIG. 3.

FIG. 30, in an embodiment, illustrates a cross-sectional structure 30 in the y-z plane of a part of the electronic device

Figure 31:
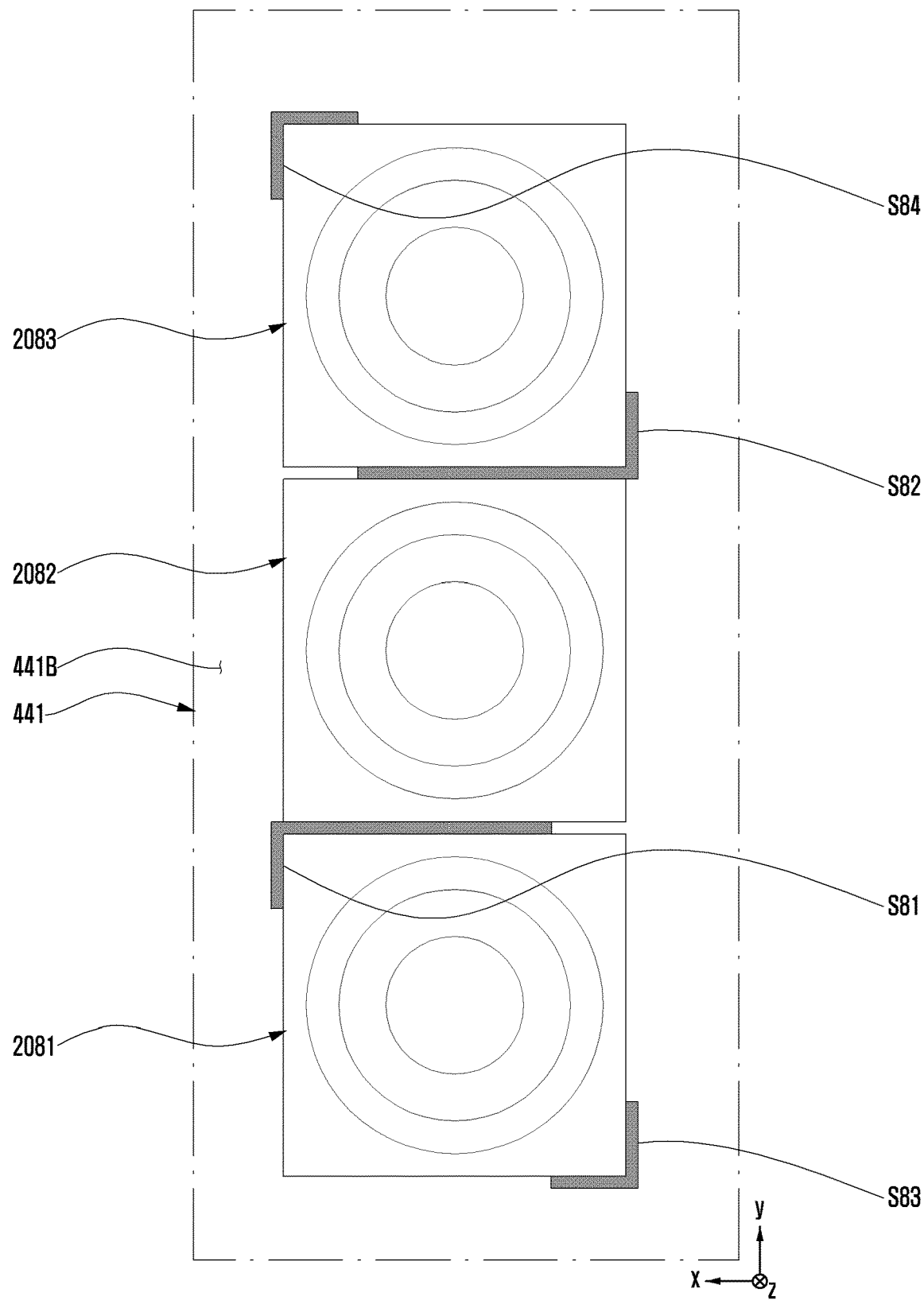
FIG. 31, for example, is an x-y plan view of a part of an electronic device related to the embodiment of FIG. 30.

200 taken along line F-F of FIG. 3. FIG. 31, for example, is an x-y plan view of a part of an electronic device 200 related to the embodiment of FIG. 30.

Referring to FIGS. 30 and 31, in an embodiment, a cross-sectional structure 30 may include a rear plate 320, a first printed circuit board 441, a first rear camera module 2081, a second rear camera module 2082, a third rear camera module 2083, a first metal structure 3010, and/or a second metal structure 3020.

According to an embodiment, when seen from above the rear plate 320 (e.g., when seen in the +z-axis direction), the first rear camera module 2081, the second rear camera module 2082, and the third rear camera module 2083 may be arranged in the y-axis direction. When seen from above the rear plate 320, the second rear camera module 2082 may be positioned between the first rear camera module 2081 and the third rear camera module 2083.

According to an embodiment, the first rear camera module 2081 may be disposed on the rear surface 441B of the first printed circuit board 441 between the first printed circuit board 441 and the rear plate 320. External light may pass through the first light-transmitting area 3201 of the second rear plate 320, which overlaps the first rear camera module 2081, and thus may reach the first rear camera module 2081.

According to an embodiment, the second rear camera module 2082 may be positioned between the first support member 340 and the rear plate 320. In an embodiment, when seen from above the rear plate 320 (e.g., when seen in the +z-axis direction), the first printed circuit board 441 may be provided to not overlap the second rear camera module 2082. For example, the first printed circuit board 441 may include an opening 3030, and the second rear camera module 2082 may be positioned in the opening 3030. For example, the opening 3030 may be provided in a through-hole shape or a notch shape. In an embodiment, the second rear camera module 2082, which is positioned in the opening 3030 of the first circuit board 441, may be supported by the first support member 340 in the −z-axis direction (e.g., vertical support). The second rear camera module 2082 may be electrically connected to the first printed circuit board 441 by using an electrical path such as a ductile printed circuit board (e.g., an FPCB). External light may pass through the second light-transmitting area 3202 of the second rear plate 320, which overlaps the second rear camera module 2082, and thus may reach the second rear camera module 2082.

According to an embodiment, the third rear camera module 2083 may be disposed on the rear surface 441B of the first printed circuit board 441 between the first printed circuit board 441 and the rear plate 320. External light may pass through the third light-transmitting area 3203 of the second rear plate 320, which overlaps the third rear camera module 2083, and thus may reach the third rear camera module 2083.

According to an embodiment, the first metal structure 3010 or the second metal structure 3020 may be provided in a shape which is at least partially similar to or the same as the metal structure 6 of FIG. 7, and the shape thereof may be various. For example, the first metal structure 3010 may include a first portion 3011 (e.g., the first portion 61 of FIG. 7), a second portions 3012 (e.g., the one or more second portions 621 and 622 of FIG. 7), and a third portion 3013 (e.g., the third portion 63 of FIG. 7). For example, the second metal structure 3020 may include a first portion 3021 (e.g., the first portion 61 of FIG. 7), a second portion 3022 (e.g., the one or more second portions 621 and 622 of FIG. 7), and a third portion 3023 (e.g., the third portion 63 of FIG. 7). One or more electronic components 3041 and 3042 may be arranged on the first printed circuit board 441 between the first printed circuit board 441 and the first portion 3011 of the first metal structure 3010. The first metal structure 3010 (e.g., a first shield can) may be configured to reduce noise introduced from the exterior of the electronic device 200 (see FIG. 2) or electromagnetic influence (e.g., EMI) of another electronic component (e.g., the display 201 of FIG. 4) on the one or more electronic components 3041 and 3042. The first metal structure 3010 may be configured to reduce electromagnetic influence (e.g., EMI) of the one or more electronic components 3041 and 3042 on another electronic component (e.g., the display 201 of FIG. 4). One or more electronic components 3051 and 3052 may be arranged on the first printed circuit board 441 between the first printed circuit board 441 and the first portion 3021 of the second metal structure 3020. The second metal structure 3020 (e.g., a second shield can) may be configured to reduce noise introduced from the exterior of the electronic device 200 (see FIG. 2) or electromagnetic influence (e.g., EMI) of another electronic component (e.g., the display 201 of FIG. 4) on the one or more electronic components 3051 and 3052. The second metal structure 3020 may be configured to reduce electromagnetic influence (e.g., EMI) of the one or more electronic components 3051 and 3052 on another electronic component (e.g., the display 201 of FIG. 4).

According to an embodiment, the second portion 3012 of the first metal structure 3010 may be configured to extend from the first portion 3011 so as to protrude with respect to the rear surface 441B of the first printed circuit board 441. For example, the second portion 3012 of the first metal structure 3010 may be positioned through the opening 3030 of the first printed circuit board 441. The second portion 3012 of the first metal structure 3010 may be positioned to face the inner surface of the opening 3030. A part of the second portion 3012 (hereinafter, a first support structure) included in the first metal structure 3010 may be configured to protrude with respect to the rear surface 441B of the first printed circuit board 441 so as to provide a first support part S81.

According to an embodiment, the second portion 3022 of the second metal structure 3020 may be configured to extend from the first portion 3021 so as to protrude with respect to the rear surface 441B of the first printed circuit board 441. For example, the second portion 3022 of the second metal structure 3020 may be positioned through the opening 3030 of the first printed circuit board 441. The second portion 3022 of the second metal structure 3020 may be positioned to face the inner surface of the opening 3030. A part of the second portion 3022 (hereinafter, a second support structure) included in the second metal structure 3020 may be configured to protrude with respect to the rear surface 441B of the first printed circuit board 441 so as to provide a second support part S82.

According to an embodiment, when seen from above the rear plate 320 (e.g., when seen in the +z-axis direction), the first rear camera module 2081 may be configured to at least partially overlap the first portion 3011 of the first metal structure 3010. When seen from above the rear plate 320, the third rear camera module 2083 may be configured to at least partially overlap the first portion 3021 of the second metal structure 3020. When seen from above the rear plate 320, the second rear camera module 2082 may be configured to not overlap the first portion 3011 of the first metal structure 3010 and the first portion 3021 of the second metal structure 3020.

According to an embodiment, the first support part S81 may be configured to guide the arrangement position of the first rear camera module 2081 when the first rear camera module 2081 is disposed on the rear surface 441B of the first printed circuit board 441. In an embodiment, the first metal structure 3010 may further include a third support part S83 (see FIG. 31) configured to guide the arrangement position of the first rear camera module 2081. The first metal structure 3010 may include a third support structure (not shown) positioned from the first portion 3011 through the first printed circuit board 441, and the third support structure may be configured to provide a third support part S83. In an embodiment, in an arrangement operation of the first rear camera module 2081, when the first rear camera module 2081 is moved toward a designated area (e.g., the camera module arrangement area 83 of FIG. 7 or 8) of the first printed circuit board 441 in the +z-axis direction, the first support part S81 and/or the third support part S83 may be configured to support the first rear camera module 2081 and thus to reduce distortion (or tilting) thereof in the z-axis direction, so that the first rear camera module 2081 is moved.

According to an embodiment, the second support part S82 may be configured to guide the arrangement position of the third rear camera module 2083 when the third rear camera module 2083 is disposed on the rear surface 441B of the first printed circuit board 441. In an embodiment, the second metal structure 3020 may further include a fourth support part S84 (see FIG. 31) configured to guide the arrangement position of the third rear camera module 2083. The second metal structure 3020 may include a fourth support structure (not shown) positioned from the first portion 3021 through the first printed circuit board 441, and the fourth support structure may be configured to provide a fourth support part S84. In an embodiment, in an arrangement operation of the third rear camera module 2083, when the third rear camera module 2083 is moved toward a designated area of the first printed circuit board 441 in the +z-axis direction, the second support part S82 and/or the fourth support part S84 may be configured to support the third rear camera module 2083 and thus to reduce distortion (or tilting) thereof in the z-axis direction, so that the third rear camera module 2083 is moved.

According to an embodiment, a part of the first support structure 3012 of the first metal structure 3010 may be positioned between the first rear camera module 2081 and the second rear camera module 2082. A part of the second support structure 3022 of the second metal structure 3020 may be positioned between the second rear camera module 2082 and the third rear camera module 2083. In an embodiment, in an arrangement operation of the second rear camera module 2082, when the second rear camera module 2082 is moved toward the opening 3030 of the first printed circuit board 441 in the +z-axis direction, the first support structure 3012 and the second support structure 3022 may be configured to support the second rear camera module 2082 and thus to reduce distortion (or tilting) thereof in the z-axis direction, so that the second rear camera module 2082 is moved.

According to some embodiments, the second rear camera module 2082 may be disposed on the rear surface 441B of the first printed circuit board 441. In this case, the first printed circuit board 441 may be provided without the opening 3030, and the second rear camera module 2082 may be implemented to have a height which enables same to be positioned between the first printed circuit board 441 and the rear plate 320. In an embodiment, the first support structure 3012 may be positioned through a second opening provided through the first printed circuit board 441, and the second support structure 3022 may be positioned through the second opening provided through the second printed circuit board 441. In some embodiments, when seen from above the rear plate 320, the first portion 3011 of the first metal structure 3010 or the first portion 3021 of the second metal structure 3020 may be expanded to overlap the second rear camera module 2082. In some embodiments, the first metal structure 3010 and the second metal structure 3020 may be integrally provided. For example, an integral metal plate including the first portion 3011 of the first metal structure 3010 and the first portion 3021 of the second metal structure 3020 may be provided.

According to some embodiments, the first metal structure 3010 and/or the second metal structure 3020 may be configured to reduce malfunctions or electrical damage of the first rear camera module 2081, the second rear camera module 2082, or the third rear camera module 2083, due to static electricity flowing into the electronic device 200 by electro-static discharge (ESD). For example, static electricity can be discharged from various external objects such as the human body. The first light-transmitting area 3201 corresponding to the first rear camera module 2081, the second light-transmitting area 3202 corresponding to the second rear camera module 2082, and the third light-transmitting area 3203 corresponding to the third rear camera module 2083 may include a substantially transparent non-metal material. At least a part of the rear plate 320 except for the first light-transmitting area 3201, the second light-transmitting area 3202, and the third light-transmitting area 3203 may be provided as a conductive area made of a metal material. In an embodiment, when static electricity discharged from an external object flows into the perimeter of the conductive area of the rear plate 320, which is adjacent to the first light-transmitting area 3201, the static electricity may be directed into the first support part S81 and/or the third support part S83 corresponding to the first rear camera module 2081. The static electricity directed into the first support part S81 and/or the third support part S83 may flow into the ground of the first printed circuit board 441, and thus may be absorbed in the ground. Therefore, it can be possible to reduce malfunctions or electrical damage of the first rear camera module 2081 due to static electricity. In an embodiment, the height of the first support part S81 and/or the third support part S83, which extends in the −z-axis direction, may be provided to secure a distance which enables static electricity to be directed into the first support part S81 and/or the third support part S83 from the perimeter of the conductive area of the rear plate 320, which is adjacent to the first light-transmitting area 3201. In an embodiment, when static electricity discharged from an external object flows into the perimeter of the conductive area of the rear plate 320, which is adjacent to the second light-transmitting area 3202, the static electricity may be directed into the first support part S81 and/or the second support part S82 corresponding to the second rear camera module 2082. The static electricity directed into the first support part S81 and/or the second support part S82 may flow into the ground of the first printed circuit board 441, and thus may be absorbed in the ground. Therefore, it can be possible to reduce malfunctions or electrical damage of the second rear camera module 2082 due to static electricity. In an embodiment, the height of the first support part S81 and/or the second support part S83, which extends in the −z-axis direction, may be provided to secure a distance which enables static electricity to be directed into the first support part S81 and/or the second support part S82 from the perimeter of the conductive area of the rear plate 320, which is adjacent to the second light-transmitting area 3202. For example, when static electricity discharged from an external object flows into the perimeter of the conductive area of the rear plate 320, which is adjacent to the third light-transmitting area 3203, the static electricity may be directed into the second support part S82 and/or the fourth support part S84 corresponding to the third rear camera module 2083. The static electricity directed into the second support part S82 and/or the fourth support part S84 may flow into the ground of the first printed circuit board 441, and thus may be absorbed in the ground. Therefore, it can be possible to reduce malfunctions or electrical damage of the third rear camera module 2083 due to static electricity. In an embodiment, the height of the second support part S82 and/or the fourth support part S84, which extends in the −z-axis direction, may be provided to secure a distance which enables static electricity to be directed into the second support part S82 and/or the fourth support part S84 from the perimeter of the conductive area of the rear plate 320, which is adjacent to the third light-transmitting area 3203. The metal structure 6 of FIG. 7, the metal structure 10 of FIG. 10, the metal structure 11 of FIG. 11, the metal structure 12 of FIG. 12, the metal structure 13 of FIG. 13, the metal structure 14 of FIG. 14, the metal structure 15 of FIG. 15, the metal structure 16 of FIG. 16, the metal structure 17 of FIG. 17, the metal structure 18 of FIG. 18, the metal structure 19 of FIG. 19, the metal structure 20 of FIG. 20, the metal structure 23 of FIG. 23, the first metal structure 2601 of FIG. 26, the metal structure 2700 of FIG. 27, the metal structure 2800 of FIG. 28, or the first metal structure 2910 or the second metal structure 2920 of FIG. 29 may be configured to allow external static electricity to flow into the ground of the first printed circuit board 441, in substantially the same manner as the embodiment of FIG. 30.

The embodiment of FIG. 7, the embodiment of FIG. 19, the embodiment of FIG. 20, the embodiment of FIG. 23, the embodiment of FIG. 26, the embodiment of FIG. 27, the embodiment of FIG. 28, the embodiment of FIG. 29, or the FIG. 30 embodiment presents a specific embodiment including the rear camera module, but may not be limited thereto. In addition, in connection with an electronic component (e.g., elements included in the electronic device 101 of FIG. 1) other than the rear camera module, various embodiments may be possible. Although the disclosure presents a specific example of the electronic device 200 of FIG. 2, in an electronic device of a different type from the electronic device 200 of FIG. 2 also, based on the embodiments disclosed in the disclosure, various embodiments of a changed or modified type may be possible. For example, an electronic device of a different type from the electronic device 200 of FIG. 2 may be various, such as a foldable electronic device capable of folding a screen or a rollable electronic device capable of expanding or reducing a screen.

According to an example embodiment of the disclosure, an electronic device (e.g., the electronic device 200 of FIG. 2) may include a printed circuit board (e.g., the first printed circuit board 441 of FIG. 7). The electronic device may include a first component (e.g., the one or more electronic components 71, 72, 73, and 74 of FIG. 6) disposed on one surface (e.g., the front surface 441A of FIG. 6) of the printed circuit board. The electronic device may include a second component (e.g., the first rear camera module 2081 of FIG. 7) disposed on the other surface (e.g., the rear surface 441B of FIG. 7) of the printed circuit board. The electronic device may include a metal structure (e.g., the metal structure 6 of FIG. 7) configured to shield EMI related to the first component. The metal structure may include a first portion (e.g., the first portion 61 of FIG. 7) configured to at least partially cover the first component. The metal structure may include a second portion (e.g., the one or more second portions 621 and 622 of FIG. 7) configured to extend from the first portion through the printed circuit board so as to support the second component.

According to an example embodiment of the disclosure, the second component may include a camera module (e.g., the first rear camera module 2081 of FIG. 7).

According to an example embodiment of the disclosure, the second component (e.g., the first rear camera module 2081 of FIG. 7) may include a first surface (e.g., the first surface 2081A of FIG. 7) configured to face the printed circuit board (e.g., the first printed circuit board 441 of FIG. 7), a second surface (e.g., the second surface 2081B of FIG. 7) opposite to the first surface, and a side surface (e.g., the side surface 2081C of FIG. 7) configured to connect the first surface and the second surface. A part (e.g., the first support part S11 and the second support part S12 of FIG. 8) of the second portion, which protrudes with respect to the other surface of the printed circuit board, may be configured to support the side surface.

According to an example embodiment of the disclosure, the side surface (e.g., the side surface 2081C of FIG. 7) may include a first side surface (e.g., the first side surface 801 of FIG. 7) and a second side surface (e.g., the second side surface 802 of FIG. 7) which are positioned at sides opposite to each other. The side surface may include a third side surface (e.g., the third side surface 803 in FIG. 7) configured to connect one end of the first side surface and one end of the second side surface. The side surface may include a fourth side surface (e.g., the fourth side surface 804 in FIG. 7) configured to connect the other end of the first side surface and the other end of the second side surface. The fourth side surface may be positioned at a side opposite to the third side surface.

According to an example embodiment of the disclosure, a part of the second portion, which protrudes with respect to the other surface of the printed circuit board, may be positioned to correspond to the first side surface, the second side surface, the third side surface, or the fourth side surface (e.g., the case to which the metal structure according to the embodiment of FIG. 13, 14, 15, 16, 17. or 18 is applied).

According to an example embodiment of the disclosure, the side surface (e.g., the side surface 2081C of FIG. 8) may include a first corner (e.g., the first corner C1 of FIG. 8) at which the first side surface and the third side surface are connected. The side surface may include a second corner (e.g., the second corner C2 of FIG. 8) at which the second side surface and the fourth side surface are connected. The side surface may include a third corner (e.g., the third corner C3 of FIG. 8) at which the second side surface and the third side surface are connected. The side surface may include a fourth corner (e.g., the fourth corner C4 of FIG. 8) at which the first side surface and the fourth side surface are connected. A part (e.g., the first support part S11, the second support part S12, the third support part S13, or the fourth support part S14 of FIG. 9) of the second portion, which protrudes with respect to the other surface of the printed circuit board, may be positioned to correspond to at least one of the first corner, the second corner, the third corner, and the fourth corner.

According to an example embodiment of the disclosure, the second portion (e.g., the one or more second portions 621 and 622 of FIG. 7) may be configured to extend from the edge of the first portion (e.g., the first portion 61 of FIG. 7).

According to an example embodiment of the disclosure, the second portion (e.g., the second support structure 1922 of FIG. 19) may be configured to extend from one surface (e.g., the one surface 1910B of FIG. 19) of the first portion (e.g., the first portion 1910 of FIG. 19), which faces the printed circuit board (e.g., the first printed circuit board 441 of FIG. 19).

According to an example embodiment of the disclosure, the electronic device (e.g., the electronic device 200 of FIG. 2) may further include a third component (e.g., the second rear camera module 2082 of FIG. 27) disposed to not overlap the first component (e.g., the one or more electronic components 2741 and 2742 of FIG. 27) and the second component (e.g., first rear camera module 2081 of FIG. 27) when seen from above the other surface (e.g., the rear surface 441B of FIG. 27) of the printed circuit board. A part (e.g., the first support part S51 of the FIG. 27) of the second portion, which protrudes with respect to the other surface of the printed circuit board, may be positioned between the second component and the third component, and may be configured to support the second component and the third component.

According to an example embodiment of the disclosure, the third component (e.g., the second rear camera module 2082 of FIG. 27) may be disposed on the other surface (e.g., the rear surface 441B of FIG. 27) of the printed circuit board.

According to an example embodiment of the disclosure, the third component (e.g., the second rear camera module 2082 of the FIG. 27) may be configured to not overlap the printed circuit board (e.g., the first printed circuit board 441 of the FIG. 27) when seen from above the other surface (e.g., the rear surface 441B of FIG. 27) of the printed circuit board.

According to an example embodiment of the disclosure, the third component may include a camera module (e.g., the second rear camera module 2082 of FIG. 27).

According to an example embodiment of the disclosure, the second portion (e.g., the first support structure 2721 or the second support structure 2722 of FIG. 27) may be configured to extend from the edge of the first portion (e.g., the first portion 2710 of FIG. 27). The second component (e.g., the first rear camera module 2801 of the FIG. 27) may be configured to overlap the first portion when seen from above the other surface (e.g., the rear surface 441B of the FIG. 27) of the printed circuit board.

According to an example embodiment of the disclosure, the second portion (e.g., the first support structure 2721 of FIG. 27) may be configured to extend from the edge of the first portion (e.g., the first portion 2710 of FIG. 27). The second component (e.g., the second rear camera module 2802 of the FIG. 27) may be configured so as not to overlap the first portion when seen from above the other surface (e.g., the rear surface 441B of the FIG. 27) of the printed circuit board.

According to an example embodiment of the disclosure, the metal structure may further include a third portion (e.g., the third portion 63 of FIG. 6) configured to extend from the first portion and coupled to one surface (e.g., the front surface 441A of FIG. 6) of the printed circuit board, on which the first component is disposed. The metal structure may be electrically connected to a ground plane included in the printed circuit board through the third portion.

According to an example embodiment of the disclosure, the electronic device may further include a front plate (e.g., the front plate 310 of FIG. 4) configured to provide the front surface of the electronic device. The electronic device may further include a rear plate (e.g., the rear plate 320 of FIG. 4) configured to provide the rear surface of the electronic device. The electronic device may further include a side surface member (e.g., the bezel structure 330 in FIG. 4) configured to at least partially surround a space between the front plate and the rear plate. The electronic device may further include a support member (e.g., the first support member 340 of FIG. 4) connected to or provided integrally with the side surface member. The electronic device may further include a display (e.g., the display 201 of FIG. 4) positioned between the front plate and the support member and configured such that at least a part thereof is visually seen through the front plate. The printed circuit board (e.g., the first printed circuit board 441 of FIG. 4) may be positioned between the rear plate and the support member. The first component (e.g., the one or more electronic components 71, 72, 73, and 74 of FIG. 6) may be positioned between the support member and the printed circuit board. The second component (e.g., the first rear camera module 2081 of FIG. 7) may be positioned between the printed circuit board and the rear plate.

According to an example embodiment of the disclosure, a part (e.g., the first support part S31 or the second support part S32 of the FIG. 24) of the second portion, which protrudes with respect to the other surface of the printed circuit board, may be inserted into an opening (e.g., the third opening 2521 or the fourth opening 2522 of the FIG. 23) or a recess provided in the second component.

According to an example embodiment of the disclosure, a substrate assembly (e.g., the first substrate assembly 440 of FIG. 4) may include a printed circuit board (e.g., the first printed circuit board 441 of FIG. 7). The substrate assembly may include a first component (e.g., the one or more electronic components 71, 72, 73, and 74 of FIG. 6) disposed on one surface (e.g., the front surface 441A of FIG. 6) of the printed circuit board. The substrate assembly may include a second component (e.g., the first rear camera module 2081 of FIG. 7) disposed on the other surface (e.g., the rear surface 441B of FIG. 7) of the printed circuit board. The substrate assembly may include a metal structure (e.g., the metal structure 6 of FIG. 7) configured to shield EMI related to the first component. The metal structure may include a first portion (e.g., the first portion 61 of FIG. 7) configured to at least partially cover the first component. The metal structure may include a second portion (e.g., the one or more second portions 621 and 622 of FIG. 7) configured to extend from the first portion through the printed circuit board so as to support the second component.

According to an example embodiment of the disclosure, the second portion (e.g., the first support structure 2721 or the second support structure 2722 of FIG. 27) may be configured to extend from the edge of the first portion (e.g., the first portion 2710 of FIG. 27). The second component (e.g., the first rear camera module 2801 of the FIG. 27) may be configured to overlap the first portion when seen from above the other surface (e.g., the rear surface 441B of the FIG. 27) of the printed circuit board.

According to an example embodiment of the disclosure, the second portion (e.g., the first support structure 2721 of FIG. 27) may be configured to extend from the edge of the first portion (e.g., the first portion 2710 of FIG. 27). The second component (e.g., the second rear camera module 2802 of the FIG. 27) may be configured to not overlap the first portion when seen from above the other surface (e.g., the rear surface 441B of the FIG. 27) of the printed circuit board.

Embodiments disclosed in the disclosure and the drawings are merely specific examples presented to easily describe the technical content and to help understanding of embodiments, and are not intended to limit the scope of embodiments. Accordingly, the scope of various embodiments of the disclosure is interpreted to include not only embodiments disclosed herein, but also all changed or modified forms derived based on the technical idea of various embodiments of the disclosure.

The invention claimed is:

1. An electronic device comprising:
    a printed circuit board comprising a first surface, a second surface opposite to the first surface, and at least one opening penetrating the first surface and the second surface;
    a first component disposed on the first surface of the printed circuit board;
    a second component disposed on the second surface of the printed circuit board; and
    a metal structure configured to shield electromagnetic interference (EMI) related to the first component,
    wherein the metal structure comprises:
    a first portion covering at least a part of the first component; and
    at least one second portion extending from the first portion through the at least one opening of the printed circuit board such that a part of the at least one second portion protrudes with respect to the second surface of the printed circuit board and supports the second component.

2. The electronic device of claim 1, wherein the second component comprises a camera module.

3. The electronic device of claim 1, wherein:
    the second component comprises a third surface facing the printed circuit board, a fourth surface opposite to the third surface, and a side surface configured to connect the third surface and the fourth surface, and
    the part of the at least one second portion, which protrudes with respect to the second surface of the printed circuit board, is configured to support the side surface.

4. The electronic device of claim 3, wherein the side surface comprises:
    a first side surface and a second side surface positioned at sides opposite to each other;
    a third side surface extending one end of the first side surface and one end of the second side surface; and
    a fourth side surface extending the other end of the first side surface and the other end of the second side surface and positioned at a side opposite to the third side surface.

5. The electronic device of claim 4, wherein the part of the at least one second portion, which protrudes with respect to the other second surface of the printed circuit board, is positioned to correspond to the first side surface, the second side surface, the third side surface, or the fourth side surface.

6. The electronic device of claim 4, wherein:
    the side surface comprises a first corner where the first side surface and the third side surface meet, a second corner where the second side surface and the fourth side surface meet, a third corner where the second side surface and the third side surface meet, and a fourth corner where the first side surface and the fourth side surface meet, and
    the part of the at least one second portion, which protrudes with respect to the second surface of the printed circuit board, is positioned to correspond to at least one of the first corner, the second corner, the third corner, and the fourth corner.

7. The electronic device of claim 1, wherein the at least one second portion is configured to extend from an edge of the first portion.

8. The electronic device of claim 1, wherein the at least one second portion is configured to extend from a surface of the first portion, which faces the printed circuit board.

9. The electronic device of claim 1, wherein the second portion is configured to extend from an edge of the first portion, and wherein the second component is configured to overlap the first portion when seen from above the other surface of the printed circuit board.

10. The electronic device of claim 1, wherein the at least one second portion is configured to extend from an edge of the first portion, and wherein the second component is configured to not overlap the first portion when viewed from above the second surface of the printed circuit board.

11. The electronic device of claim 1, wherein:
    the metal structure further comprises a third portion configured to extend from the first portion and coupled to the first surface of the printed circuit board, on which the first component is disposed, and
    the metal structure is electrically connected to a ground plane included in the printed circuit board through the third portion.

12. An electronic device comprising:
    a printed circuit board;
    a first component disposed on one surface of the printed circuit board;
    a second component disposed on the other surface of the printed circuit board; and
    a metal structure configured to shield electromagnetic interference (EMI) related to the first component,
    wherein the metal structure comprises a first portion configured to cover at least a part of the first component and a second portion configured to extend from the first portion through the printed circuit board so as to support the second component,
    wherein:
    the electronic device further comprises a third component disposed to not overlap the first component and the second component when seen from above the other surface of the printed circuit board, and
    a part of the second portion, which protrudes with respect to the other surface of the printed circuit board, is positioned between the second component and the third component and configured to support the second component and the third component.

13. The electronic device of claim 12, wherein the third component is disposed on the other surface of the printed circuit board.

14. The electronic device of claim 12, wherein the third component is configured to not overlap the printed circuit board when seen viewed from above the other surface of the printed circuit board.

15. The electronic device of claim 12, wherein the third component comprises a camera module.

16. An electronic device comprising:
    a printed circuit board;
    a first component disposed on one surface of the printed circuit board;
    a second component disposed on the other surface of the printed circuit board; and
    a metal structure configured to shield electromagnetic interference (EMI) related to the first component,
    wherein the metal structure comprises a first portion configured to cover at least a part of the first component and a second portion configured to extend from the first portion through the printed circuit board so as to support the second component, wherein the electronic device further comprises:

a front plate configured to provide the front surface of the electronic device;

a rear plate configured to provide the rear surface of the electronic device;

a side surface member configured to at least partially surround a space between the front plate and the rear plate;

a support member connected to or provided integrally with the side surface member; and a display positioned between the front plate and the support member and configured such that at least a part thereof is visually seen through the front plate, wherein the printed circuit board is positioned between the rear plate and the support member, the first component is positioned between the support member and the printed circuit board, and the second component is positioned between the printed circuit board and the rear plate.

17. The electronic device of claim 16, wherein a part of the second portion, which protrudes with respect to the other surface of the printed circuit board, is inserted into an opening or a recess provided in the second component.

18. A substrate assembly comprising:

a printed circuit board comprising a first surface, a second surface opposite to the first surface, and at least one opening penetrating the first surface and the second surface;

a first component disposed on the first surface of the printed circuit board;

a second component disposed on the second surface of the printed circuit board; and a metal structure configured to shield electromagnetic interference (EMI) related to the first component, wherein the metal structure comprises:

a first portion covering at least a part of the first component; and at least one second portion extending from the first portion through the at least one opening of the printed circuit board such that a part of the at least one second portion protrudes with respect to the second surface of the printed circuit board and supports the second component.

19. The substrate assembly of claim 18, wherein the second portion is configured to extend from an edge of the first portion, and wherein the second component is configured to overlap the first portion when seen from above the other surface of the printed circuit board.

20. The substrate assembly of claim 18, wherein the at least one second portion is configured to extend from an edge of the first portion, and wherein the second component is configured to not overlap the first portion when viewed from above the second surface of the printed circuit board.

* * * * *